United States Patent
Chaji et al.

(10) Patent No.: US 11,721,784 B2
(45) Date of Patent: Aug. 8, 2023

(54) HIGH EFFICIENT MICRO DEVICES

(71) Applicant: VueReal Inc., Waterloo (CA)

(72) Inventors: Gholamreza Chaji, Waterloo (CA); Ehsanollah Fathi, Waterloo (CA); Hossein Zamani Siboni, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 17/851,622

(22) Filed: Jun. 28, 2022

(65) Prior Publication Data
US 2022/0328715 A1  Oct. 13, 2022

Related U.S. Application Data

(63) Continuation of application No. 16/428,103, filed on May 31, 2019, now Pat. No. 11,600,743, which is a
(Continued)

(51) Int. Cl.
*H01L 25/16* (2023.01)
*H01L 29/40* (2006.01)
(Continued)

(52) U.S. Cl.
CPC ........ *H01L 33/0041* (2013.01); *H01L 25/167* (2013.01); *H01L 29/401* (2013.01); *H01L 29/42312* (2013.01); *H01L 33/0037* (2013.01); H01L 27/156 (2013.01); H01L 33/007 (2013.01); *H01L 33/0093* (2020.05); *H01L 33/20* (2013.01); *H01L 33/44* (2013.01); *H01L 2933/0066* (2013.01)

(58) Field of Classification Search
CPC . H01L 33/0041; H01L 25/167; H01L 29/401; H01L 29/42312; H01L 33/0037; H01L 27/156; H01L 33/007; H01L 33/0093; H01L 33/20; H01L 33/44; H01L 2933/0066
See application file for complete search history.

(56) References Cited

U.S. PATENT DOCUMENTS

| 5,216,263 A | 6/1993 | Paoli |
| 5,893,721 A | 4/1999 | Huang |

(Continued)

FOREIGN PATENT DOCUMENTS

| CN | 101076900 A | 11/2007 |
| CN | 102097477 | 10/2012 |

(Continued)

OTHER PUBLICATIONS

International Search Report and Written Opinion in International Application No. PCT/IB2016/057995, dated Apr. 24, 2017 (9 pages).
(Continued)

*Primary Examiner* — David Vu
(74) *Attorney, Agent, or Firm* — Nixon Peabody LLP

(57) ABSTRACT

A micro device structure comprising at least part of an edge of a micro device is covered with a metal-insulator-semiconductor (MIS) structure, wherein the MIS structure comprises a MIS dielectric layer and a MIS gate conductive layer, at least one gate pad provided to the MIS gate conductive layer, and at least one micro device contact extended upwardly on a top surface of the micro device.

2 Claims, 51 Drawing Sheets

Related U.S. Application Data continuation-in-part of application No. 15/942,154, filed on Mar. 30, 2018, now abandoned.

(60) Provisional application No. 62/684,677, filed on Jun. 13, 2018, provisional application No. 62/682,479, filed on Jun. 8, 2018, provisional application No. 62/533,394, filed on Jul. 17, 2017, provisional application No. 62/479,038, filed on Mar. 30, 2017.

(51) Int. Cl.
  *H01L 33/00* (2010.01)
  *H01L 29/423* (2006.01)
  *H01L 33/44* (2010.01)
  *H01L 27/15* (2006.01)
  *H01L 33/20* (2010.01)

(56) References Cited

U.S. PATENT DOCUMENTS

| | | |
|---|---|---|
| 5,952,680 A | 9/1999 | Strite |
| 6,040,590 A | 3/2000 | O'Brien |
| 6,417,514 B1 | 7/2002 | Eneim |
| 6,791,130 B2 | 9/2004 | Chao |
| 6,881,979 B2 | 4/2005 | Starikov |
| 7,170,100 B2 | 1/2007 | Erchak |
| 7,598,149 B2 | 10/2009 | Dawson |
| 7,943,954 B2 | 5/2011 | Wu |
| 7,999,454 B2 | 8/2011 | Winters et al. |
| 8,053,982 B2 | 11/2011 | Bratkovski |
| 8,182,304 B2 | 5/2012 | Suh |
| 8,754,425 B2 | 6/2014 | Anderson et al. |
| 9,312,437 B2 | 4/2016 | Epler |
| 9,406,884 B2 | 8/2016 | Chien et al. |
| 9,490,295 B2 | 11/2016 | Chen |
| 10,170,055 B2 | 1/2019 | Kimura |
| 2003/0012249 A1 | 1/2003 | Eisenbeiser |
| 2005/0087769 A1 | 4/2005 | Yamazaki |
| 2005/0116620 A1 | 6/2005 | Kobayashi |
| 2006/0097270 A1 | 5/2006 | Yuri |
| 2006/0157103 A1 | 7/2006 | Sheats |
| 2008/0224224 A1 | 9/2008 | Vandenderghe |
| 2008/0230792 A1 | 9/2008 | Jiang |
| 2009/0273293 A1 | 11/2009 | Bratkovski |
| 2010/0032691 A1 | 2/2010 | Kim |
| 2010/0207549 A1 | 8/2010 | Meldrum |
| 2011/0038150 A1 | 2/2011 | Woodgate |
| 2011/0240955 A1 | 10/2011 | Windisch |
| 2011/0316036 A1 | 12/2011 | Fukukawa |
| 2012/0217509 A1 | 8/2012 | Kim |
| 2012/0228603 A1 | 9/2012 | Nakamura |
| 2012/0313074 A1 | 12/2012 | Schubert |
| 2013/0088482 A1 | 4/2013 | Nathan |
| 2013/0126890 A1 | 5/2013 | Bedell |
| 2013/0146936 A1 | 6/2013 | Tsai |
| 2013/0049059 A1 | 12/2013 | Odnoblyudov |
| 2014/0159065 A1 | 6/2014 | Hu |
| 2014/0159067 A1 | 6/2014 | Sakariya |
| 2014/0183501 A1 | 7/2014 | Kim |
| 2014/0252390 A1 | 9/2014 | Yoon |
| 2014/0374742 A1 | 12/2014 | Tsang |
| 2015/0187991 A1 | 7/2015 | McGroddy |
| 2015/0364643 A1 | 12/2015 | Sumitomo |
| 2015/0380461 A1 | 12/2015 | Robin |
| 2016/0218143 A1 | 7/2016 | Chaji |
| 2017/0047391 A1 | 2/2017 | You |
| 2017/0186907 A1 | 6/2017 | Chaji |
| 2017/0186908 A1 | 6/2017 | Robin |
| 2018/0247922 A1 | 8/2018 | Robin |

FOREIGN PATENT DOCUMENTS

| | | |
|---|---|---|
| CN | 102160181 B | 12/2013 |
| CN | 104885252 A | 9/2015 |
| CN | 105144387 A | 3/2018 |
| EP | 2973715 B1 | 10/2021 |
| JP | H02256287 | 10/1990 |
| TW | 201125421 A | 7/2011 |
| TW | 201528498 A | 7/2015 |

OTHER PUBLICATIONS

International Search Report and Written Opinion in International Application No. PCT/IB2018/052240, dated Jul. 5, 2018 (12 pages).

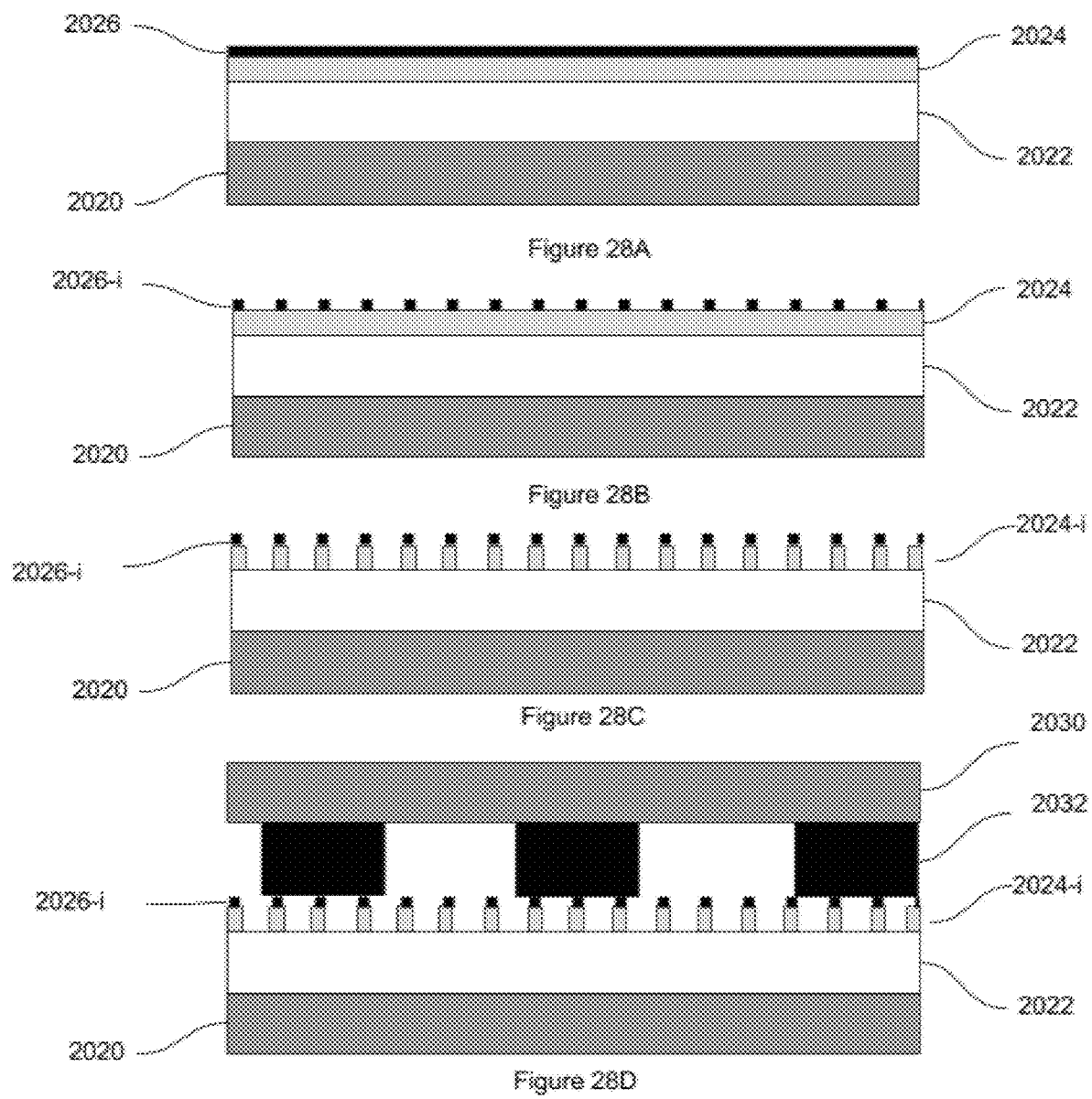

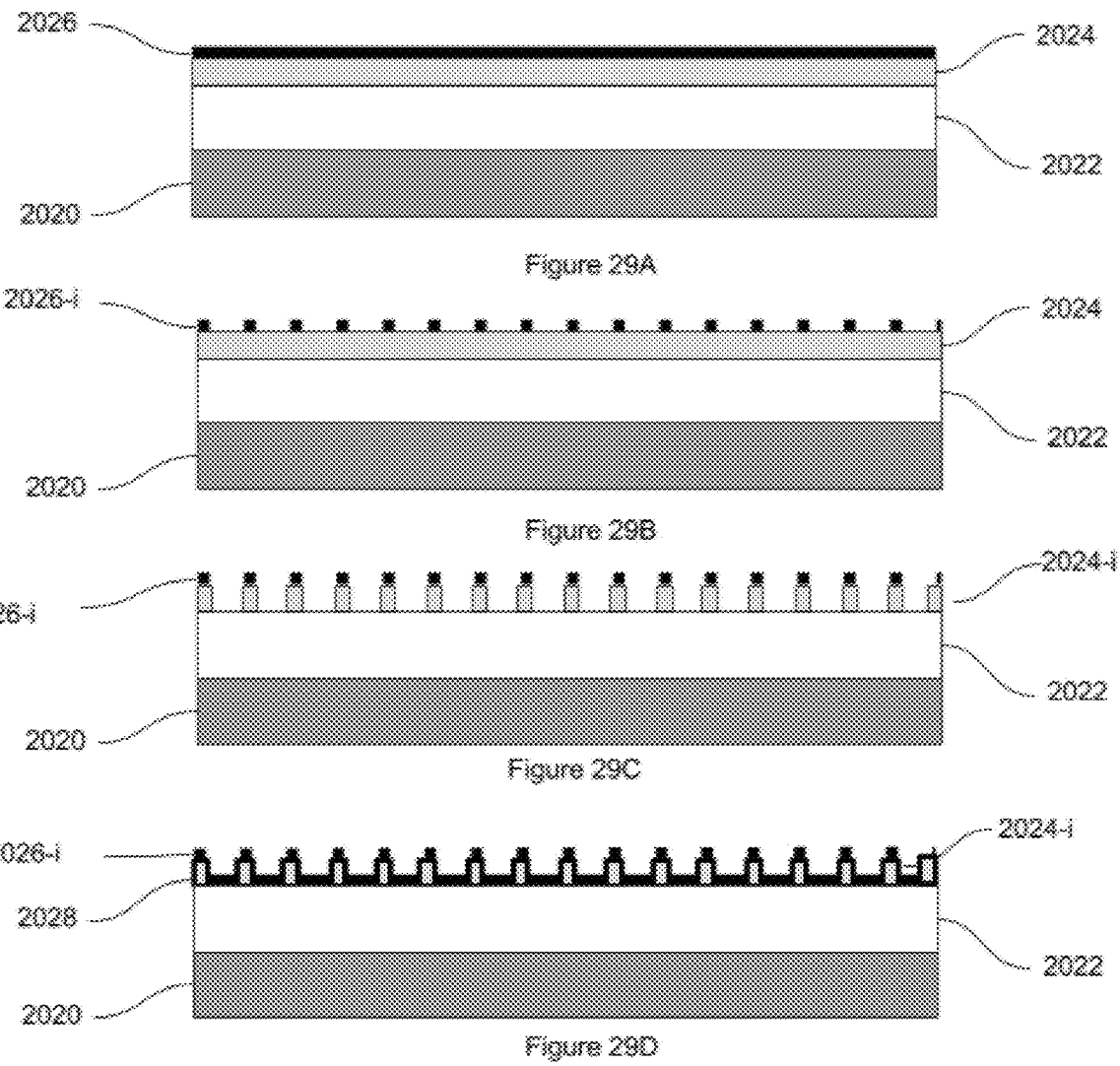

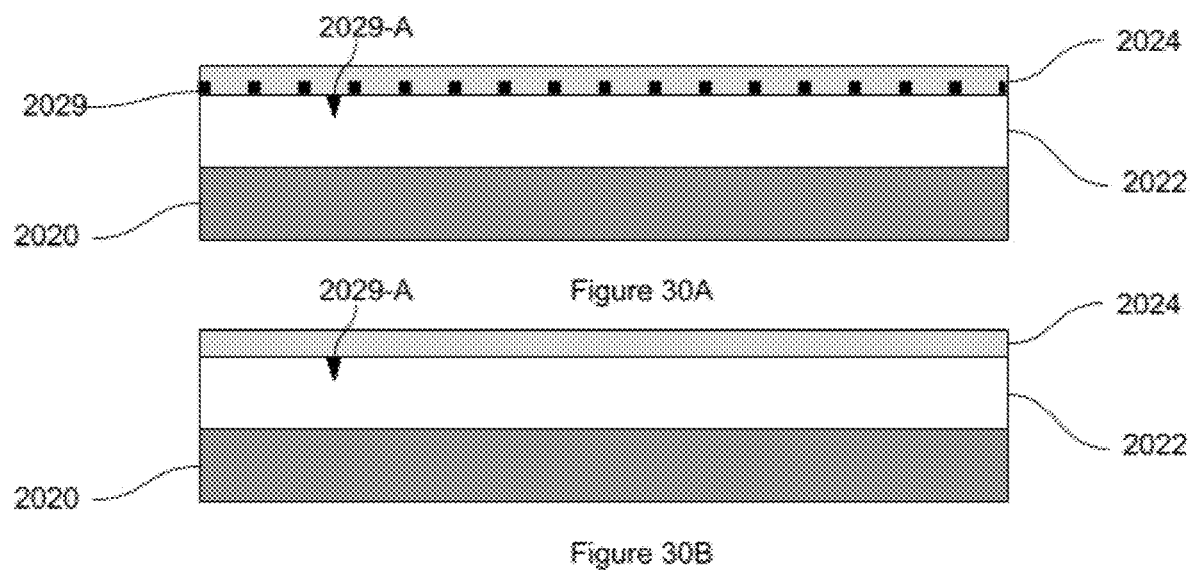

HIGH EFFICIENT MICRO DEVICES

CROSS-REFERENCE TO RELATED APPLICATIONS

This application is a continuation of U.S. Nonprovisional application Ser. No. 16/428,103, filed May 31, 2019, which claims priority from U.S. Provisional Patent Application Nos. 62/682,479, filed Jun. 8, 2018, and 62/684,677, filed Jun. 13, 2018, and is a continuation-in-part of U.S. Nonprovisional application Ser. No. 15/942,154, filed Mar. 30, 2018, which claims priority from U.S. Provisional Application Nos. 62/479,038, filed Mar. 30, 2017, and 62/533,394, filed Jul. 17, 2017, each of which is hereby incorporated by reference herein in its entirety.

FIELD OF THE INVENTION

The present invention relates to high efficient vertical solid-state devices, lateral conduction manipulation of vertical solid-state devices, and methods of manufacture thereof. The present invention also relates to the fabrication of an integrated array of micro devices, defined by an array of contacts on a device substrate or a system substrate.

BACKGROUND

Integrating micro optoelectronic devices into a system substrate may result in high performance and high functionality systems. However, to reduce the cost to create higher pixel density devices, the size of the optoelectronic devices should be reduced. Examples of optoelectronic devices are sensors and light emitting devices, such as light emitting diodes (LEDs). As the size of the optoelectronic devices is reduced, however, device performance may start to suffer. Some reasons for reduced performance include higher leakage current due to defects, charge crowding at interfaces, imbalance charge, and unwanted recombination such as auger and nonradiative recombination.

LEDs and LED arrays may be categorized as vertical solid-state devices. Micro devices may be sensors, LEDs or any other solid devices grown, deposited, or monolithically fabricated on a substrate. The substrate may be the native substrate of the device layers or a receiver substrate, onto which device layers or solid-state devices are transferred.

Various transferring and bonding methods may be used to transfer and bond device layers to the system substrate. In one example, heat and pressure may be used to bond device layers to a system substrate. In a vertical solid-state device, the current flowing in the vertical direction predominantly defines the functionality of the device.

Patterning LEDs into micro size devices to create an array of LEDs for display applications comes with several issues including material utilization, limited PPI, and defect creation.

An object of the present invention is to overcome the shortcomings of prior art by providing improved vertical solid-state devices.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

According to one embodiment, a micro device structure may be provided. The micro device structure may comprising at least part of an edge of a micro device is covered with a metal-insulator-semiconductor (MIS) structure, wherein the MIS structure comprises a MIS dielectric layer and a MIS gate, at least one gate pad provided to the MIS gate; and at least one micro device contact extended upwardly on a top surface of the micro device.

According to another embodiment, a method of fabricating a micro device structure may be provided. The method may comprising providing a metal-insulator-semiconductor (MIS) structure at least part of an edge of a micro device, wherein the MIS structure comprises a MIS dielectric layer and a MIS gate conductive layer, providing at least one gate pad to the MIS gate conductive layer; and providing at least one micro device contact extended upwardly on a top surface of the micro device.

The foregoing and additional aspects and embodiments of the present disclosure will be apparent to those of ordinary skill in the art in view of the detailed description of various embodiments and/or aspects, which are made with reference to the drawings, a brief description of which is provided next.

BRIEF DESCRIPTION OF THE FIGURES

The foregoing and other advantages of the disclosure will become apparent upon reading the following detailed description and upon reference to the drawings.

FIG. 1B-1 shows an example of an optoelectronic device with an MIS structure on at least one side of the device.

FIG. 6B illustrates micro devices with MIS structures transferred onto a system substrate, and different means to couple the devices and MIS structures to electrodes or a circuit layer.

FIGS. 28A to 28D illustrate a fabrication process of an LED display and integration process of a device substrate with micro devices defined by top contacts and bonding the substrate to a system substrate.

FIGS. 29A to 29D illustrate a fabrication process of an LED display and integration process of a device substrate with micro devices defined by top contacts and bonding the substrate to a system substrate.

FIGS. 30A to 30B illustrate a fabrication process of an LED display and integration process of a device substrate with micro devices defined by top contacts and bonding the substrate to a system substrate.

Use of the same reference numbers in different figures indicates similar or identical elements.

Figure 1A:
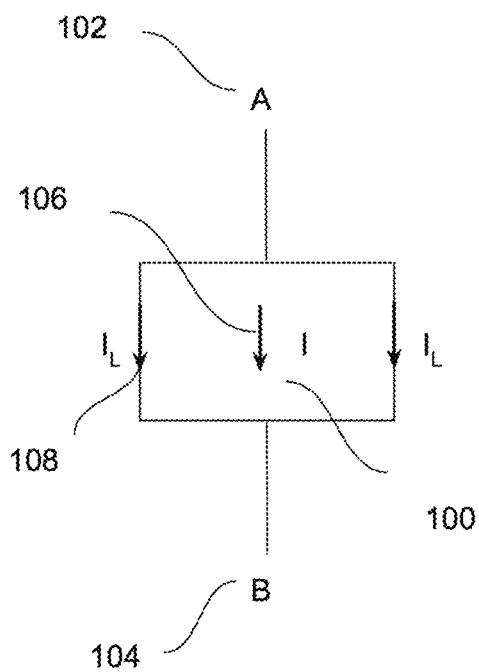
FIG. 1A illustrates an optoelectronic device with at least two terminals.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure covers all modifications, equivalents, and alternatives falling within the spirit of the invention as defined by the appended claims.

DETAILED DESCRIPTION OF THE INVENTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

The terms "device" and "micro device" and "optoelectronic device" are used herein interchangeably. It would be clear to one skilled in the art that the embodiments described here are independent of the device size.

The terms "donor substrate" and "temporal substrate" are used herein interchangeably. However, it is clear to one skilled in the art that the embodiments described herein are independent of the substrate.

The terms "system substrate" and "receiver substrate" are used herein interchangeably. However, it is clear to one skilled in the art that the embodiments described here are independent of substrate type.

The present disclosure relates to methods for lateral conduction manipulation of vertical solid-state devices, particularly optoelectronic devices. More specifically, the present disclosure relates to micro or nano-optoelectronic devices in which device performance is being affected by size reduction. Also, described is a method to create an array of vertical devices by modifying the lateral conduction without isolating the active layers. Also, disclosed is an array of LEDs using vertical conductivity engineering to enable current transport in a horizontal direction and control to the pixel area, so there is no need to pattern the LEDs.

Herein is also described a method of LED structure modification to simplify the integration of monolithic LED devices with backplane circuitry in an LED display while preserving device efficiency and uniformity. The present methods and resulting structures increase the number of LED devices fabricated within a limited wafer area and may result in lower fabrication cost, decrease the number of fabrication steps, and provide higher resolution and brightness for LED displays. LED devices in a substrate may be bonded to an electronic backplane, which drives the devices or pixels in a passive or active manner. Although the following methods are explained with one type of LED device, they can be easily used with other LED and non-LED vertical devices, such as sensors. LED devices in a substrate as herein described may be bonded to an electronic backplane which drives these devices (i.e., pixels) in a passive or active manner.

Also described herein is a method to improve the performance of an optoelectronic device by manipulating the internal electrical field of the device. In particular, limiting the lateral current flow of vertical solid-state devices may improve the performance of the devices. In particular, diverging current from the perimeter of a vertical device may be accomplished by modifying the lateral conduction. The resistance of the conductive layers may be modified by oxidation, and the lateral resistance of the conductive layers may be modified by modifying the bias condition. A contact can also be used as a mask to modify the lateral resistance of the conductive layer. The present devices may also have conductive layers on the sides and functional layers in the middle.

Also provided is a method of pixelating a display device by defining the pixel pad connection in a backplane and attaching the LED device with vertical conduction modulation to the backplane. In one embodiment, the current spreader may be removed, or its thickness may be reduced to modulate the vertical conduction. In another embodiment, some of the micro device layers may be etched to create vertical conduction modulation. A bonding element may be used to hold the device to the backplane. Structures and methods are described to define micro devices on a device layer by forming contact pads on the device layer before transferring the device layer to a receiver substrate. Also described are structures and methods to define the micro devices by contact pads or bumps on the receiver substrate in an integrated micro device array system comprising a transferred monolithic array of micro devices and a system substrate.

Also described are methods to manipulate the top conductive layer of a vertical device in which the functionality of the device predominantly is defined by the vertical currents. In one embodiment the method comprises: top layer resistance engineering in which the lateral resistance of the top layer may be manipulated by changing the thickness or specific resistivity of the top layer; full or partial etching modulation in which the top layer of the vertical device may be modulated by any means of etching; and material conductivity modulation in which the resistance of the top layer may be modulated by various methods including but not limited to etching, counter doping, and laser ablation. The contact pads on the top device layer may define the size of the individual micro devices. After transferring micro devices, a common electrode may be deposited on the transferred monolithic array of micro devices to improve the conductivity. The common electrodes may be formed through vias in the top buffer or dielectric layers transferred or deposited on the monolithic array of micro devices. Also, the top layer of the transferred monolithic array of micro devices may be modulated by any removal means. In this case, optical elements may be formed in the removed regions of the modulated top layer.

Also described is a method to form an array of micro devices on an integrated structure in which the device layer, prepared according to the aforementioned methods, is transferred to a receiving substrate wherein the contact pads on the top of the receiving substrate may be bonded to the device layer and the size of the individual micro devices may be defined partially by the size of the contact pads or bumps on the receiver substrate. Spacers or banks may be formed around contact pads or bumps to fully define the size of the micro devices. The spacers or banks around contact pads or bumps may be adhesives to promote bonding the device layer to the receiver substrate. The top layer of the integrated micro device array may be modulated by any means of removing. In one embodiment, the optical elements may be formed in the removed regions of the modulated top layer.

In an embodiment, the at least one MIS structure may be formed with one of the device faces as the semiconductor layer. The structure may be used to manipulate the device's internal electrical field to control the charge transition and accumulation. The MIS structure may be formed prior to moving the device into the system substrate, or after the device is formed into the system substrate. The electrode in the MIS structure may be transparent to let the light pass through, or the electrode may be reflective or opaque to control the direction of the light. Preferably, the device output comprises visible light to create an array of pixels in a display. The electrode in the MIS structure may be shared with one of the device's functional electrode. The electrode in the MIS structure may also have a separate bias point. The input or output of the micro devices may be any form of electromagnetic wave. Non-limiting examples of the device are an LED and a sensor. Structures and methods to improve micro optoelectronic devices are also described herein. The device performance may be improved by manipulating the internal electric field. In one case, the MIS structure is used to modulate the internal electrical field.

In micro device system integration, devices may be fabricated in their native ambient conditions, and may be then transferred to a system substrate. To pack more micro devices in a system substrate or reduce the cost of material, the size of micro devices may be as small as possible. In one example, the micro devices may be 25 µm or smaller and in another example 5 µm or smaller. As the original devices and layers on the donor substrate are being patterned to a smaller area, the leakage and other effects increase which reduces the performance of the devices. Although passivation may improve the performance to some extent, it cannot address other issues such as non-radiative recombination.

Another embodiment is an optoelectronic micro device where it consists of first and second conductive layers, active layers between said first and second conductive layers, contacts to the first and second conductive layers on the same surface, metal-insulator-semiconductor formed between at least one of conductive or active layers and a gate electrode and a dielectric layer to separate the contact to the said gate electrode and one of the conductive layer.

Various embodiments in accordance with the present structures and processes provided are described below in detail.

Vertical Devices with Metal-Insulator-Semiconductor (MIS) Structures

Described is the use of an MIS structure to modulate the internal electric field of a vertical device to reduce the unwanted effects caused by size reduction. In one embodiment, the structure is fully formed on the devices in the donor or temporal substrate and then moved to the system substrate. In another case, the MIS structure is formed on the devices integrated on the receiver or system substrate. In another case, the MIS structure is formed partially on the devices prior to being integrated into the receiver substrate, and the MIS structure is completed after transferring the device into the receiver substrate.

The system substrate may be any substrate and may be rigid or flexible. The system substrate may be made of glass, silicon, plastics, or any other commonly used material. The system substrate may also have active electronic components, such as but not limited to transistors, resistors, capacitors, or any other electronic component commonly used in a system substrate. In some cases, the system substrate may be a substrate with electrical signal rows and columns. In one example, the device substrate may be a sapphire substrate with LED layers grown monolithically thereon, and the system substrate may be a backplane with circuitry to derive micro-LED devices. As part of the vertical devices, MIS structures may be formed from a layer of metal, a layer of insulating material, and a layer of semiconductor material.

With reference to FIG. 1A, a micro device 100 includes two functional contacts A 102 and B 104. Biasing the micro device 100 causes a current 106 to flow through the bulk of the micro device 100. For light emitting devices, the charges recombine in light emitting layer(s) and create photons. For sensing devices, the external stimulation (e.g., light, chemical, Tera Hz, X-ray) modulates the current. However, non-idealities may affect the efficiency of the micro device 100 in both cases. One example is the leakage current 108 mainly caused by the defects in the sidewalls. Other non-idealities may be non-radiative recombination, such as auger recombination, charge crowding, or charge imbalance. These issues become more dominant as the size of the device is reduced.

Figure 1B:
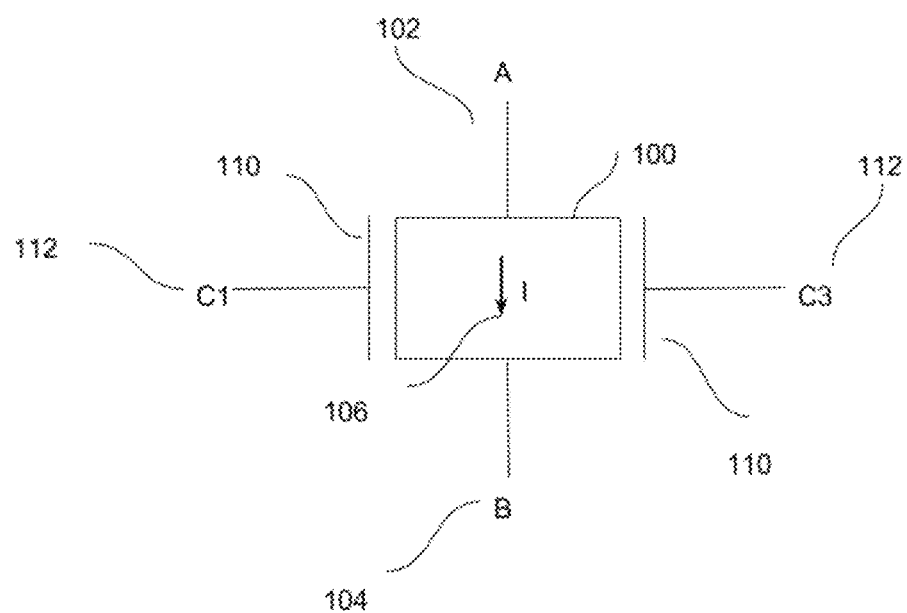
FIG. 1B illustrates an optoelectronic device with an MIS structure on at least one side of the device.

With reference to FIG. 1B, the micro device 100 further includes an MIS structure 110 to modulate the internal field and reduce some of the aforementioned issues. At least one MIS structure 110 is formed on one of the faces of the micro device 100. The MIS structure 110 is biased through an electrode 112. If the MIS structure 110 is formed on more than one surface of the micro device 100, it can be a continuous structure or a few separate MIS structures. The electrodes 112 can be connected to the same biases for all faces or different biases. The MIS structure can be on different sides of the device to improve performance or offer different functionality.

Figures 1, 1B:
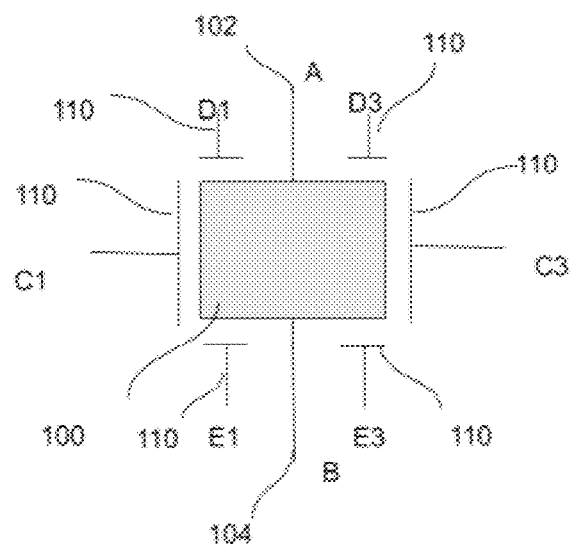

FIG. 1B-1 shows another exemplary structure with different MIS structure possibilities. The MIS structure 110 on the same side as the device electrodes (102, 104) can control the flow of the current from the electrodes (102, 104) to the edge sides, while other MIS structures on the sides with no device electrode can confine the charges and also control the flow of the current. A device may use one or more of these MIS structures 110. At least two of the MIS structures 110 on different sides of the device may have the same electrode.

Figure 1C:
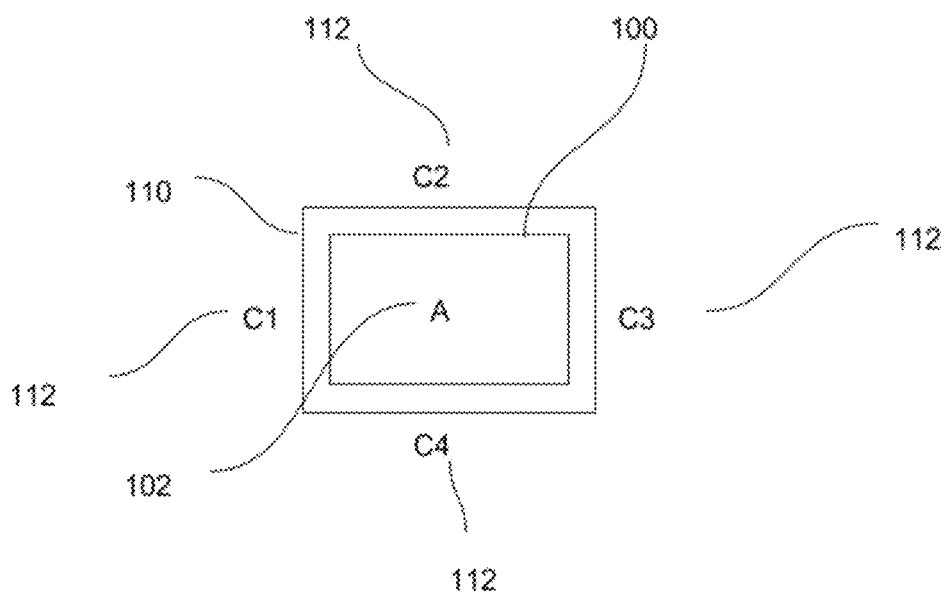
FIG. 1C illustrates a top view of the optoelectronic device in FIG. 1B with MIS structures on all sides.

In an exemplary embodiment illustrated in FIG. 1C, the MIS structure 110 surrounds the micro device 100 in one continuous form on or around a plurality of faces of the micro device 100. Applying bias to the MIS structure 110 may reduce the leakage current 108 and/or avoid band bending under high current density to avoid non-radiative recombination and/or assist one of the charges to enhance the charge balance and avoid current crowding. The biasing conditions may be chosen to fix the dominant issue. For example, in the case of a red LED, leakage current is the major source of efficiency loss at moderate to low current densities. In this case, the biasing condition may block/reduce the leakage current to allow a significant efficiency boost. In another case, such as a green LED, Auger recombination may be the main issue. The biasing condition may be adjusted to reduce this type of recombination. It is noted that one bias condition may eliminate/reduce more than other bias conditions and LED types. Dynamically adjusting the biasing condition may also provide better performance. For example, in lower current density, one effect, such as leakage current may be the dominant effect, but at a higher current density, charge crowding and other issues may be the dominant effect. As such, the bias may be modified accordingly to offer better performance. The bias may be adjusted as a single device, cluster of devices, or the entire array of devices. The bias may also be different for different devices. For example, LED versus sensors, or red versus green LEDs may all have different biasing conditions.

Figure 2A:
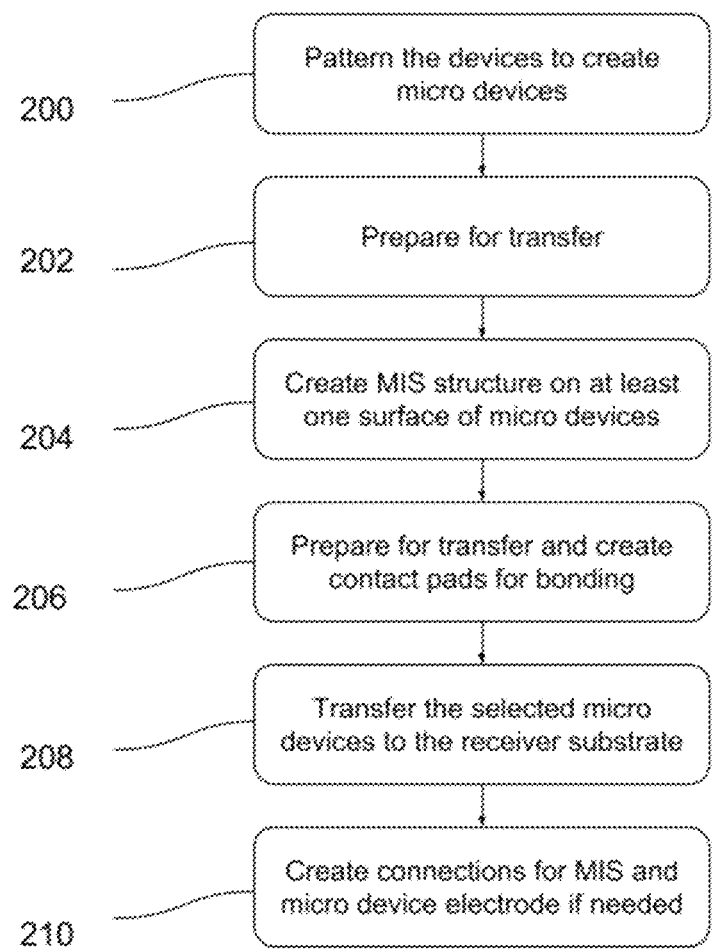
FIG. 2A illustrates an exemplary embodiment of a process to form an MIS structure on an optoelectronic device prior to a transfer process.
Figure 2B:
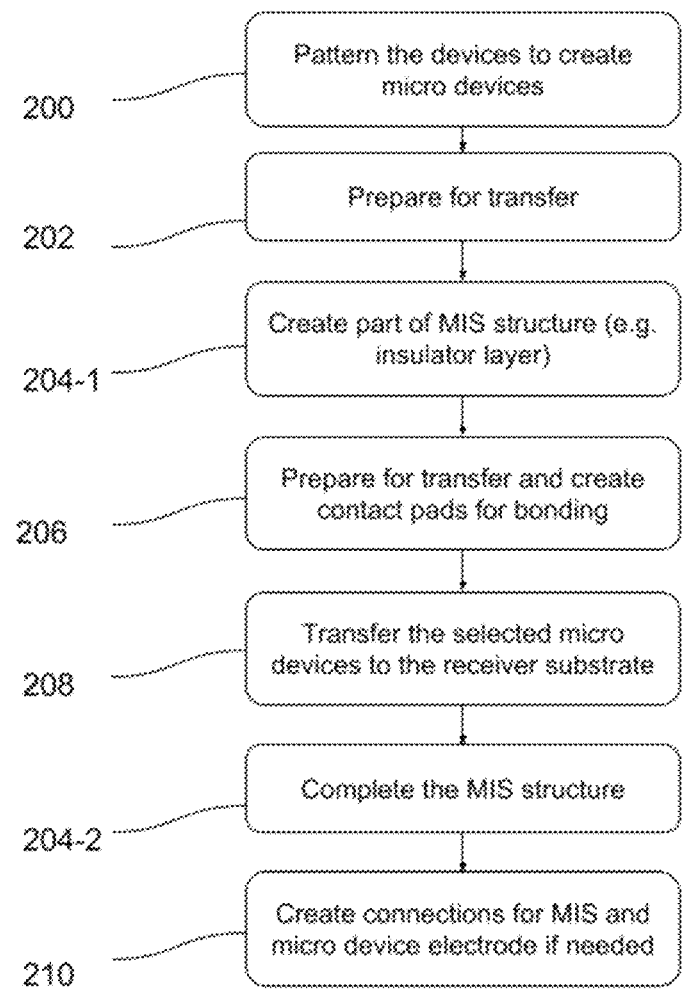
FIG. 2B illustrates an exemplary embodiment of a process to form an MIS structure on optoelectronic devices both prior to and after the transfer process.
Figure 2C:
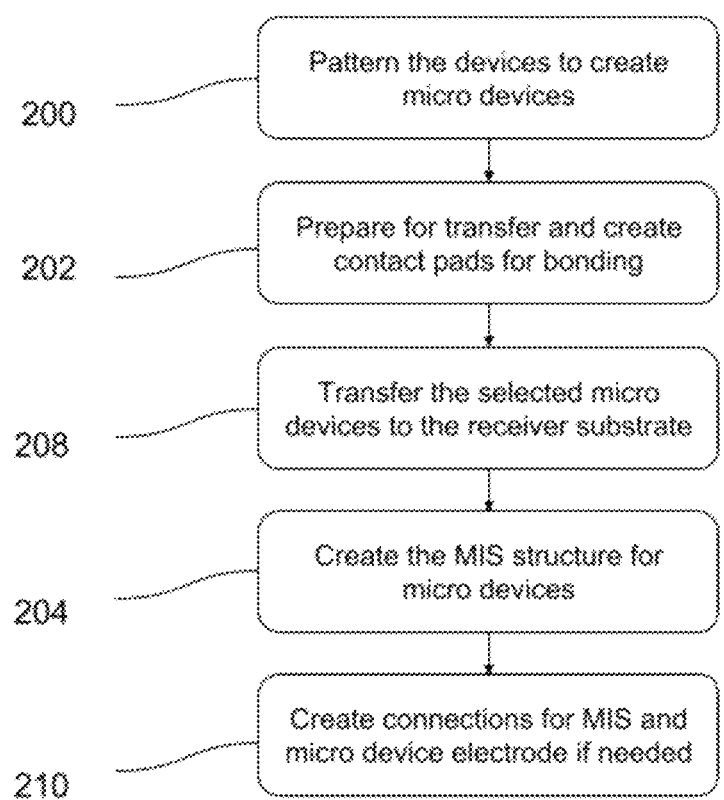
FIG. 2C illustrates an exemplary embodiment of a process to form an MIS structure on an optoelectronic device after the transfer process.

The process to form the MIS structure 112 on the micro device 100 is described in FIGS. 2A to 2C. The order of the steps in these processes may be changed without affecting the final results. Moreover, each step may be a combination of a few smaller steps.

With reference to FIG. 2A, in a first step 200, the micro devices 100 are formed. During step 200, the micro devices 100 are formed by either patterning or selective growth. During step 202 the micro devices 100 are prepared for transfer which may include cleaning or moving to a temporary substrate. During step 204, the MIS structure 112 is formed on one surface of the micro device 100. During step 206, the device 100 is again prepared for transfer, which may include a lift-off process, a cleaning process, and/or other steps. In addition, during step 206, connection pads or electrodes for device function electrodes or for the MIS structure 112 may be deposited and/or patterned. During step 208, selected devices 100 are transferred to a receiver substrate by various methods, including but not limited to pick-and-place or direct transfer. In step 210, connections are formed for the device 100 and the MIS structure 112. In addition, other optical layers and devices may be integrated to the system substrate after the transfer process.

Another example of a process to form the MIS structure 112 on the micro device 100 is illustrated in FIG. 2B. First the micro devices 100 are formed in step 200. During step 200, the micro devices 100 may be formed by patterning or by selective growth. During step 202, the micro devices 100 are prepared for transfer, which may include cleaning or moving to a temporary substrate. During step 204-1, part of the MIS structure 112 is formed, for example by deposition and patterning a dielectric layer, on one surface of the micro device 100. During step 206, the micro devices 100 are again prepared for transfer, which may include a lift-off process, cleaning process, and/or other steps. In addition, during step 206, connection pads or electrodes for micro devices 100 or MIS structure 112 are deposited and/or patterned. During step 208, selected micro devices 100 may be transferred to a receiver substrate. The transfer may be done by various methods including but not limited to pick-and-place or direct transfer. The MIS structure 112 may then be completed during step 204-2, which may include deposition and patterning of a conductive layer. During step 210, connections are formed for the micro devices 100 and the MIS structure (or structures) 112. Other optical layers and devices may be integrated to the system substrate after the transfer process. Step 210 may be the same as step 204-2 or a different and/or separated step. Other process steps may also be executed in between steps 204-2 and 210. In one example, a passivation or planarization layer may be deposited and/or patterned prior to step 210 to avoid shorts between MIS electrodes and other connections.

With reference to FIG. 2C, another example of a process to form MIS structure 112 on the micro device 100 is illustrated. First the micro devices 100 are formed in step 200 by patterning or by selective growth. During step 202, the devices 100 are prepared for transfer, which may include cleaning or moving to a temporary substrate. In addition, during step 202, connection pads or electrodes for the function of the micro device 100 and/or for the MIS structure 112 may be deposited and/or patterned. During step 208, selected micro devices 100 may be transferred to the receiver substrate by various methods, such as but not limited to pick-and-place or direct transfer. The MIS structure 112 is then formed during step 204, e.g. on the receiver substrate, after the final transfer, which may include deposition and patterning of dielectric and conductive layers. During the following step 210, connections are formed for the micro devices 100 and the MIS structures 112. In addition, other optical layers and devices may be integrated to the system substrate after the transfer process. Step 210 may share some of the same process steps with step 204 or be a completely separate step. In the latter case, other process steps may be done between 204 and 210. In one example, a passivation or planarized layer may be deposited and/or patterned prior to step 210 to avoid shorts between MIS electrodes and other connections.

After patterning the micro devices 100, depending on the patterning process, each micro device 100 may have straight or sloped walls. The following descriptions are based on selected sloped embodiments, but similar or modified processing steps may be used for other embodiments as well. In addition, depending on the transfer method, each micro device face connected to the receiver substrate may vary and therefore affect the slope of the device wall. The processing steps described next may be used directly or modified to be used with other slopes and device structures.

Figure 3:
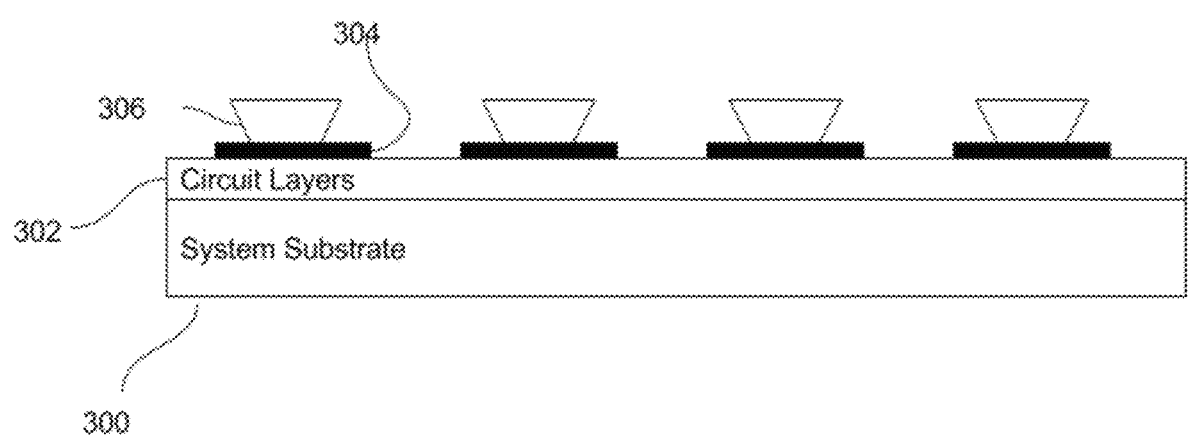
FIG. 3 illustrates transferred micro devices with a negative slope on a system substrate.

FIG. 3 illustrates a plurality of micro devices 306, similar to micro devices 100, which have been transferred to a system or receiver substrate 300. The micro devices 306 include a sidewall of faces with a negative slope i.e. at an acute angle with a top of the micro device 306 and an obtuse angle with the bottom of the micro device 306 or with the system substrate 300. Each micro device 306 is connected to a circuit layer 302 through at least one contact pad 304. Depending on the slope of the sidewalls, an MIS structure may be formed using normal or polymer deposition. The methods described herein may be used with some modifications or directly for this case. However, if the slope is too steep, the preferred way is to prepare the MIS structure on the micro devices 306 prior to transfer. An exemplary method for creating an MIS structure prior to transfer will be described hereinafter.

Figure 4:
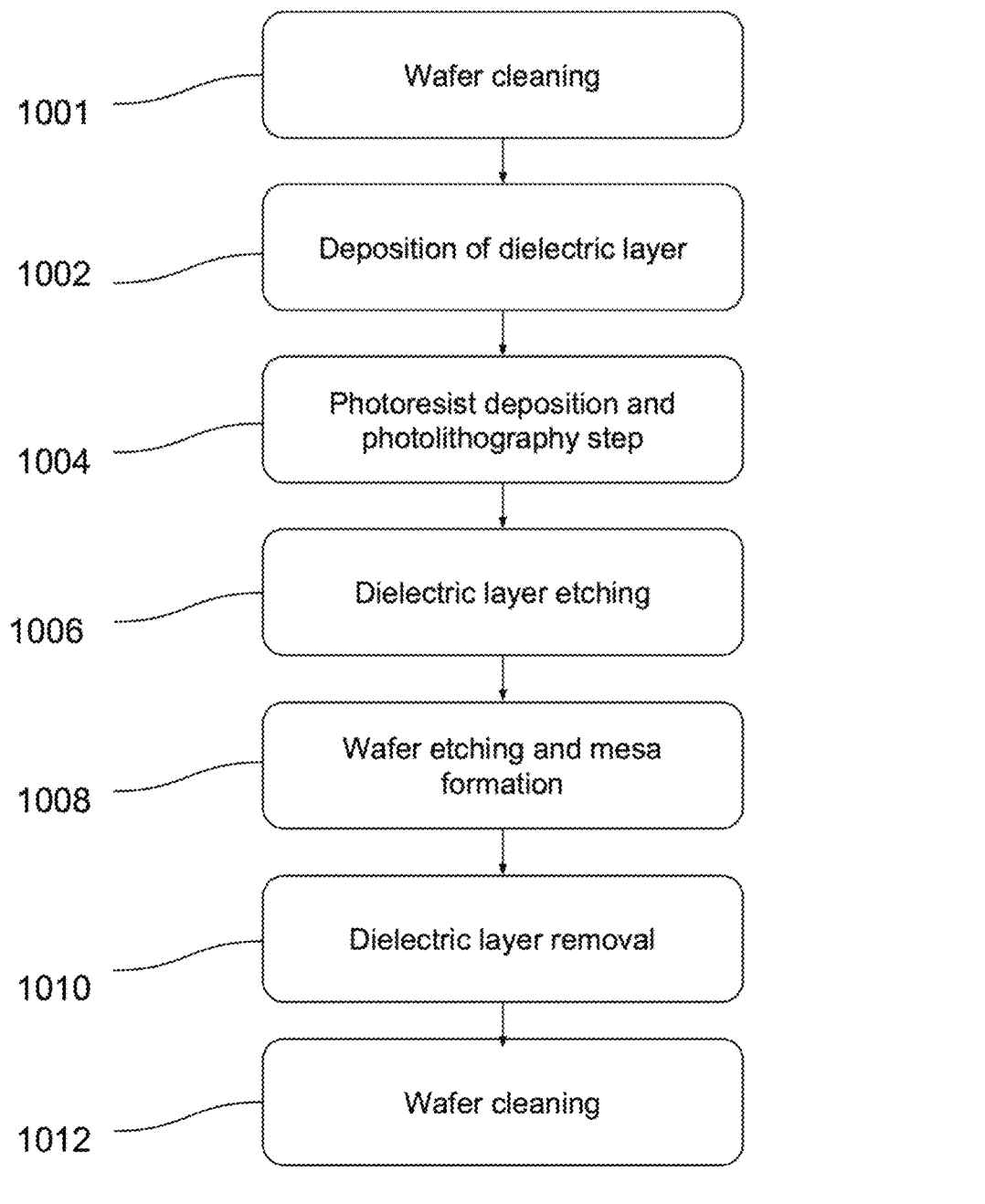
FIG. 4 illustrates a process flow chart of a wafer etching process for mesa structure formation.

FIG. 4 illustrates a process flowchart for a basic wafer etching process 1000 for forming a mesa structure formation. In step 1001, the wafers may be cleaned, e.g. using piranha etching containing sulfuric acid and hydrogen peroxide, followed by cleaning with hydrochloric diluted DI water. Step 1002 may include deposition of a dielectric layer. In step 1006, the dielectric layer may be etched to create an opening on the layer for subsequent wafer etching. In step 1008, the wafer substrate may be etched using a dry etching technique and chlorine chemistry to develop mesa structures. In step 1010, hard mask may be removed by a wet or dry etching method, and the wafer may then be subsequently cleaned in step 1012.

Figure 5A:
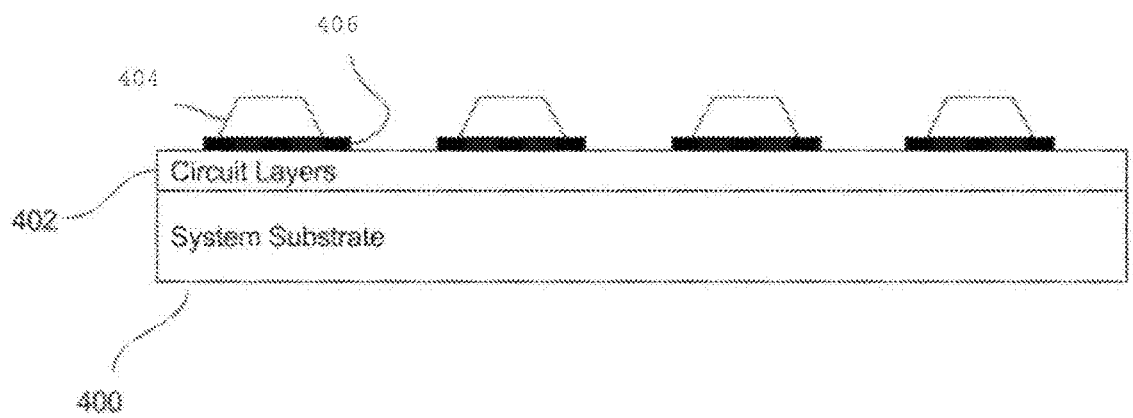
FIG. 5A illustrates a transferred micro device with a positive slope on the system substrate.

Embodiments of a method to form an MIS structure in accordance with process 1000 are illustrated with reference to FIGS. 5A to 5D. The micro devices 406 may include a vertical sidewall structure, a negative slope sidewall structure or a positive slope sidewall structure (i.e., the sidewalls are at an acute angle with the base of the micro device 406 and the system substrate 400). In FIG. 5A, each of the micro devices 406 are transferred to a system substrate 400, and connected to a circuit layer 402, which is formed or mounted on the system substrate 400, through at least one connection pad 404. After this step, the MIS structure may be initiated and completed or simply completed. While traditional lithography, deposition, and patterning processes are applicable to create or complete such structures and to connect the micro devices to proper bias connections, different methods may be used with further tolerance to misplacement of the micro devices. Specifically, in large area processes, micro device placement inaccuracy may be a few micrometers.

Figure 5B:
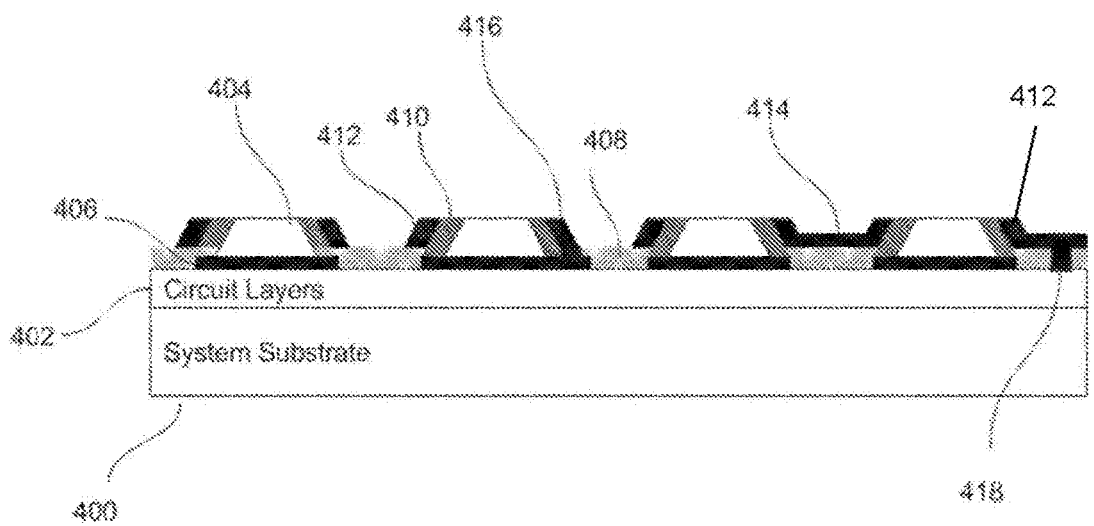
FIG. 5B illustrates the formation of different MIS structures on transferred micro devices.

With reference to FIG. 5B, in this embodiment a dielectric layer 408 may be deposited around the micro devices 406 to cover unwanted exposed portions of the contact pads 404. Openings for vias 418 may be formed (e.g., etched) in the dielectric layer 408 to connect a conductive layer 412 of the MIS structure to the circuit layer 402. A similar or different dielectric layer 410 may be deposited on at least one side of each of the micro devices 406, as part (i.e., the insulator part) of the MIS structure. The dielectric layer 410 deposition step may be conducted prior to transferring the micro device 406 to the system substrate 400, at the same time as the dielectric layer 408, or after deposition of layer 408. Subsequently, the conductive layer 412 may be deposited and patterned around and between each micro device 406, to complete the MIS structure. In an embodiment, the conductive layer 414 may connect at least two micro device/MIS structures together. In addition, or alternatively, the conductive layer 416 may connect the MIS structure to a contact pad 404 of the micro device 406. The conductive layer 412 may be transparent to enable other optical structures to be integrated into the system substrate 400. Alternatively, the conductive layer 412 may be reflective to assist with light extraction, direction, reflection, or absorption. The conductive layer 412 may also be opaque for some applications. Further processing steps may be carried out after forming the MIS structure, such as but not limited to depositing a common electrode or integrating optical structure/devices.

Figure 5C:
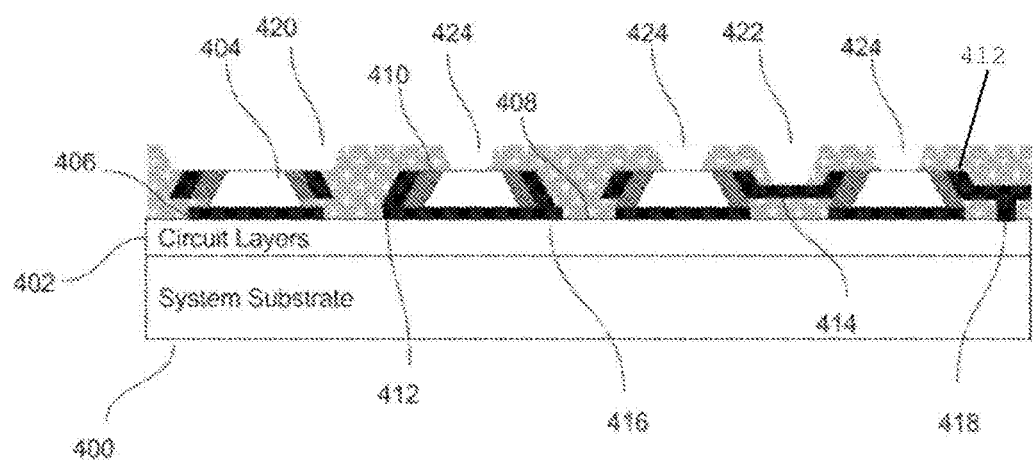
FIG. 5C illustrates the formation of a passivation or planarization layer, and the patterning of the passivation or planarization layer to create openings for electrode connections.
Figure 5D:
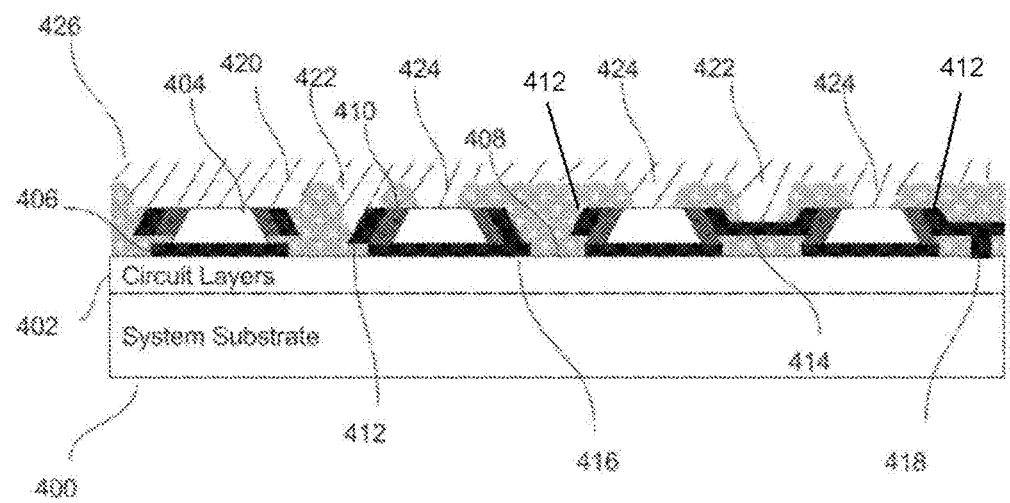
FIG. 5D illustrates the deposition of electrodes on the micro devices.

FIGS. 5C and 5D illustrate an exemplary structure for depositing a common electrode 426 on an opposite side of the MIS structure to the system substrate 400. The upper surface of the MIS structure is planarized (e.g., using a dielectric material) similar to dielectric layer 408, and then patterned (e.g. etched) to provide access points to connect the common electrode 426 to the micro devices 406. The common electrode 426 may be coupled to either the micro device 406, the MIS structure (i.e., conductive layer 412), or the circuit layer 402 through patterning (e.g., openings 420, 422, and 424).

The common electrode 426 may be transparent to the light from micro devices 406 to enable the light to pass therethrough, reflective to the light from the micro devices 406 to reflect the light back through the system substrate 400, or opaque to the light from the micro devices 406 to minimize reflection. The common electrode 426 may also be patterned to create addressable lines. Several other methods may be used for deposition of the common electrode 426. Other optical devices and structures may be integrated onto the system substrate or into the circuit layer before or after the common electrode 426.

Figure 6A:
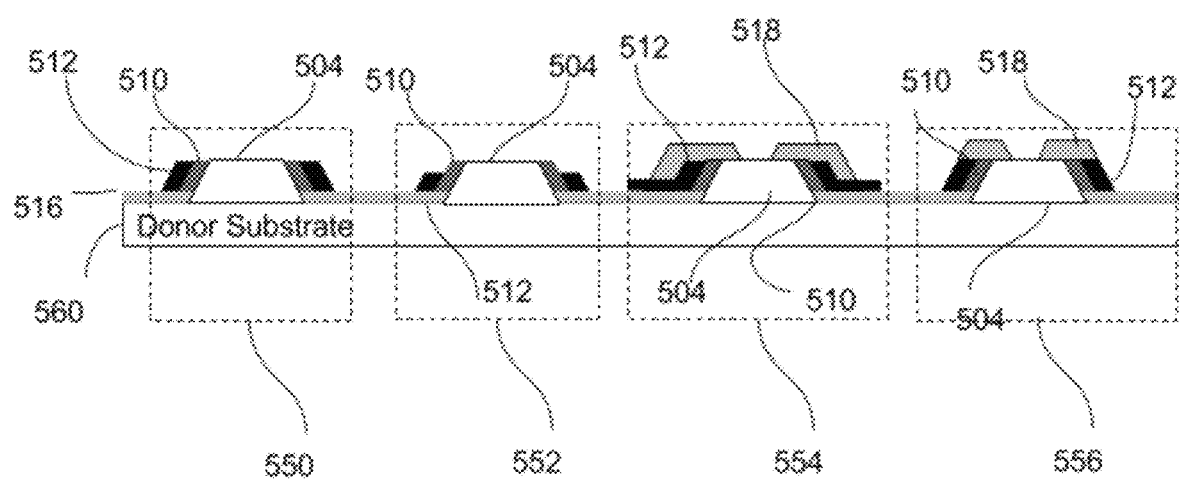
FIG. 6A illustrates embodiments for the formation of different MIS structures on micro devices before the transfer process.
Figure 6C:
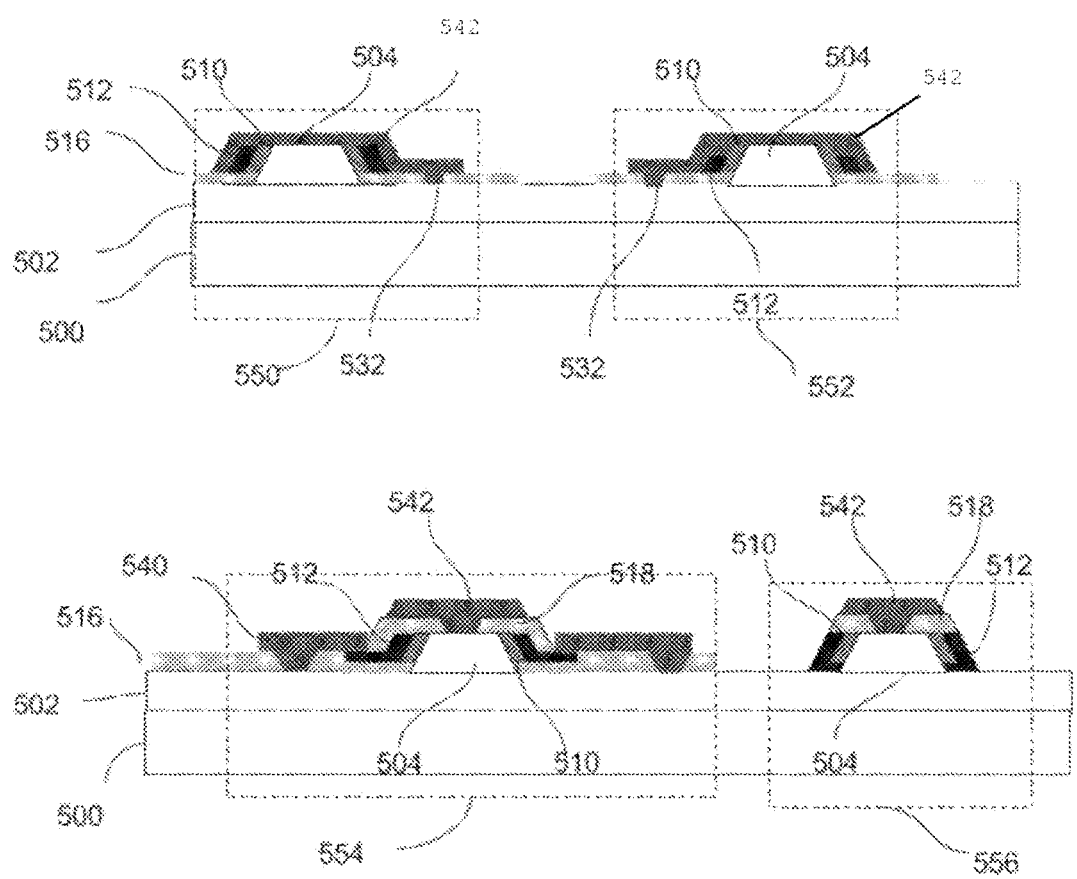
FIG. 6C illustrates micro devices with MIS structures transferred onto a system substrate and different means to couple the devices and MIS structures to electrodes or a circuit layer.

With reference to FIGS. 6A to 6C, an alternative process includes forming part or most of the MIS structure on a donor (or intermediate or original) substrate 560 prior to transferring micro devices 504 to a system substrate 500. The initial process steps may be conducted on the original substrate used for micro devices 504 fabrication or on any intermediate substrate. With reference to FIG. 6A, a first dielectric layer 516 may be deposited prior to forming the MIS structure, which may avoid any unwanted short/coupling between the MIS layer and the other contacts after transfer. The MIS structure is formed by a gate conductive layer 512 and a dielectric layer 510 deposited around and between the micro devices 504. The dielectric layer 510 may be similar to first dielectric layer 516 or different. The first dielectric layer 510 may also be a stack of different dielectric material layers. In example MIS structures 550 and 552, no top dielectric layer 518 is deposited on top of the conductive layer 512. In example MIS structure 552, the gate conductive layer 512 is recessed down from the top edge of the micro device 504 to avoid any short with a top electrode. However, the gate conductive layer 512 may cover the top edge of the micro device 504, if desired. In example MIS structure 554, the gate conductive layer 512 may include a wing portion that extends outwardly from an angled portion parallel to the donor substrate 560 beyond a dielectric layer 518 to create easier access to create connections after transfer to a system substrate. In addition, the micro device 504 may be covered with a second dielectric layer 518 with openings to connect to the micro device 504 and the extended electrode 512. Example MIS structure 556 may use the second dielectric 518 to cover only the top side of the conductive layer 512 and the micro device 504, except for an opening for the top electrode to contact the micro device 504.

FIGS. 6B and 6C show the micro devices 504 with MIS structures after they were transferred to the system substrate 500. During the transfer process, the micro devices 504 may be flipped so that the bottom surface connected to the donor substrate 560 is also connected to the system substrate 500. A connection pad 506 may be provided between each micro device 504 and the system substrate 500 to couple the micro devices 504 to the circuit layer 502. Different methods may be used including the one described above to create a connection for the MIS structure and other electrodes (e.g., a common electrode). In another embodiment, the example MIS structures 550 and 552 include a top electrode 541 covering both the micro device 504 and the gate conductive layer 512 of the MIS structure. The top electrode 542 may be connected to the circuit layer 502 with a via 532 extending through the dielectric layer 516 or the electrode 541 may be connected at the edge of the system substrate 500 through bonding. In example MIS structure 554, an extension 540 of the conductive layer 512 may be used to couple the MIS structure (i.e., the conductive layer 512) to the circuit layer 502. The first dielectric layer 516 may be extended on the system substrate 500 to cover the connection pads 506 between micro device 504 and the system substrate 500 to avoid possible shorts between the MIS structure and other connections. A top electrode 542 may be provided, as in example MIS structures 554 and 556, which extends through an opening in the top dielectric layer 518 into contact with the micro device 504. With regards to example MIS structure 556, the MIS structure (e.g. the conductive layer 512) may be shorted to the device contact pads 506 or the MIS structure may be aligned properly to have its own contact on the system substrate 500. For both example MIS structures 554 and 556, different post-processing steps may be used, similar to other structures disclosed herein. One example may be a common electrode deposition with or without planarization, as in FIG. 5D. Another example may be light confinement structure or other optical structures.

Figure 7A:
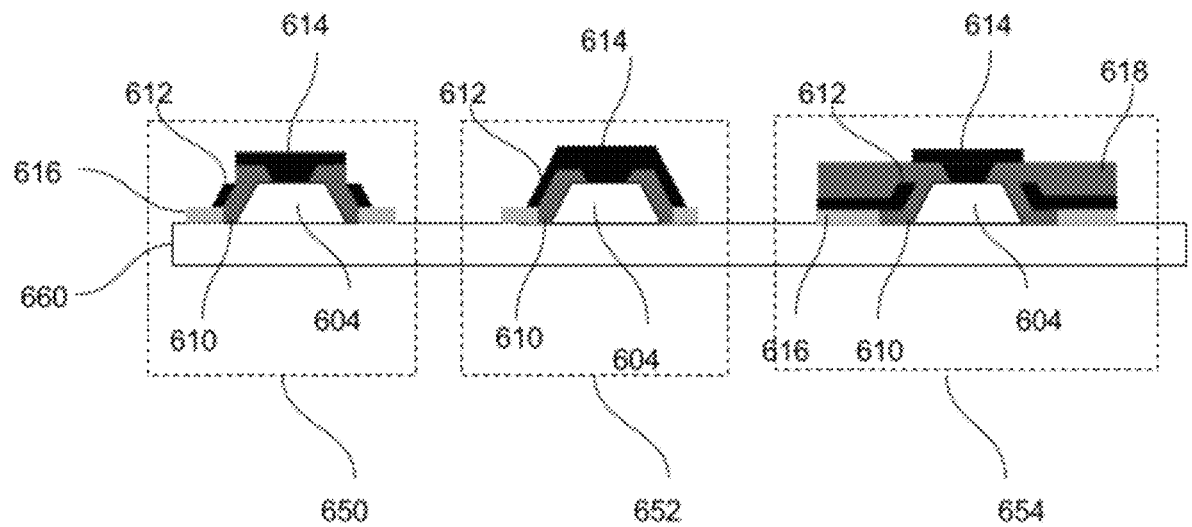
FIG. 7A illustrates another embodiment of the formation of different MIS structures on micro devices before the transfer process.
Figure 7B:
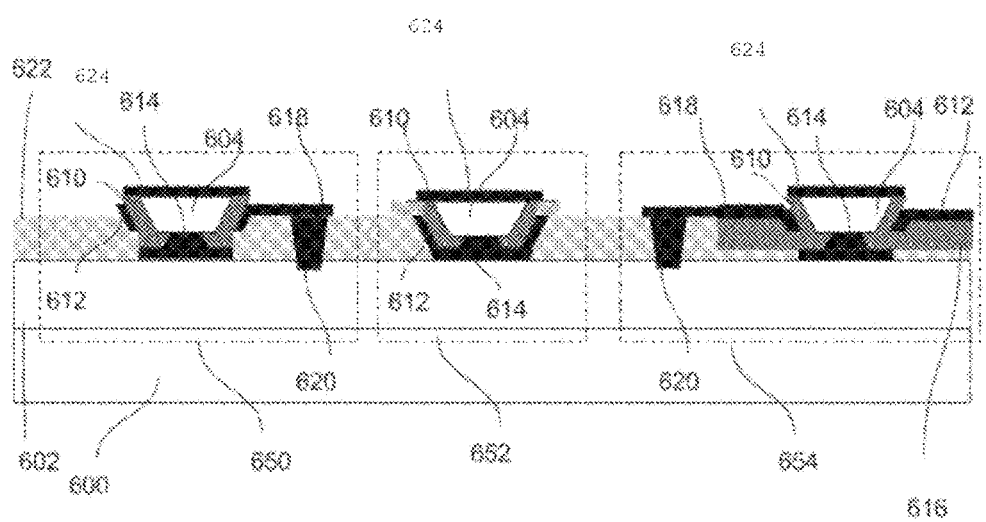
FIG. 7B illustrates micro devices with MIS structures transferred onto a system substrate and different means to couple the devices and MIS structures to electrodes or a circuit layer.

FIGS. 7A and 7B illustrate an alternative process, in which part or most of the MIS structure are formed on the donor (or intermediate or original) substrate 560 prior to their transfer to the system substrate 500. The process may be done on the original substrate used for fabrication of the device or on any intermediate substrate. FIG. 7A illustrates several different example MIS structures 650, 652 and 654, which may be formed on micro devices 604. However, other structures may be used as well. A dielectric layer 616 may be deposited prior to forming the MIS structures, which may avoid any unwanted short/coupling between the MIS structure and other contacts after transfer. The MIS structure includes a conductive layer 612, and a dielectric (i.e., insulating) layer 610. The dielectric layer 610 may be similar to 516 or different. The dielectric layer 610 may also be a stack of different dielectric material layers. In addition, a connection pad 614 may be formed on each micro device 604 that extends through an opening in the dielectric layer 610. In example MIS structure 650 and 652, no dielectric may be deposited on top of the conductive layer 612. However, in example MIS structure 654 an additional layer of dielectric 618 may be provided for planarization and extra insulation between the contact pad 614 and the conductive layer 612. In example MIS structure 652, the conductive layer 612 may be contiguous (i.e., the same) as the contact pad 614. The conductive layer 612 may be recessed from the edge of the micro device 604 or the conductive layer 612 may cover the edge of the device 604. In structure 654, the conductive layer 612 includes an extension that extends parallel to the system substrate 660 to create easier access to create connections after transfer to system substrate 660. In addition, the micro device 604 may be covered with a dielectric layer 618 with openings for connection of the contact pad 614 to the micro device 604 and the extended electrode 612 to the system substrate 660.

FIG. 7B shows the micro devices 604 with MIS structures after being transferred to the system substrate 600. A connection pad 614 may be provided between each micro device 604 and the system substrate 600 to couple each micro device 604 to the circuit layer 602. Different methods may be used, including the ones described above, to create connections between the MIS structures and other electrodes (e.g. a common electrode). Another method is illustrated in FIG. 7B, for MIS structure 650 and 654, in which the negative slope of the micro device 604 is used to create a connection between the MIS structures 650 and 654, and the system substrate 600 through an electrode 618 that extends from the conductive layer 612 parallel to the system substrate 600 along the top of the dielectric layer 621. A conductive metal via 620 may extend through a passivation or planarization (e.g., dielectric) layer 621, into contact with the circuit layer 602. The passivation or planarization layer 621 may be deposited prior to the electrode 618 deposition and patterning. The micro device 604 may be covered during electrode deposition or the conductive layer 612 may be removed from the top of the micro device 604 by patterning and etching. Using the negative slope of the micro device 604 and the conductive layer 612 to separate the top electrode 622 of the micro device 604 and the MIS electrode 618, minimizes misalignment therebetween, which is crucial for high throughput placement of the micro devices 604. The negative slope of the side face of the micro device 604 and the conductive layer 612 forms an acute angle with the circuit layer 602 and the system substrate 600. For all structures, different post-processing steps may be used, similar to other structures disclosed herein. One example may be a common electrode deposition with or without planarization. Another example may be light confinement, or reflective structure or another optical structure.

The methods described herein may be used for different structures and the methods are just examples and may be modified without affecting the outcome. In one example, any one of the top and bottom electrodes 622 and 614 and the conductive layers 612 may be either transparent, reflective, or opaque. Different processing steps may be added between each step to improve the device or integrate a different structure into the device without affecting the outcome of creating the MIS structure.

Vertical Devices with Conductivity Modulation Engineering

Figure 8A:
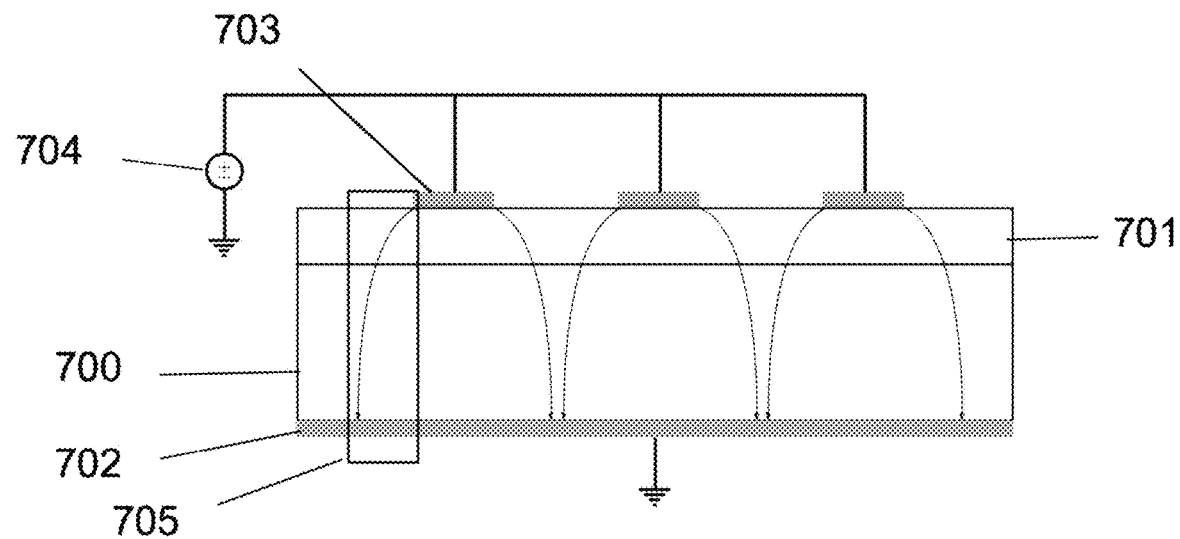
FIG. 8A illustrates a schematic of a vertical solid-state micro device showing the lateral current components and partially etched top layer.

FIG. 8A illustrates a schematic of a vertical solid state micro device, similar to micro devices 406, 504, and 604, showing lateral current components flowing from a top electrode layer, which is capable of directing current through the bulk of the micro device in a device layer 701. The device layer 701 is formed on a device substrate 700 with contact pads 703 (i.e., the top electrode) formed (e.g., etched) on the device layer 701. A voltage source 704 may be connected to the contact pads 703 and a common bottom electrode 702, mounted on the device substrate 700, to generate current to power the micro devices. The functionality of device layer 701 is predominantly defined by the vertical current. However, due to the top surface lateral conduction of the device layer 701, current 705 with lateral components flows between the contact pads 703 and the common electrode 702. In order to reduce or eliminate the lateral current flow 705, these techniques are suggested:

1. Top layer resistance engineering.
2. Full/partial etching modulation.
3. Material conductivity modulation.

In this way, the lateral current flow structure may be divided into three main structures:

1) at least one conductive layer 703 with resistance engineering;
2) a full or partial etching of one or more conductive layers 703, and 3) a material for conductivity modulation (e.g., alternating conductive and non-conductive sections or conductive sections separated by non-conductive sections).

The conductive layer 703 with resistance engineering may be described as follows. The semiconducting top layer of the device layer 701, just before the metallic contact 703, may be engineered to limit the lateral current flow by manipulating the conductivity or thickness of the conductive layer 703. In one embodiment, when the top layer of the device layer 701 is a doped semiconducting layer, decreasing the concentration of active dopants and/or the thickness of the layer may significantly limit the lateral current flows. Also, the contact area may be defined to limit the lateral conduction. In another case, the thickness of the conductive layer 703 (or more than one conductive layers) may be reduced. After that, the contact layer 703 may be deposited and patterned. Deposition of the contact layer 703 may occur on an array of interconnected or contiguous micro devices or on non-isolated micro devices. As a result, the active layers of the device layer 701 are not etched or separated to create individual micro devices. Therefore, no defect is created at the perimeter of the isolated micro devices, since the isolation is developed electrically by controlling the current flow.

Similar techniques may be used on isolated micro devices to diverge the current from the perimeter of each micro device. In another embodiment, after the micro device is transferred to another substrate, the other conductive layer(s) are exposed. The thickness of the device layer 701 may be chosen to be high to improve device fabrication. After the contact layer 703 is exposed, the thickness may be reduced, or the dopant density decreased, however, some of the contact layers 703 may also have a blocking role for the opposite charge. As a result, removing some of the conductive layers of the contact layer 703 to thin the total contact layer resistance may reduce the device performance. However, conductive layer removal may be very efficient for single layer engineering.

Figure 8B:
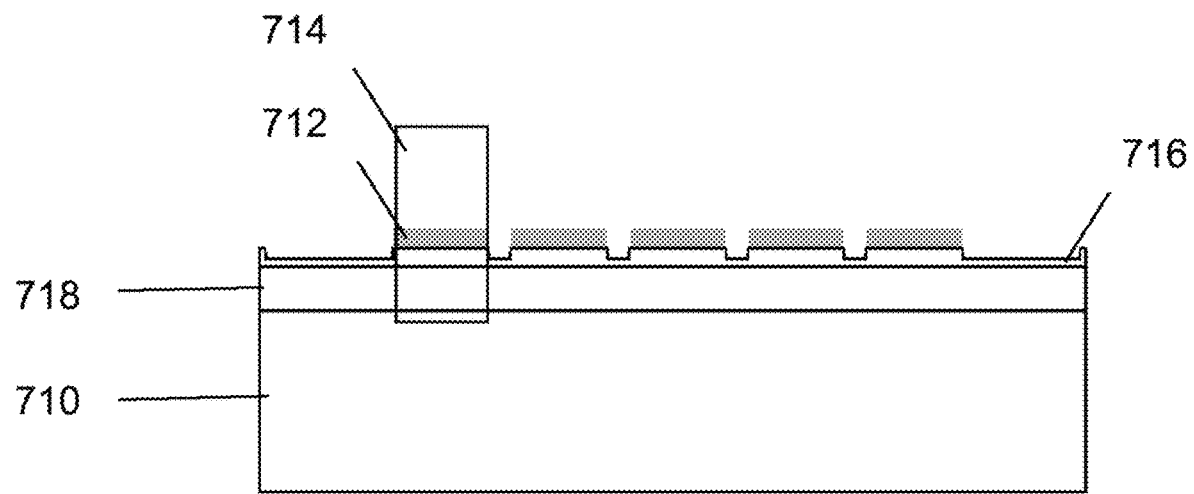
FIG. 8B illustrates a side view of an array of micro devices including a device layer with a partially etched top layer and top layer modulation.

With reference to FIG. 8B, another embodiment of a micro device structure in accordance with the present invention includes a partially etched top layer 716 of a micro device layer 718. In this embodiment, the top conductive layer 716 may be a p-or-n-doped layer in a diode. The material for conductivity modulation directs current through the bulk of the vertical solid state device in the device layer 718. At least one of the conductive layers (e.g., top conductive layer 716) in the device layer 718 may be partially or fully etched, to form alternating raised conductive layer sections and open non-conductive areas. The top conductive layer 716 below top contact 712 and on top of the device layer 718 may be fully or partially etched to eliminate or limit the lateral current flow in the micro devices 714 formed in the device layer 718. Each micro device 714 is defined by the size of the top contact pad 712. This is especially beneficial for micro devices 714 in which the resistance manipulation of the top layer 716 will adversely affect the device performance. The thickness of the top conductive layer 716 between adjacent devices 714 is reduced to make a higher resistance for the current to flow in the lateral direction. An etching process may be done using, for example, dry etching, wet etching or laser ablation. In many cases, the top contact 712 may be metallic and/or used as the mask for the etching step. With full etching, the etching may stop at a function layer of the device layer 718. In one embodiment, the top contact 712 may be deposited on top of the conductive layer 716 and may be used as the mask for etching the conductive layer(s) 716, potentially enabling fewer processing steps and a self-aligned structure. This is especially beneficial for micro devices 714 in which the resistance manipulation of the conductive layer 716 will adversely affect the vertical device performance. In this embodiment, the thickness of the conductive layer 716 is reduced in selected areas to make a higher resistance for the current to flow in the lateral direction. After the bottom conductive layers of the device layer 718 are exposed either by transfer mechanism or etching substrate 710, the same etching process may be performed. Again, the contact 712 may be used as the mask for etching the device layers 716 and 718.

Figure 8C:
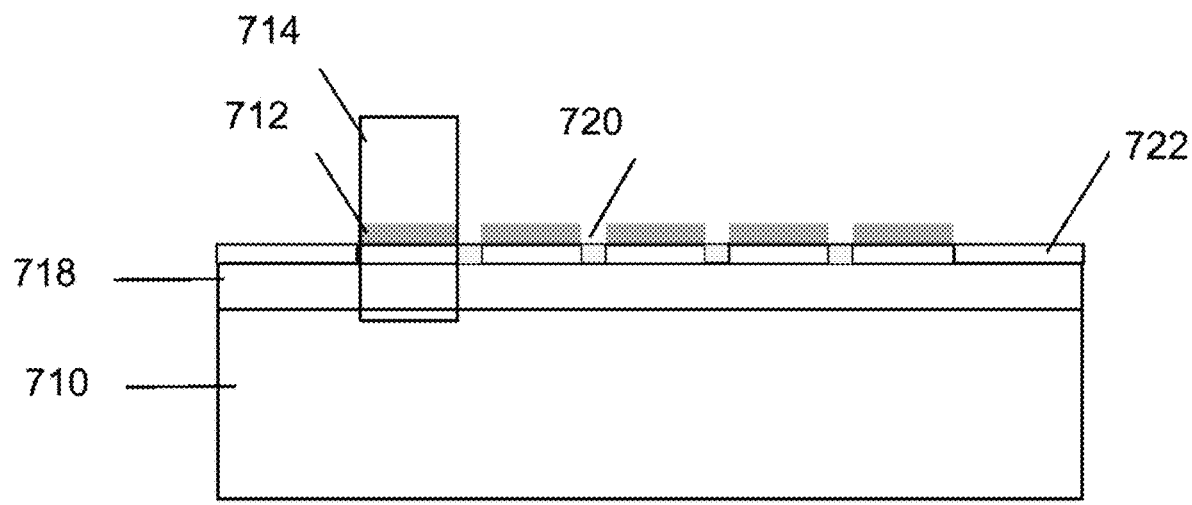
FIG. 8C illustrates a side view of an array of micro devices including a device layer with a top conductive modulation layer.

With reference to FIG. 8C, another embodiment of a micro device structure in accordance with the present invention includes a top conductive modulation layer 722 on the device layer 718. As shown, the resistance of a (non-conductive or reduced-conductive) modulation area 720 of the top conductive modulation layer 722 between adjacent contact pads 712 is manipulated (e.g., increased to greater than conductive layer 722) to limit the lateral current flow components. Counter doping, ion implantation, and laser ablation modulation are examples of processes that may be used to form the modulation areas 720 in this embodiment. The ion implantation or counter doping may extend beyond the conductive layer 722 into the device layer 718 to further enhance the isolation between the current flowing through adjacent micro devices 714. Similar to the full/partial modulation scheme, in this embodiment the top contact 712 may be deposited on the top conductive layer 722 first, and then used as a mask for the doping/implantation of the areas 720. In another embodiment, oxidation may be used to form the modulation areas 720. In one method, a photoresist is patterned to match the modulation area 720, and then the devices are exposed to oxygen or another chemical oxidant to oxidize the modulation areas 720. Then, the top contacts 712 may be deposited and patterned. In another method, the top contacts 712 are deposited and patterned first, and then the top contact 712 is used as a mask for oxidation of the modulation areas 720. The oxidation step may be done on isolated devices or non-isolated devices. In another embodiment, prior to oxidation, the total thickness of the conductive layer(s) 722 may be reduced. The reduction step may be done on selected modulation areas 720 for oxidation only. In another case, the oxidation may be done on the walls of the micro devices 714, which is especially applicable for isolated devices. Also, the bottom layer of the device layer 718 may be modulated similarly after being exposed. In another embodiment, the material conductivity modulation may be done through electrical biasing. The bias for the areas 720 that require high resistance is modified. In one embodiment, the effect on the areas 720 may be extended to the device layers 718. Here, the conductive layer 722 may be modified (e.g., etched or implanted) with other methods described herein as well. In one embodiment, charge may be implanted underneath area 720 inside device layers 718. The implantation may be partial or all the way to the other side of the device layer 718.

In one embodiment, the bias modulation may be provided using an MIS structure, and the metal layer may be replaced with any other conductive material. For example, to prevent the current from the contact 712 from going further away from the contact laterally, an MIS structure is formed around the contact 712. The MIS structure may be formed before or after the contact is in place. In all above-mentioned embodiments, the area of the active micro device 714 is defined by the top contact pads 712 formed on the device layer 718.

Figure 8D:
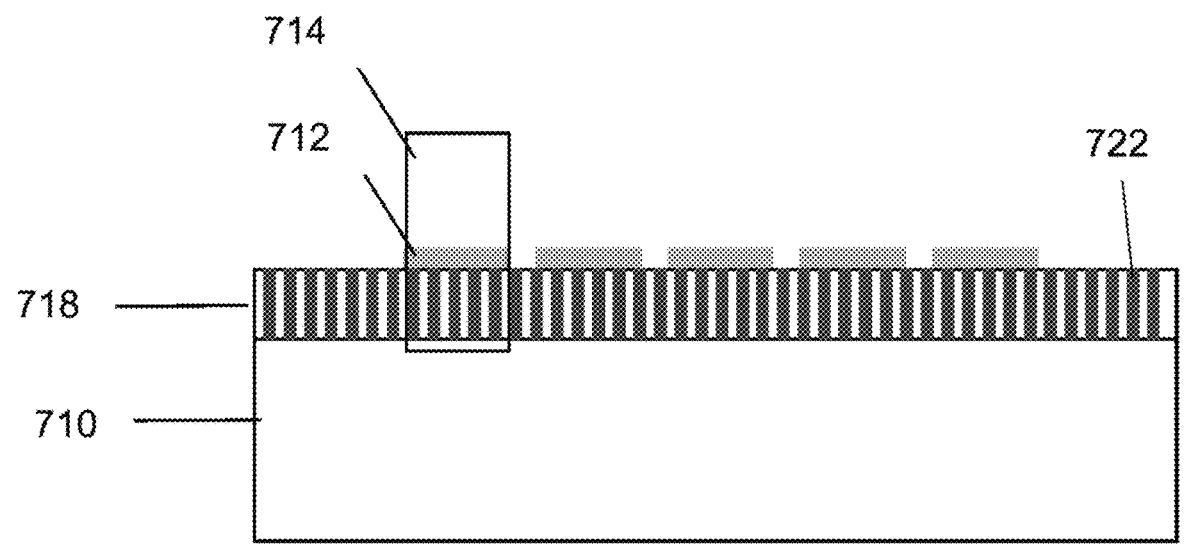
FIG. 8D illustrates a side view of an array of micro devices including a device layer with nanowire structures.

The definition of the active device area by the top contact pad 712 may be more readily applied to micro devices 714 with pillar structures. FIG. 8D illustrates a cross section of an MIS structure surrounding a single contact layer 712; however, it is understood that the same may be done for more than one contact layer 712. The device layer 718 is a monolithic layer comprising or consisting of pillar structures 722. Since the pillar structures 722 are not connected laterally, no lateral current component exists in the device layer 718. One example of these devices is nanowire LEDs, in which each LED device consists of several nanowire LED structures fabricated on a common substrate 710. In this case, as shown in FIG. 8D, the top metallic contact 712 defines the active area of the LED structure 714. Device layers 718 with no lateral conduction are not limited to pillar structures and may be extended to device layers 718 with separated active regions, such as layers with embedded nano or microspheres, or other forms.

Figure 8E:
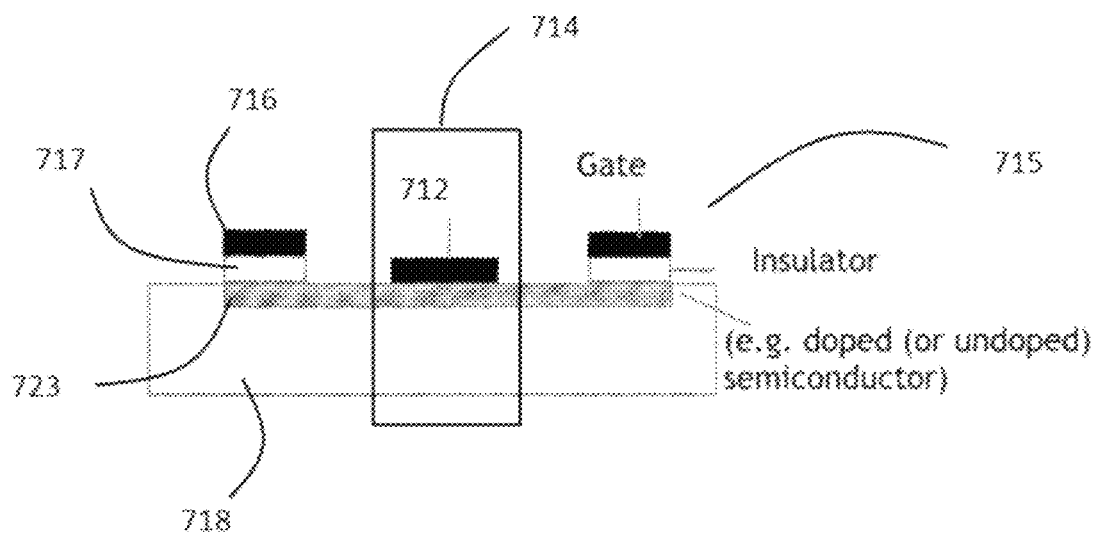
FIG. 8E illustrates a cross section of an MIS structure surrounding a contact layer.

In FIG. 8E, another embodiment of a micro device structure in accordance with the present invention includes an MIS structure 715 surrounding the contact layer 712. The MIS structure 715 comprises a top conductive layer 716, a middle insulator (e.g., dielectric) layer 717, and a bottom semiconductor layer 723, which may be a top layer of the device layer 718. Biasing the conductive layer 716 of the MIS structure 715 to an off voltage causes limited or no current to pass through the MIS structure 715 laterally. The MIS structure 715 may be formed on the device layer 718 or may be part of the transferred substrate, and the MIS structure 715 defines the direction of lateral conduction. Other configurations are conceivable, such as the conductive layer 716 may extend to both sides of MIS structure 715, such that the dielectric 717 may extend over other conductive layers 712. The MIS structure 715 may be an open or closed structure, or alternatively, a continuous or one-piece structure. In another embodiment, the dielectric 717 may comprise the oxidation layers from a photoresist or masking step. Another dielectric layer may be deposited on top of the oxidation layer, or a deposited dielectric layer may be used by itself. In another embodiment, the conductive layer(s) 716 may be removed so that the dielectric layer 717 is in contact with a semiconductor layer 723. The MIS structure 715 may also be formed on the walls of the micro device 714 to further deter current from travelling to the edge of the micro device 714. The micro device surface may also be covered by a dielectric layer. For example, a gate conductive layer may be deposited and patterned for a gate electrode 716, and then a dielectric layer 717 may be patterned using the gate electrode 716 as a mask. In another method, the dielectric layer 717, which is an insulator, is patterned first, and then the gate electrode 716 is deposited after. The gate electrode 716 and the contact 712 may be patterned at the same time or separately. A similar MIS structure may also be made on the other side of the device layer 718 after it is exposed. The thickness of conductive layers 716 of the micro device 714 may be reduced to improve the effectiveness of the MIS structure 715. Where selective etching or modulation of the conductive layer 716 on either side of the vertical micro device 714 is difficult, the MIS structure method may be more practical, in particular if etching or resistance modulation may damage the active device layer 718. In the described vertical structures, the active device area 714 is defined by the top contact area 712. Here, the ion implantation in the dielectric layer 717 or the charge storage in a floating gate 716 may be used to permanently bias the MIS structure 715.

Figure 8F:
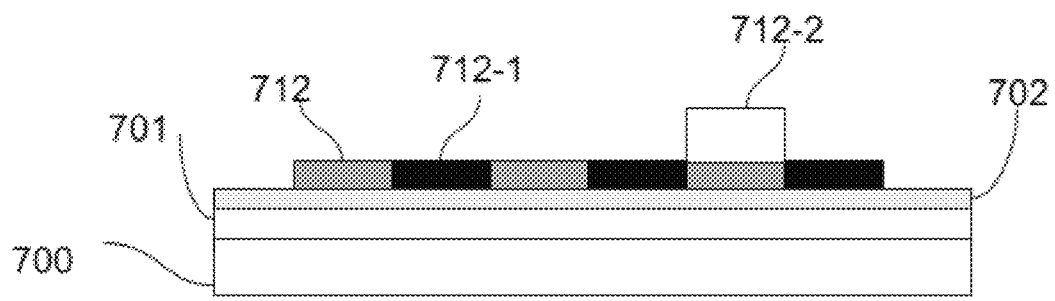
FIG. 8F illustrates a side view of an array of micro devices including contacts separated by dielectric or bonding layers.
Figure 8G:
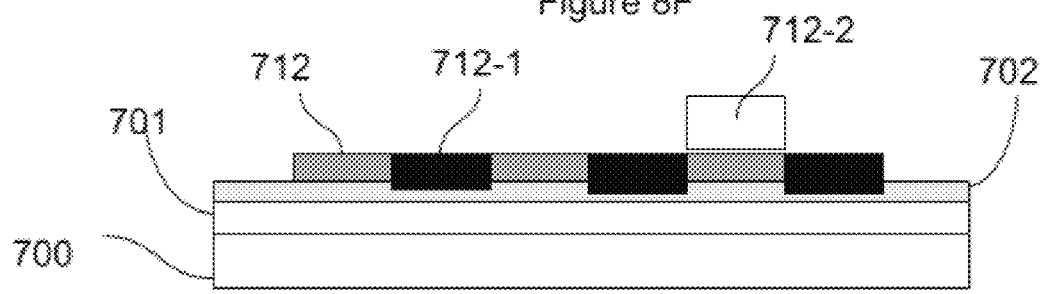
FIG. 8G illustrates a side view of an array of micro devices including contacts separated by dielectric or bonding layers.

FIGS. 8F and 8G illustrate a structure highlighting the use of a dielectric layer 712-1 between the contact pads 712. The contact pads 712 define the micro devices in a device layer 701 on top of a substrate 700, which may be sapphire or any other type of substrate. The micro devices include a conductive layer 702 and a contact pad 712. In FIG. 8F, the conductive layer 702 is intact, but in FIG. 8G the conductive layer 702 is either etched, modified, or doped between each contact pad 712 with a different carrier or ions. Some extra bonding layers 712-2 may be placed on top of the contact pads 712, or the contact pads 712 may comprise the bonding layers 712-2. The bonding layers 712-2 may be for eutectic bonding, thermocompression, or anisotropic conductive adhesive/film (ACA/ACF) bonding. During the bonding, the dielectric layer 712-1 may prevent the contact pads 712 from expanding to other areas and creating contacts. In addition, the dielectric layer 712-1 may also be a reflector or a black matrix to confine the light further. This embodiment is applicable to the embodiments demonstrated in FIGS. 8-11 and all other related embodiments. The methods described here can be applied to either side of the micro devices.

Method for Manufacturing LED Displays

Methods for manufacturing LED displays are described using LED devices grown on a common (e.g., sapphire) substrate. Each LED may comprise a substrate 750, a first doped conductive layer 752 (e.g., n-type layer) active layers 754, and a second doped conductive layer 756 (e.g., p-type layer) formed on the substrate 750. The following is described with reference to a Gallium Nitride-based (GaN) LED; however, the presently described vertical device structure may be used for any type of LEDs with different material systems.

Figure 9A:
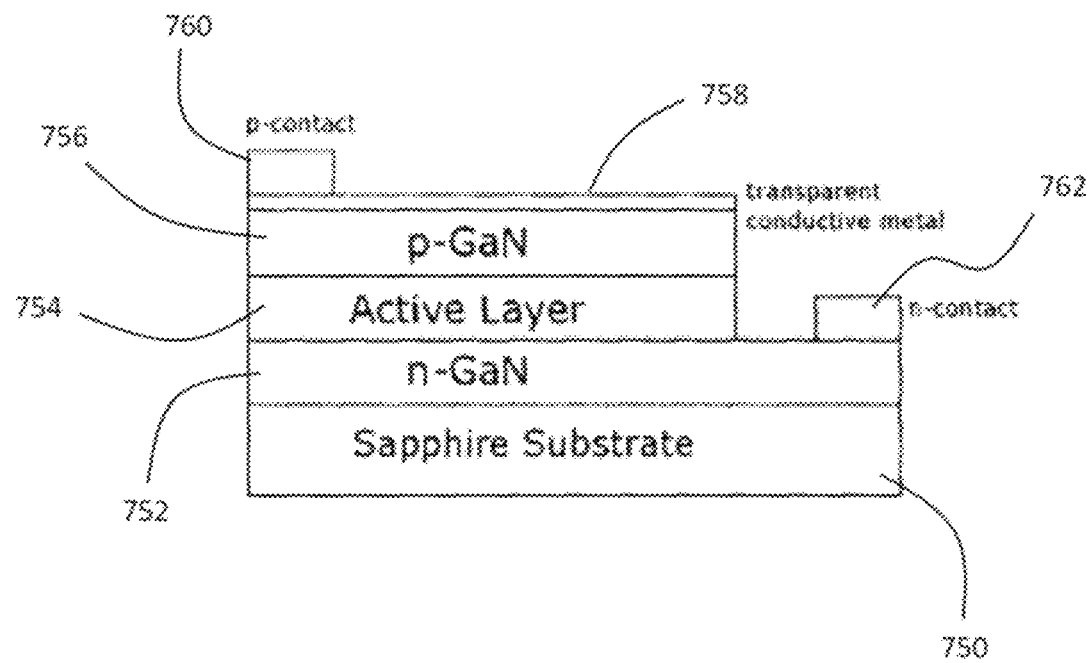
FIG. 9A illustrates a side view of a conventional Gallium nitride (GaN) LED device.

With reference to FIG. 9A, the GaN LEDs are fabricated by depositing a stack of material on the sapphire substrate 750. The GaN LED device includes the substrate 750, such as sapphire, an n-type GaN layer 752 formed on the substrate 750 or a buffer layer (for example GaN), an active layer 754, such as a multiple quantum well (MQW) layer, and a p-type GaN layer 756. A transparent conductive layer 758, such as Ni/Au or ITO, is usually formed on the p-doped GaN layer 756 for better lateral current conduction. Conventionally, a p-type electrode 760, such as Pd/Au, Pt, or Ni/Au is then formed on the transparent conductive layer 758. Since the substrate 750 (sapphire) is an insulator, the n-type GaN layer 752 is exposed to make an n-contact 762 to the n-type layer 752. This step is usually done using a dry etch process that exposes the n-type GaN layer 752, and then deposits the appropriate metal contacts for the n-contact 762. In LED display applications where display pixels are single device LEDs, each LED is bonded to a driving circuit which controls the current flowing into the LED device. Here, the driving circuit may be a thin film transistor (TFT) backplane conventionally used in LCD or organic light-emitting diode (OLED) display panels. Due to the typical pixel sizes (10-50 µm), the bonding may be performed at a wafer level scale. In this scheme, an LED wafer, comprised of isolated individual LED devices, may be aligned and bonded to a backplane which is compatible with the LED wafer in terms of pixel sizes and pixel pitches. Here, the LED wafer substrate may be removed using various processes such as laser lift-off or etching.

Figure 9B:
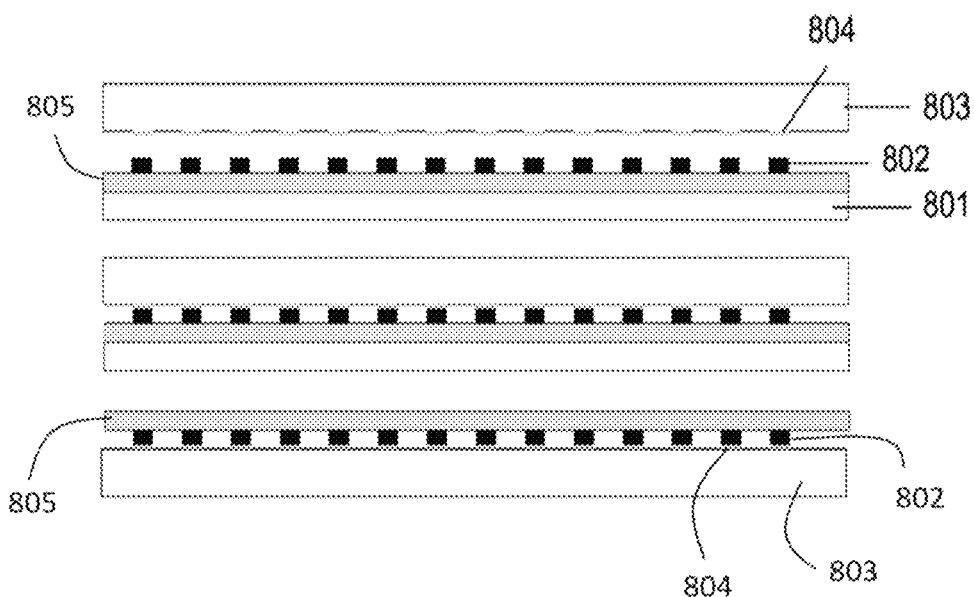
FIG. 9B illustrates a fabrication process of an LED display and an integration process of a device substrate with micro devices defined by top contacts and bonding the substrate to a system substrate.

FIG. 9B illustrates a fabrication process of an LED display, including the integration process of a device substrate 801 with micro devices in a device layer 805 defined by top contacts 802, and bonding of the device substrate 801 to a system substrate 803. Micro devices are defined using the top contact 802 formed on top of the device layer 805, which may be bonded and transferred to the system substrate 803 with corresponding and aligned contact pads 804. For example, the micro devices may be micro LEDs with sizes defined by the area of their top contact 802 using any methods explained above. The system substrate 803 may be a backplane with transistor circuitry to drive individual micro LEDs. In this process, the LED devices are isolated by dry etching and passivation layers. Fully isolating the devices may create defects in the active or functional layers, reducing the efficiency and imposing non-uniformities. Since the perimeter compared to the area of the micro devices is more substantial as the device becomes smaller, the effect of defects become more noticeable. In one embodiment, a monolithic LED device is converted into individual micro LEDs without etching the active area and using lateral conductive manipulation. As a result, there is no sidewall within the micro LED to create defects. The surrounding walls across the array of LEDs may be thereby extended until they have no effect on the peripheral LED devices. Alternatively, a set of dummy LED devices around the array may be used to reduce the effect of the peripheral walls on the active micro LED devices. This technique may also be used to prevent or reduce the current going through the sidewalls.

Figure 9C:
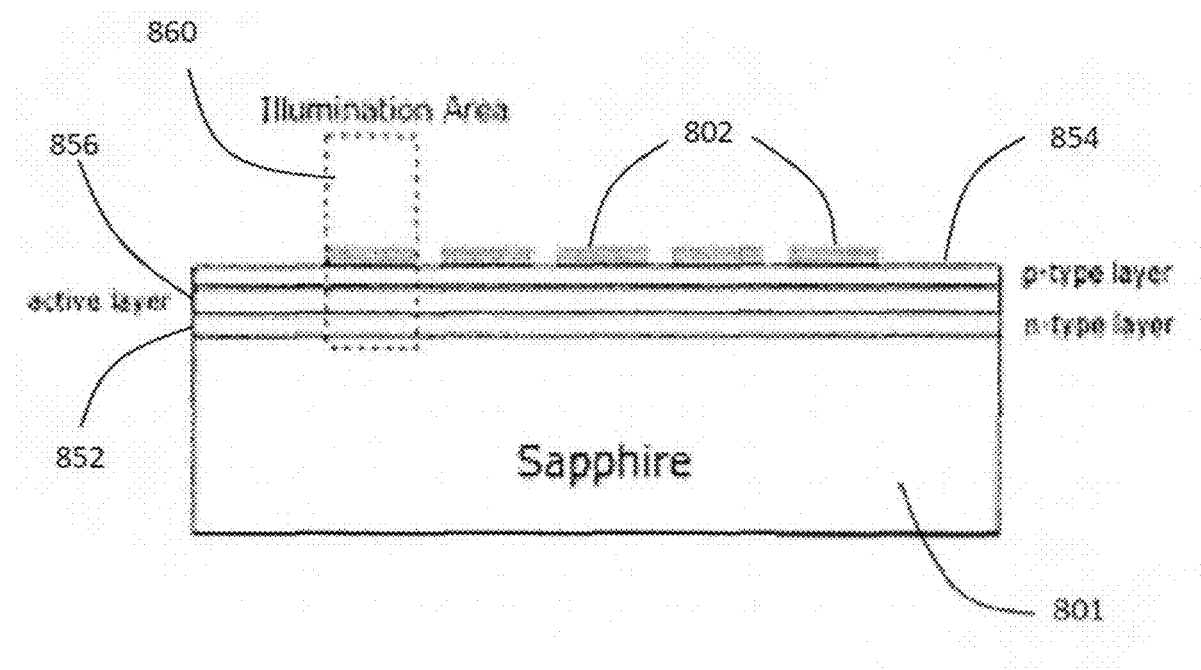
FIG. 9C illustrates an LED wafer structure including an array of micro devices defined by the top contact.

In another embodiment, illustrated in FIG. 9C, an LED wafer may be fabricated such that the device layer 805 includes a first doped conductive (e.g., an n-type) layer 852 on a substrate 801 with the second doped conductive layer (e.g., a p-type) layer 854 as the top layer, and the monolithic active layer 856 therebetween. Each contact 802 defines an illumination area 860. The thickness of the second doped conductive (e.g., p-type) layer 854 and conductivity may be manipulated to control the lateral conduction through the device. This may be done by either etching the pre-deposited conductive layer 854 or by depositing a thinner second (e.g., p-type) conductive layer 854 during the LED structure fabrication. For the etching method, accurate thickness control may be achieved using a dry etching process. In addition, the material structure of the second (e.g., p-type) layer 854 may be modified based on layer doping level to increase the layer's lateral resistance. The second doped conductive layer 854 does not have to be limited to the p-type layer and may be extended to other top layers in the LED structure. As a result of this modification, the illumination area 860 may be defined solely by the area of the deposited contact layer 802 on top of the p-type film 854.

Figure 9D:
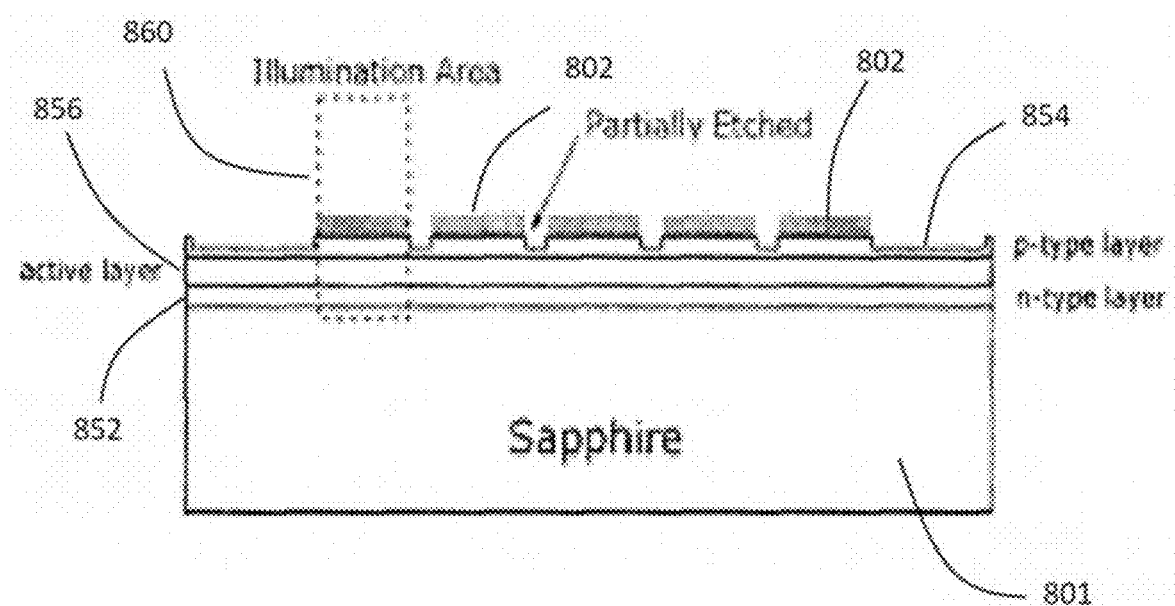
FIG. 9D illustrates an LED wafer structure including an array of micro devices defined by the top contact and partially etched top conductive layer.

In another embodiment illustrated in FIG. 9D, to further limit the lateral illumination, the second doped conductive layer (e.g., p-layer) 854 between two adjacent pixels may be fully or partially etched. This process step may be done after the contact layer (e.g., contacts 802) is deposited in a process such as dry etching. In this case, the contact layer 802 may be used as a mask for etching the second conductive layer 854. Preferably the present structure limits or eliminates the wall passivation of pixels, which results in a higher number of pixels in a specific area of the wafer or higher pixels per inch (PPI). This may also be translated to fewer process steps and a lower fabrication cost compared to fully isolated LEDs with wall passivation.

Figure 9E:
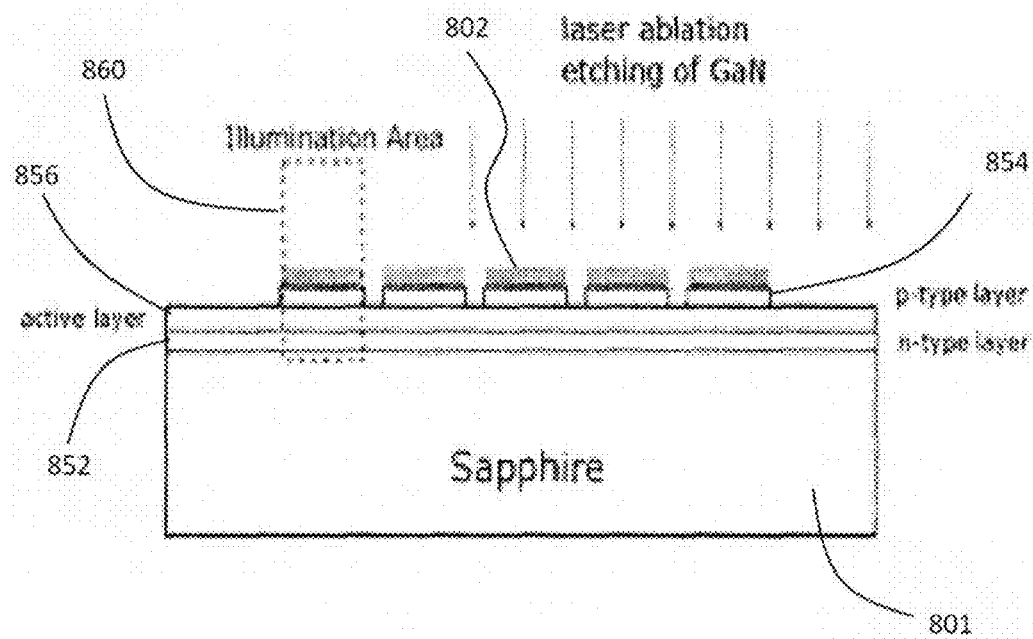
FIG. 9E illustrates an LED wafer structure including an array of micro devices defined by the top contact and a laser-etched top conductive layer.

In another embodiment illustrated in FIG. 9E, an LED wafer structure is defined by the top contacts 802 and a sub-divided second doped conductive (e.g., p-type) layer 854 including individual sections defined by laser etching for example. Here, the second conductive layer 854 (e.g., p-type) may be partially or fully removed using laser ablation etching of the top conductive material (e.g., GaN). In this case, laser fluence defines the ablation rate, and any thickness of the second conductive (e.g., p-type GaN) layer 854 may be etched precisely. One example of such a laser is a femtosecond laser at red or infrared wavelengths. Here, the top metal contacts 802 or other protective layers are used as a mask in the laser etching process steps. Alternatively, the laser beam size may be defined using special optics to match the desired etching region dimensions. In another example, shadow masks may be used to define the sections of the second conductive layer 854 (i.e., the etching regions) between contacts 802. Laser ablation etching may also be extended to the other layers (e.g., at least one of the active layers 856 and the first conductive layer, such as n-type, layer 852, of the LED structure). In this case, the individual LED devices may be isolated fully or partially from each other. In this scenario, it may be required to passivate LED etched walls by depositing dielectric layers.

Figure 9F:
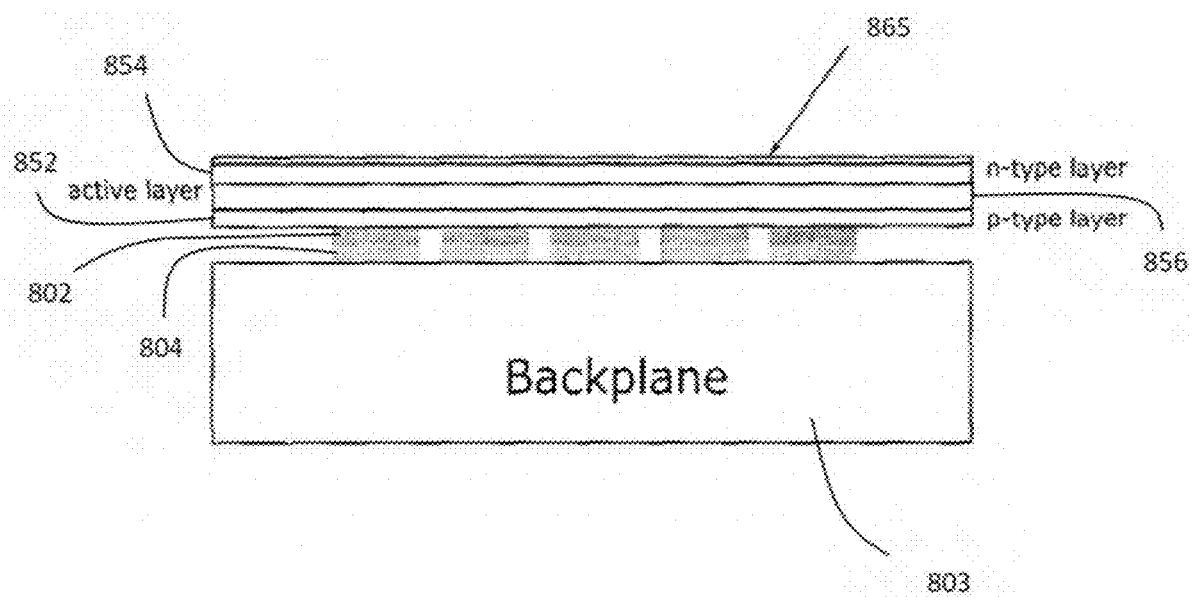
FIG. 9F illustrates an LED wafer including an array of micro devices bonded to a backplane structure.
Figure 9G:
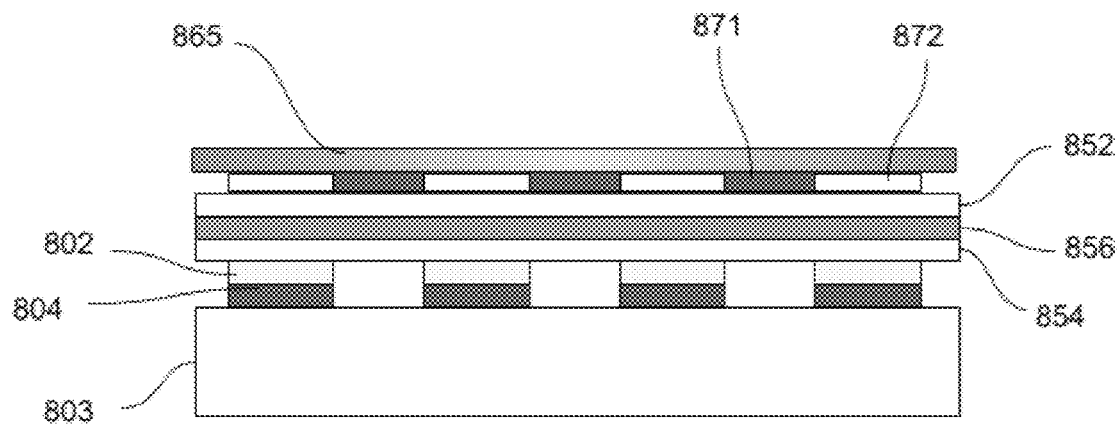
FIG. 9G illustrates an LED wafer including an array of micro devices bonded to a backplane structure with a common top electrode.

In the above-mentioned embodiments, contacts 865 for the first conductive layer 852 (e.g., n-layer contacts) may be formed after the first conductive layer 852 is exposed either by bonding and removing the LED wafer substrate 801 that connects to the backplane circuitry 803 or any other substrate, or by etching the substrate 801. In this embodiment, the first (e.g., n-type) layer contact 865 may be a transparent conductive layer to enable light illumination therethrough. In this embodiment, the first (e.g., n-type) layer contact 865 may be common for all or part of the bonded LEDs, as shown in FIG. 9F, which illustrates an LED wafer, as herein described with particular reference to FIGS. 9C to 9E, with the substrate 801 removed and replaced with a common transparent n-contact 865, and the contacts 802 bonded to bonding pads 804 of the backplane structure 803. In cases where the LED device structure is grown on a semiconductor buffer layer, for example an undoped GaN substrate, in place of substrate 801, this buffer layer may be removed after the LED transfer process to access the first conductive, (e.g., n-type) layer 852. In the embodiment shown in FIG. 9F, the entire GaN buffer layer is removed using processes such as dry/wet etching. As demonstrated in FIG. 9G in another embodiment, the first conductive (e.g., n-type) layer 852 may be connected to the common electrode 865 with a layer of alternating dielectric sections 871 and doped conductive sections (e.g., n-type) 872, with the conductive sections 872 superposed over a corresponding contact 802 to define the illumination areas. The second conductive (e.g., p-type) layer 854 may be connected to the contacts 802. In another embodiment, both the first (e.g., n-type) and the second (e.g., p-type) layers 852 and 854 may be connected to a controlling electrode (e.g., 865) or a backplane (e.g., 803) for further pixilation.

Figure 10A:
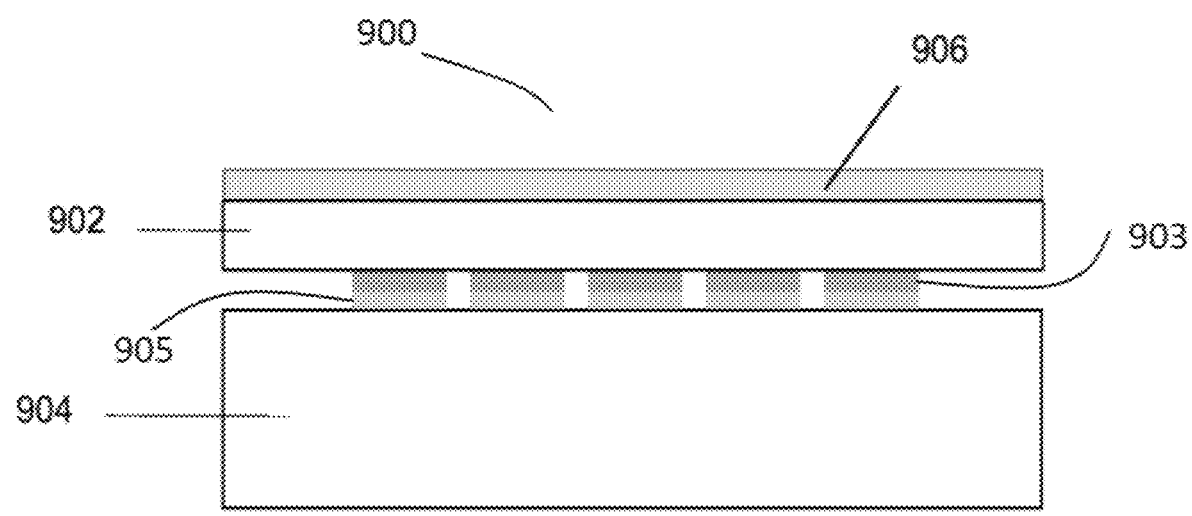
FIG. 10A illustrates an LED wafer including an array of micro devices bonded to a backplane structure with a common transparent top electrode.

FIG. 10A illustrates an integrated device 900 with micro devices defined by top contacts 903 bonded to a system substrate 904, which may include bonding pads 905. A common electrode 906, may be formed on top of the structure. After transferring and bonding the device layer 902, which comprises a first conductive (e.g., n-type) layer, a second conductive (e.g., p-type) layer, and an active layer therebetween, a common top electrode 906 may be deposited on the structure. For some optical device layers, the common top electrode 906 may be a transparent or a reflective conductive layer. The second conductive (e.g., p-type) layer may be thinned to reduce the light scattering effect before depositing the top contacts 903. In addition, a bank structure that has alternating first conductive material, n-type, and dielectric sections, may be used to define the pixels where the wall of the banks (i.e., dielectric layer) are opaque or reflective layers, as described with reference to FIG. 9G.

Figure 10B:
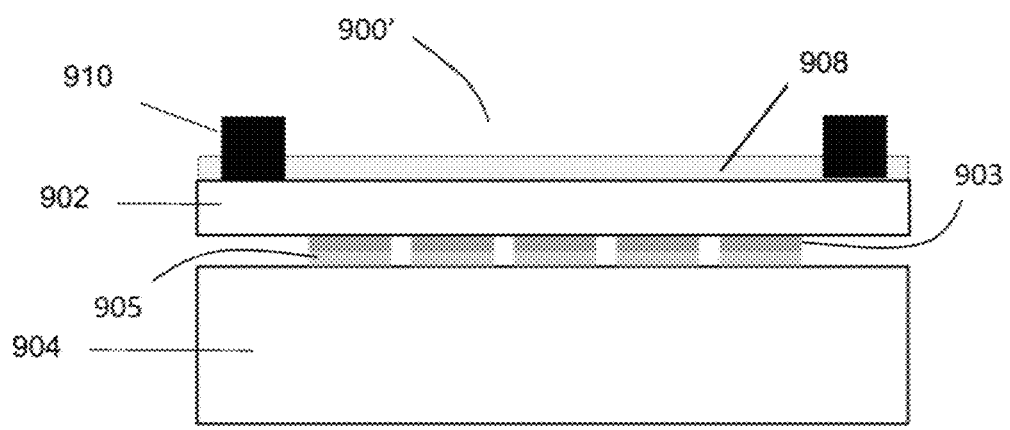
FIG. 10B illustrates an integrated LED wafer bonded to a system substrate, and includes an array of micro devices defined by top contacts.

With reference to FIG. 10B in an alternative embodiment, the LED wafer 900 includes a buffer (e.g. dielectric) layer 908 and one or more common metallic contacts 910 (e.g., n-contact vias) extending through the buffer layer 908 into contact with the device layer 902 (e.g., first conductive, such as n-type). The integrated device 900' includes micro devices defined by top contacts 903 bonded to a system substrate 904, ideally using contact pads 905. The common electrodes 910 may be formed at the edges of the device layer 902 and through the buffer layer 908 on top of the device layer structure 902. As shown, the buffer layer 908 is patterned around the edge to extend vias through the buffer layer 908 to make metallic contacts to the first conductive (e.g., n-type) layer. The top layer of the integrated device layer structure 902 may be a layer with low conductivity. For example, the top layer may be a buffer layer used during the growth of the device layer 902. In this case, the common electrodes 910 may be formed by making vias through the buffer layer 908, for example at the edge of the structure to avoid the top buffer layer.

Figure 10C:
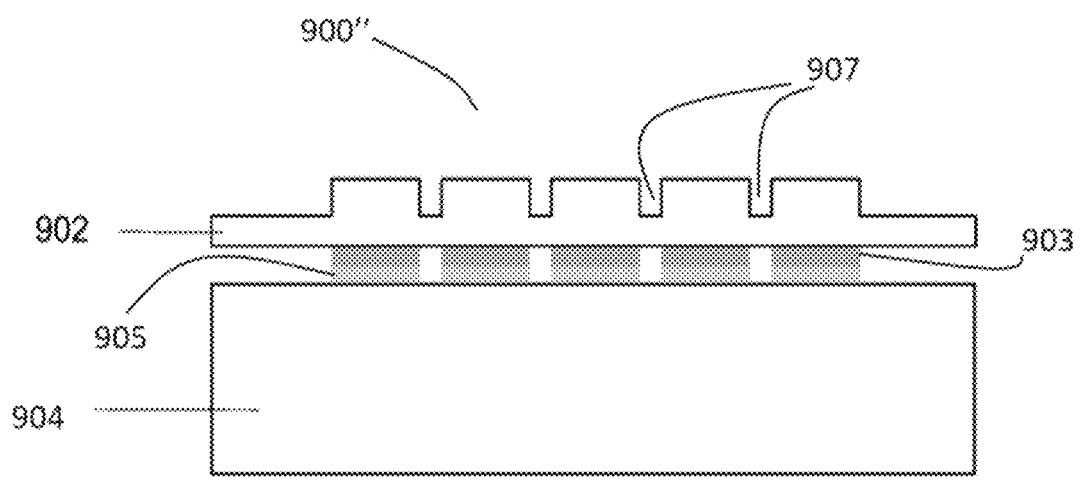
FIG. 10C illustrates an LED wafer with a buffer layer and metallic contact vias.

With reference to FIG. 10C, a transferred LED wafer 900" includes a device layer 902 with a patterned first conductive (e.g., n-type) layer. Underneath the n-type layer is an active layer and a p-type layer, as hereinbefore described. To further decrease the lateral light propagation or adjust the device definition, the first conductive (e.g., n-type) layer is patterned by partially or fully removing the first conductive layer to form open channel grooves 907 between first conductive sections, using the same structure as the front metallic contact 910. Alternatively, the thickness of the first conductive layer may be reduced. The first (e.g., n-type) contact may be formed by depositing a transparent conductive layer on top of the device layer structure 902. The integrated device 900" with micro devices defined by the top contacts 903 may be bonded to a system substrate 904. The top of the device layer structure 902 is patterned to isolate micro devices electrically. The other layers (e.g., active and second conductive) and device layer 902 may be patterned or modulated to further isolate micro devices electrically and/or optically.

Figure 10D:
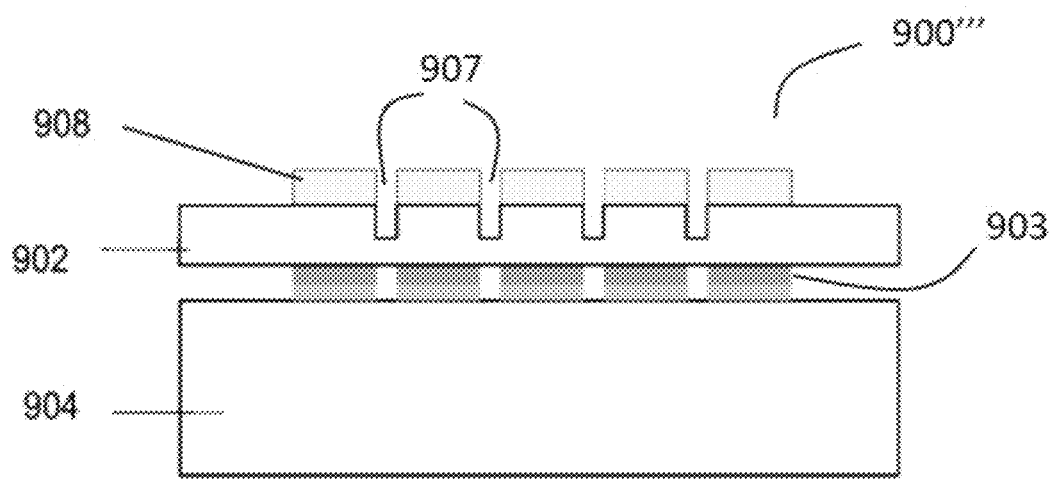
FIG. 10D illustrates an LED wafer including an array of micro devices with a patterned top conductive layer.
Figure 10E:
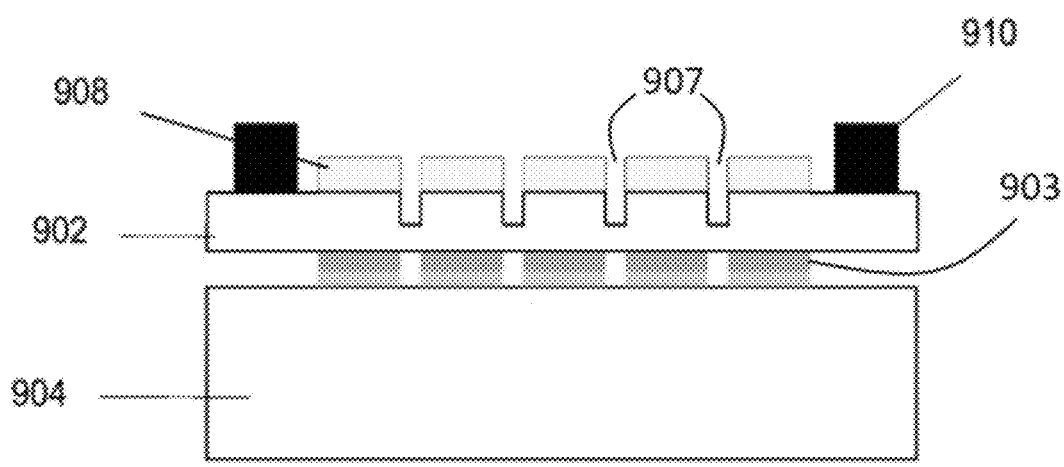
FIG. 10E illustrates an integrated device substrate with micro devices defined by top contacts bonded to a system substrate.

FIGS. 10D and 10E illustrate another embodiment of a transferred LED wafer with a patterned first conductive (e.g., n-type) layer of the device layer 902. In cases where the buffer layer 908 is present, both the buffer layer 908 and the first conductive (e.g., n-type) layer are patterned with open channel grooves 907 between superposed first conductive and buffer layer sections. In one embodiment, the patterned grooves 907 may be further processed and filled with a material that improves the light propagation through the patterned area. An example of this is surface roughening to suppress total internal reflection and a reflective material that prevents vertical light propagation in the grooves 907. The integrated device 900''' comprises micro devices defined by top contacts 903 bonded to a system substrate 904 using bonding pads 905. The top of the structure is patterned to isolate micro devices electrically and optically, and common contacts 910 are formed at the edge of the device layer structure 902. If the buffer layer 908 exists, the buffer layer 908 needs to be patterned or modulated as well to isolate micro devices. Similar to the embodiment shown in FIG. 10B, the common contacts 910 may be formed, for example, at the edge of the active layer structure 902 through vias in the buffer layer 908. In addition, color conversion layers (or color filter layers) may be deposited on top of the patterned buffer or conductive layers 908 and 902 to create a color display. In one case, the color conversion layers (or color filter layers) may be separated by a bank structure that may be reflective as well.

Figure 10F:
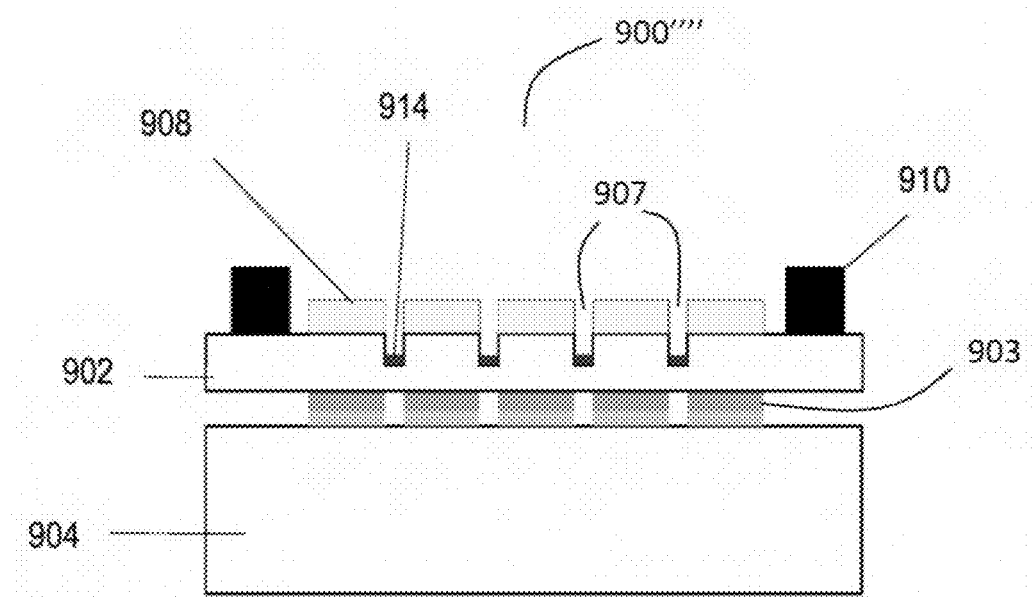
FIG. 10F illustrates an integrated device substrate with micro devices defined by top contacts bonded to a system substrate, and optical elements formed between adjacent micro devices.

An integrated device 900"", illustrated in FIG. 10F, includes micro devices defined by top contacts 903 bonded to a system substrate 904 with optical elements 914 formed in the grooves 907 between adjacent micro devices. As shown, the open channel grooves 907 may be filled by a layer or a stack of optical layers 914 to improve the performance of isolated micro devices. For example, in optical micro devices, the optical elements 914 may comprise some reflective material to better outcouple the light generated by the micro devices in a vertical direction.

Figure 10G:
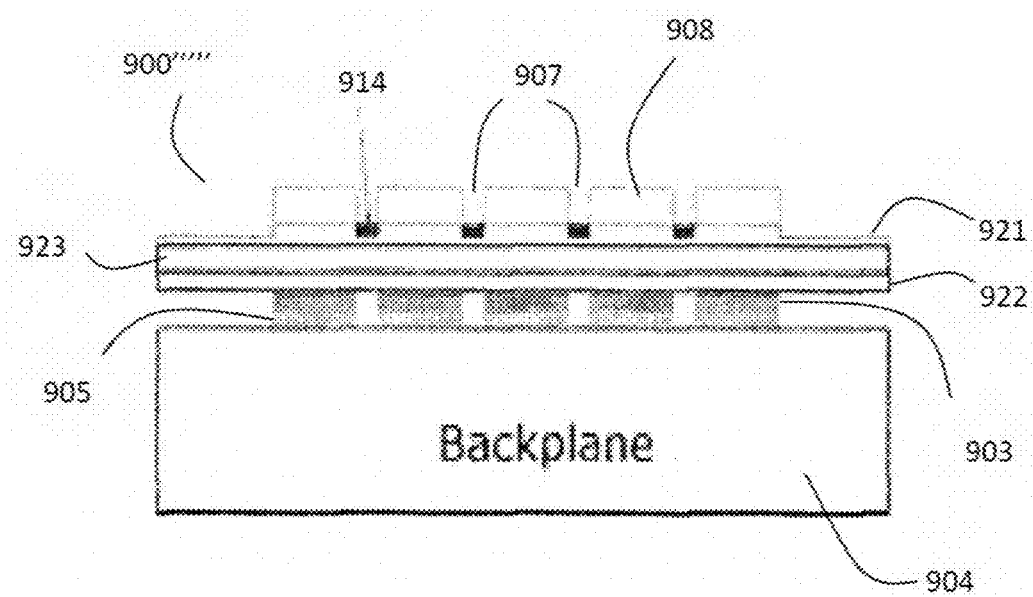
FIG. 10G illustrates a transferred LED wafer including an array of micro devices with a patterned top conductive layer and light management scheme.

FIG. 10G illustrates another embodiment of a transferred LED wafer 900""' including the device layer 902 comprising a first conductive (e.g., n-type) layer 921, a second conductive (e.g., p-type) layer 922, and a monolithic active layer 923 therebetween. The second conductive layer 922 is electrically connected to the backplane 904 using the contacts 903 and corresponding contact pads 905 on the backplane 904. The first conductive layer 921 and the buffer layer 908 are patterned to form open channel grooves 907 between raised first conductive layer portions. As hereinbefore described, the grooves 907 may include light management elements 914 (e.g., reflective material to direct light vertically and prevent scattering between micro devices).

In LED display applications where display pixels are single device LEDs, each LED should be bonded to a driving circuit which controls the current flowing into the LED devices. Here, the driving circuit may be a TFT (Thin Film Transistor) backplane 904 conventionally used in LCD or OLED display panels. Due to the typical pixel sizes (10-50 μm), the bonding may be performed at a wafer level scale. In an embodiment, an LED wafer comprises isolated individual LED devices aligned and bonded to the backplane 904, which is compatible with the LED wafer (e.g., 900' or 900") in terms of pixel sizes and pixel pitches. Here, the LED wafer substrate may be removed using various processes, such as laser lift-off or etching. In this embodiment, it is important to isolate the LED devices by dry etching and passivation layers.

Figure 10H:
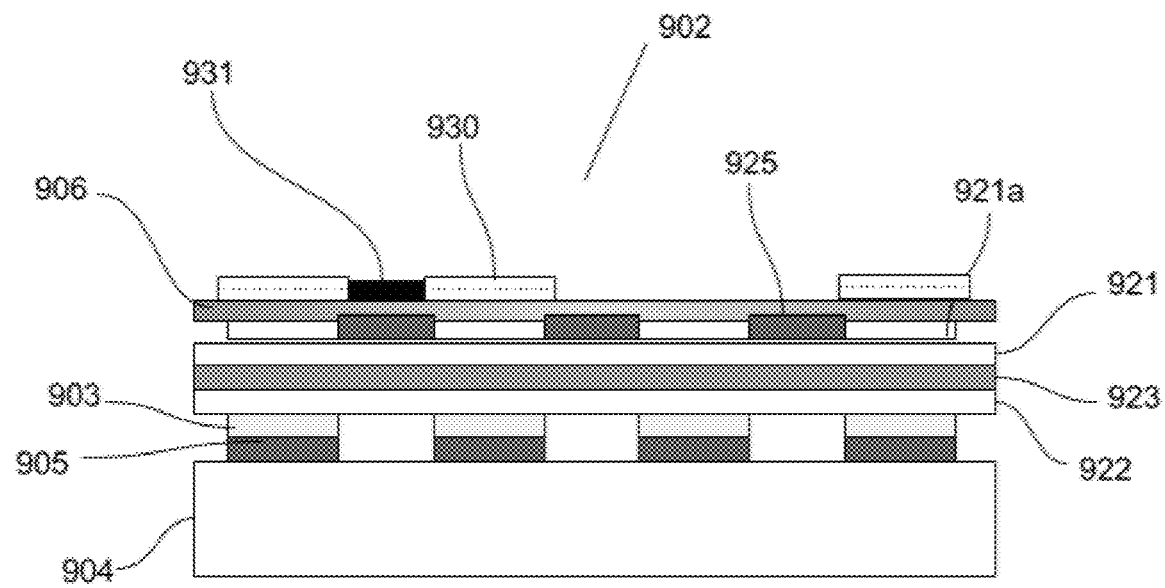
FIG. 10H illustrates a transferred LED wafer including an array of micro devices with a patterned top conductive layer and light management scheme.

In another embodiment, illustrated in FIG. 10H, the original LED wafer is fabricated with the second conductive (e.g., n-type) layer 922 as the top layer. After the second conductive layer 922 is bonded to the backplane 904 using the contacts 903 and the contact pads 905, the original substrate is removed to expose the first contact (e.g., p-layer) 921. The thickness and conductivity of the first conductive (e.g., p-type) layer 921 is manipulated to control the lateral conduction. This may be done by either etching the deposited first conductive (e.g., p-type) layer 921 or by depositing a thinner p-layer to form alternating second conductive layer sections 921a and dielectric layer sections 925 during the LED device layer structure 902 fabrication. For the etching scenario, an accurate thickness control may be achieved using a dry etching process. In addition, the material structure of the first conductive (e.g., p-type) layer 921 may be modified in terms of the layer doping level to form alternating high and low doped second conductive layer sections 921a to increase the layer's lateral resistance. The modifications to the top layer are not limited to the first conductive (e.g., p-type) layer 921 and may be extended to other top layers in an LED device layer structure 902. As a result of this modification, the illumination area may be defined solely by the deposited conductive layer area on top of the p-type film.

To further limit the lateral illumination, the second conductive (e.g., n-type) layer 922 between two adjacent pixels may be fully or partially etched. This process step may be done after the conductive layer deposition in a process such as dry etching, as in FIGS. 9D and 9E. In this case, the contacts 903 in the contact layer may be used as a mask. One important advantage of this scheme is eliminating the wall passivation of pixels which results in a higher number of pixels in a specific area of the wafer, or higher pixels-per-inch (PPI). This may also be translated to fewer process steps and a lower fabrication cost compared to fully isolated LEDs with wall passivation.

Figure 10I:
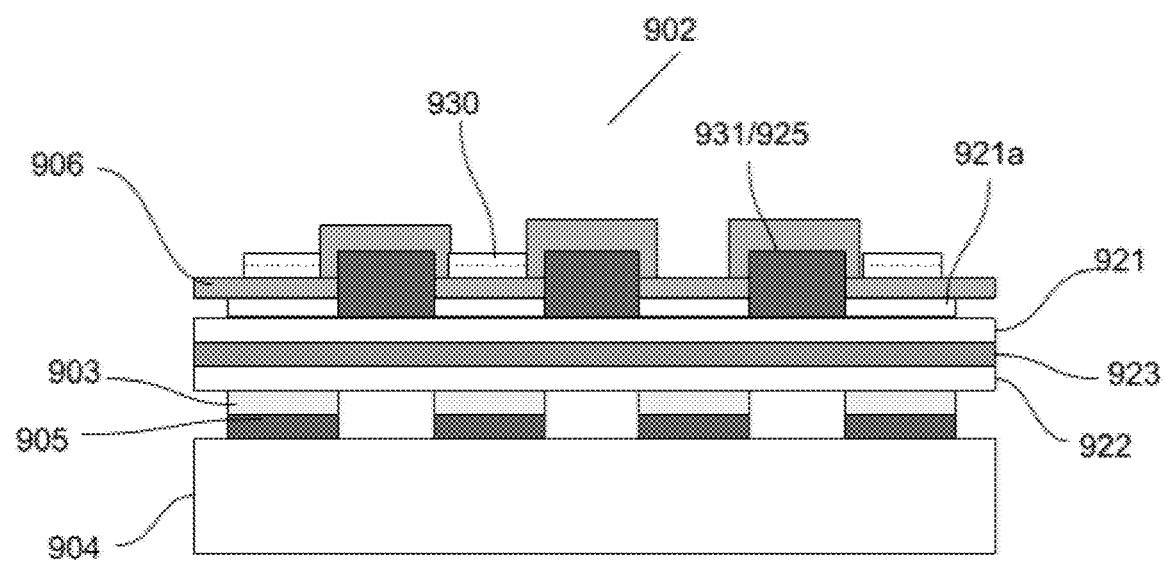
FIG. 10I illustrates a transferred LED wafer including an array of micro devices with a patterned top conductive layer and light management scheme.

FIG. 10H also shows an exemplary embodiment to integrate a color filter or color conversion layers 930 (and/or other optical devices) on top of the top electrode 906. Here, individual color filter sections of the layer 930 may be separated by a bank (dielectric or insulating material) structure 931. The bank structure 931 may be reflective or opaque to ensure that the light remains in the light emitting areas above the contacts 903. The bank structure 931 may extend the dielectric layer 925 that is used to separate second conductive layer sections 921a, as illustrated in FIG. 10I. In the embodiment of FIG. 10I, the top common electrode 906 includes recesses that extend upwardly adjacent to the color filter sections 930, to receive the bank/dielectric structures 931/925 that extend through both the second conductive layer 921 and the color filter section layer 930.

Other layers may be deposited on top of the color conversion and/or color filter layers 930. The structures of FIGS. 10H and 10I may be applied to other embodiments, for example any of FIGS. 9 and 10, in which any one or more of the n-type layer, the buffer layer, and the p-type layer are patterned, thinned, or modulated with material modification techniques. The color conversion layer 930 may be comprised of one or more materials such as phosphors, and nano materials, such as quantum dots. The color conversion layer 930 may blanket or cover selected areas. For a blanket deposition, the bank structure 931 may be eliminated. If the conductivity of the underlying first conductive (e.g., n-type) layer 921 is sufficient that the top common electrode 906 may be eliminated.

Figure 10J:
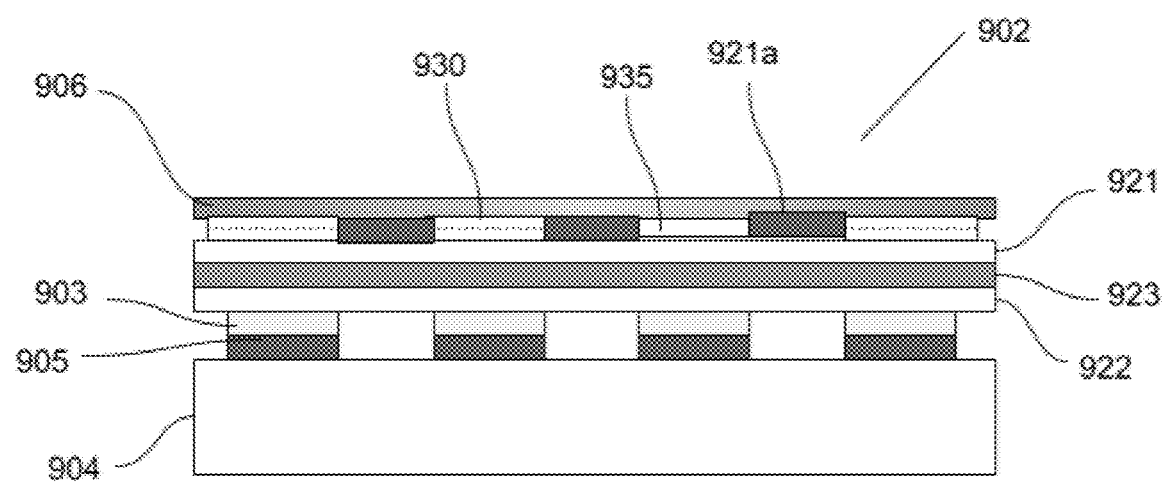
FIG. 10J illustrates a transferred LED wafer including an array of micro devices with a patterned top conductive layer and light management scheme.

With reference to FIG. 10J, the bank structure 931 may be replaced with first conductive layer sections 921a, which extend from the first conductive (e.g., n-type) layer 921. The first conductive (e.g., n-type) layer 921 may act as a common electrode or a common electrode 906 may also be provided. There may be a dielectric layer that separates part of the common electrode layer 906 from the first conductive layer sections 921a to create further pixel isolation. The color conversion layer and/or color filter layers 930 may be deposited on the first conductive layer 921, although some other buffer layers may be used. The color conversion/filter layers 930 may be conductive to enable the top electrode 906 to power the device layer 923, or an additional conductive layer 935 may be included adjacent to or along with the color conversion/filter layers 930. The top electrode 906 may be deposited on top of the color conversion/first conductive layer section 921a layers, if the conductivity of the first conductive layer 921 with the contact structure 902 is not sufficient. The top common contact 906 may be transparent to enable generated light to pass therethrough, reflective to reflect generated light back through the structure 902, or opaque to absorb light and further enhance the pixel isolation.

Figure 10K:
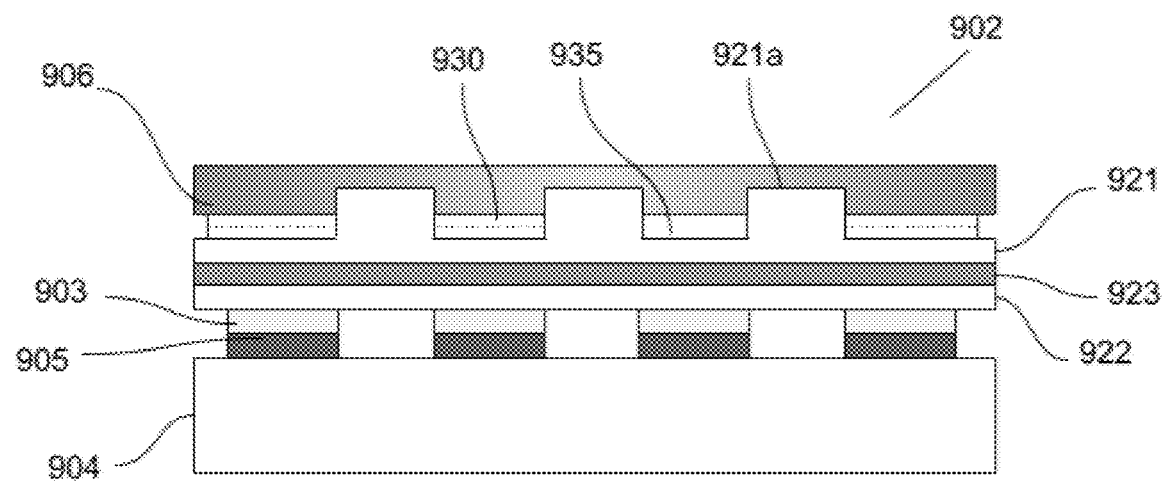
FIG. 10K illustrates a transferred LED wafer including an array of micro devices with a patterned top conductive layer and light management scheme.

In another embodiment, illustrated in FIG. 10K, the first conductive layer 921 may be etched to create pillar sections to form a bank between the color filter sections 930. The top and portions of the sidewalls of the pillar sections may be covered by the top electrode 906, reflective layers, or opaque layers. The valleys in the first conductive layer 921 may be filled with the color conversion and/or color filter layers 930. An additional conductive layer 935 (e.g., transparent) may be deposited only at the bottom of the valleys or all over the area including the sidewalls to define the light emitting area. There may be a top common electrode 906 or other layer deposited over the entire structure 902, with raised sections that extend into the valleys into contact with the additional conductive layer of the color filter layers 930. There may be a dielectric layer that separates part of the common electrode layer 906 from the first conductive layer sections 921a to create further pixel isolation.

Figure 10L:
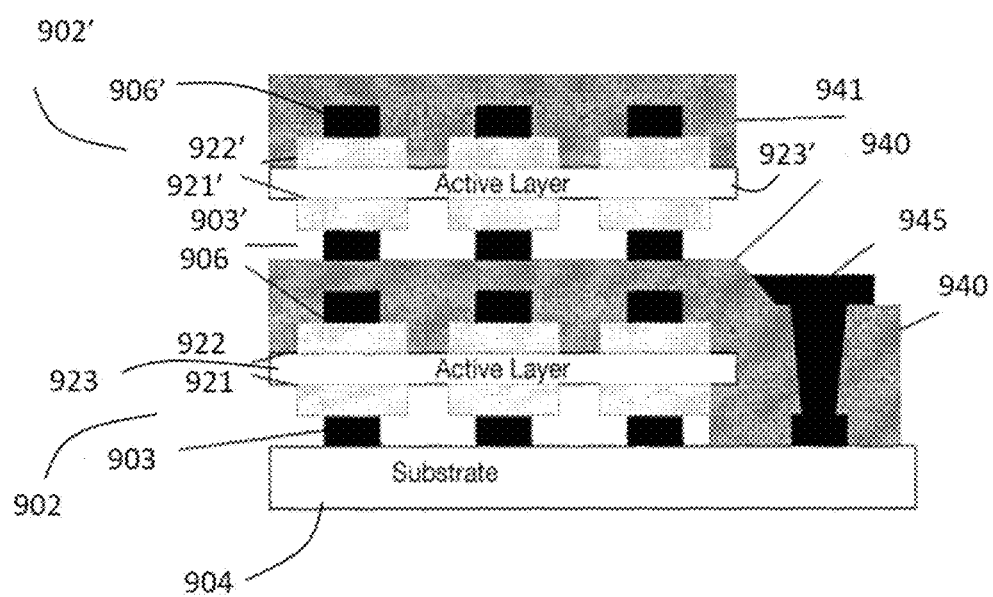
FIG. 10L illustrates stacked devices with isolation methods.

In another embodiment, illustrated in FIG. 10L, a second device layer 902' may be transferred and mounted on top of the first device layer 902. The second device layer 902' includes an additional first conductive layer 921', an additional second conductive layer 922', and an additional active layer 923'. Additional contacts 903' and 906' are also provided to supply power to the illumination areas. The stacked devices 902 and 902' may include a first planarization layer and/or dielectric layer 940 around the first device layer 902 and between the first and second devices 902 and 902', as well as a second planarization and/or dielectric layer 941 around the second device layer 902'. In one embodiment, the surface of the first device layer 902 is planarized first. Then, openings for electrical vias 945 may be opened (e.g., etched) in the first planarization layer 940 to create contact with the backplane 904. The contact (i.e., the vias) 945, may be at an edge or in the middle of the first device layer 902. The second contact layer 903', comprising traces and islands, are then deposited and patterned on top of the first planarization layer 940. Finally, the second device layer 902' is transferred on top of the second contact layer 903'. The process may continue for transferring additional device layers 902. In another embodiment, the top contact 906 of first device layer 902 may be shared with the bottom contact 903' of the second device layer 902'. In this case, the planarization layer 940 between the first and second device layers 902 and 902' may be eliminated.

Figure 11A:
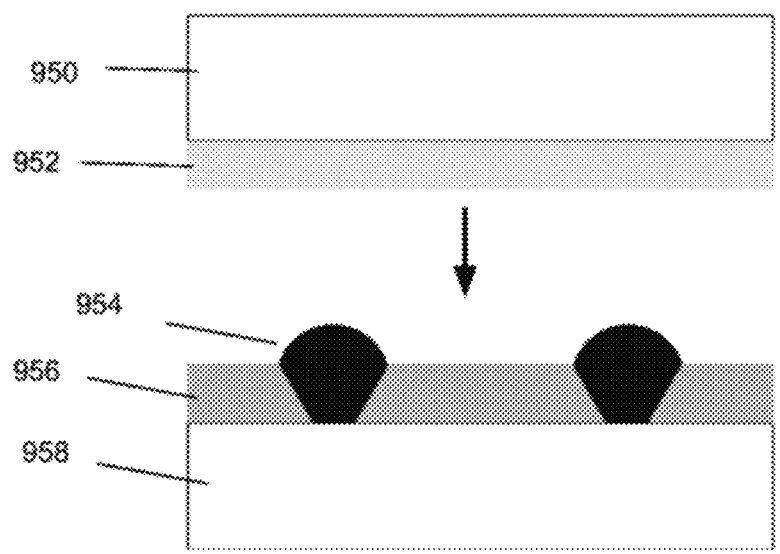
FIGS. 11A and 11B illustrate an integration process of a device substrate and a system substrate.
Figure 11B:
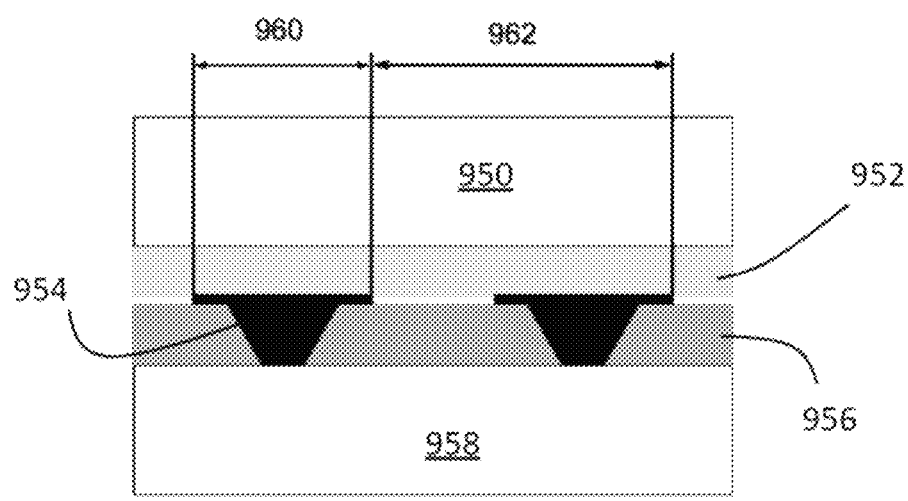

In another embodiment illustrated in FIGS. 11A and 11B, a device layer 952, originally fabricated on a device substrate 950, is mounted on a system substrate 958 using substrate contact pads or bumps 954, which may define the micro device illumination areas. The micro devices in the integrated structure are partially defined by the contact bumps 954 on the system substrate 958. In this embodiment, the device layer 952 may not have any top contact to define the micro device area. The device layer 952 on the substrate 950 is bonded to a system substrate 958 with an array of contact pads or bumps 954 separated by an insulation (e.g., dielectric) layer 956. The bonding may be made between the metallic contact pads 954 and the device layer 952. This bonding process may be performed using any bonding procedure, such as but not limited to heat and/or pressure bonding or laser heating bonding. An advantage of this procedure is eliminating the alignment process during the micro device transfer to the system substrate 958. The micro device size 960 and pitch 962 are partially defined by the size of the contact pad/bump 954. In one example, the device layer 952 may be LED layers on a sapphire substrate 950 and the system substrate 958 may be a display backplane with circuitry required to drive individual micro LEDs that are defined partially by the contact bumps on the backplane.

Figure 12A:
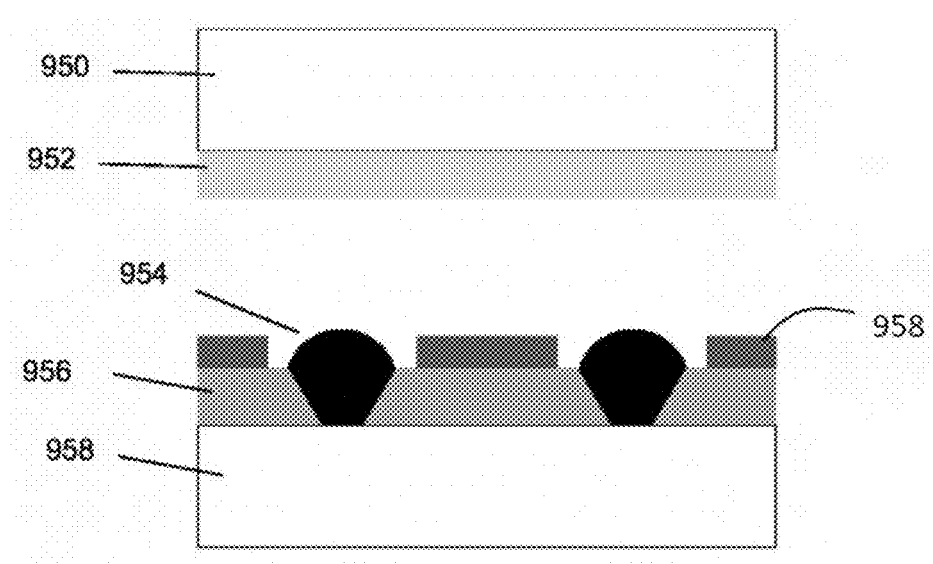
FIGS. 12A to 12D illustrate an integration process of a device substrate and a system substrate.
Figure 12B:
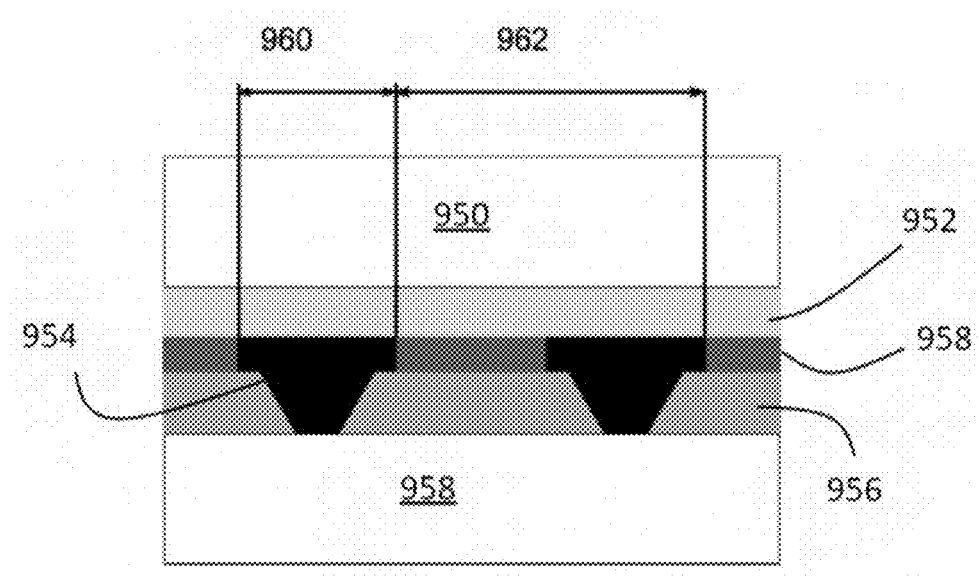

FIGS. 12A and 12B illustrate another integration process of a device substrate 950 and a system substrate 958. The micro devices in the integrated structure are fully defined by the contact bumps 954 on the system substrate 958. To precisely define the micro device size 960 and micro device pitch 962, a bank layer 958 may be deposited and patterned (e.g., etched) onto the system substrate 958. The bank layer 958, which may include openings around each contact pad 954, may fully define the micro device size 960 and micro device pitch 962. In one embodiment, the bank layer 958 may be an adhesive material to fix the device layer 952 to the insulation or dielectric layer 956 (i.e., to the system substrate 958).

Figure 12C:
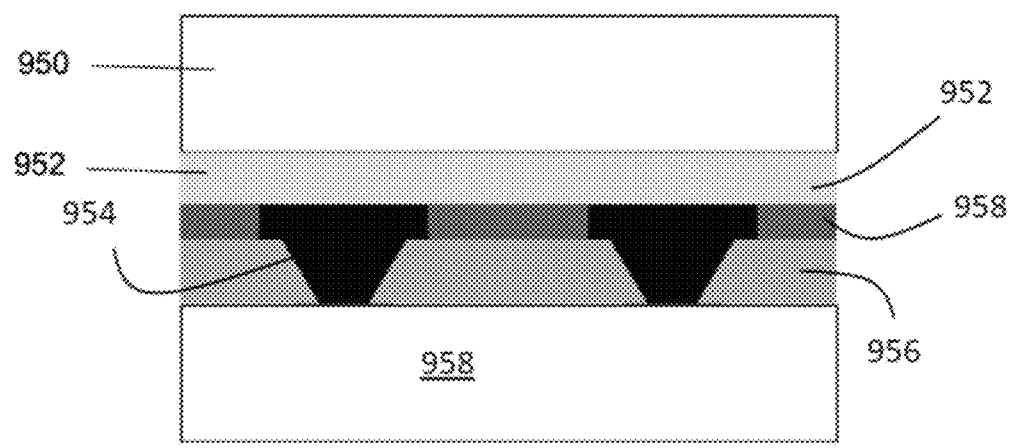
Figure 12D:
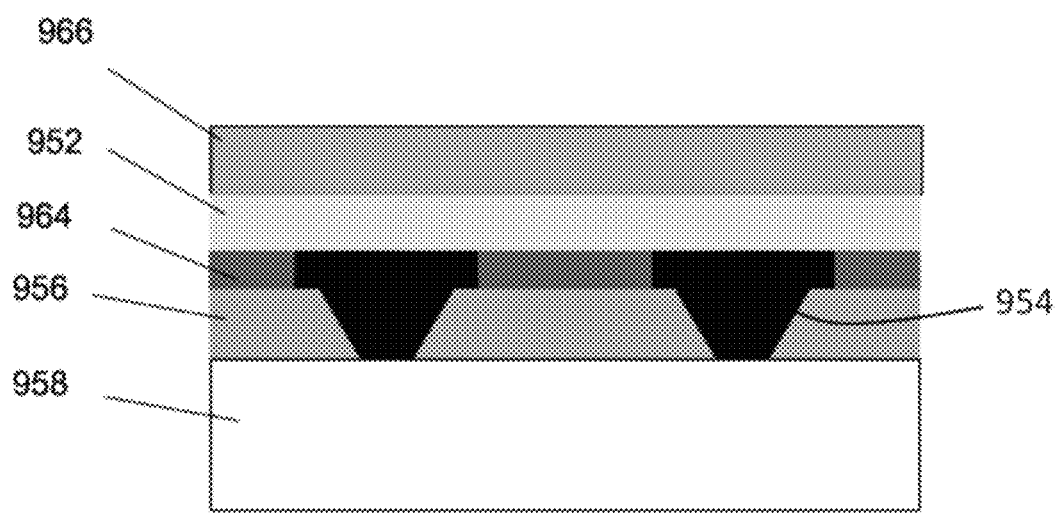

FIG. 12C shows the integrated device substrate 950 transferred and bonded to the system substrate 958, and FIG. 12D shows a common top electrode 966 formed on top of the device layer structure 952. After bonding the micro device substrate 950 to the system substrate 958, the micro device substrate 950 may be removed using various methods, and the common contact 966 may be formed above the integrated structure 952. For optical micro devices, such as but not limited to micro LEDs, the common electrode 966 may be a transparent conductive layer or a reflective conductive layer. The bank structure 964 may be used to eliminate the possibility of a short circuit between adjacent pads 954 after a possible spreading effect due to pressure on the pads 954 during assembly. Other layers, such as color conversion layers, may be deposited after the bonding process.

Figure 13A:
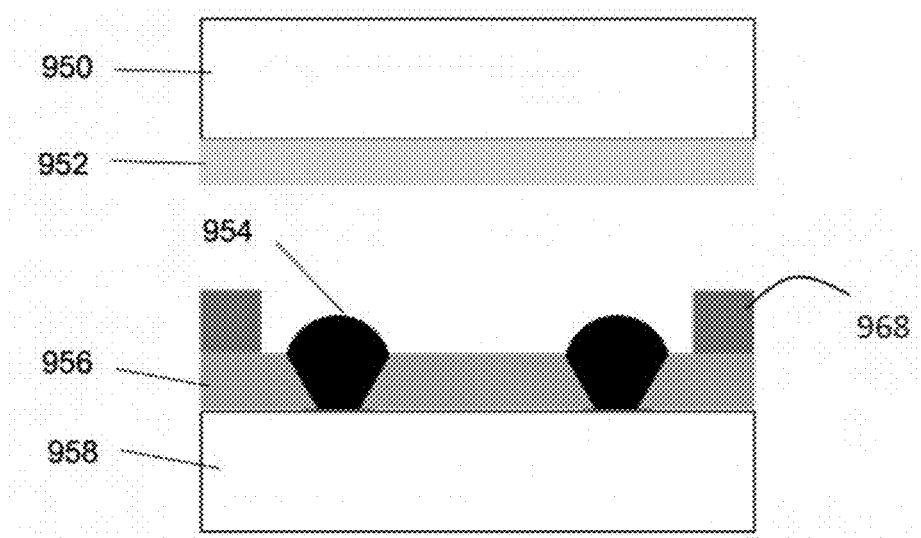
FIGS. 13A and 13B illustrate an integration process of a device substrate and a system substrate.
Figure 13B:
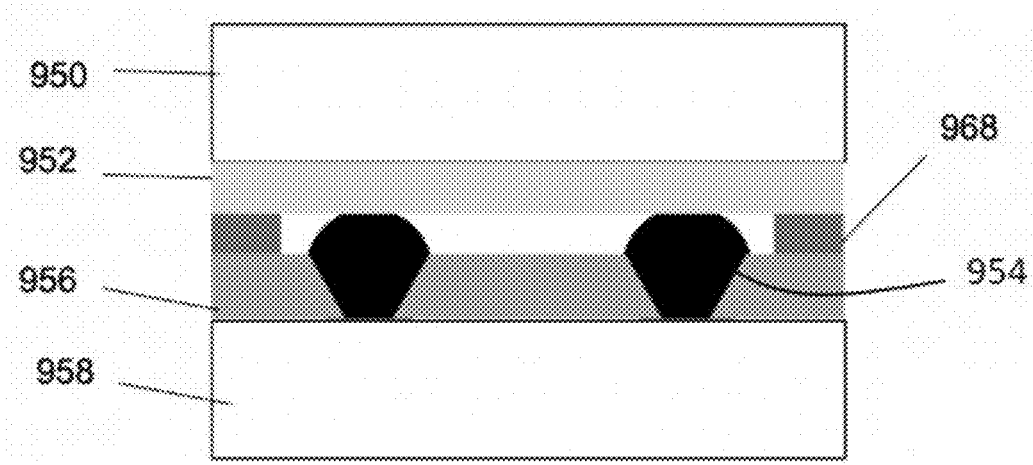

FIGS. 13A and 13B illustrate another embodiment of an integrated structure in which a device layer 952 is mounted on a system substrate 958 using one or a plurality of bonding elements 968 at the edge of the backplane 958. In this embodiment, adhesive bonding elements 968 may be used at the edge of the backplane 958 to bond the device layer 952 to the system substrate 958 or to the insulation layer 956 of the device layer 952. In one embodiment, the bonding elements 968 may be used to temporarily hold the device layer 952 to the system substrate 952 for the bonding process of contact pads 954 to the device layer 952. In another embodiment, the bonding elements 968 permanently attach the micro device layer 952 to the system substrate 958.

Figure 14A:
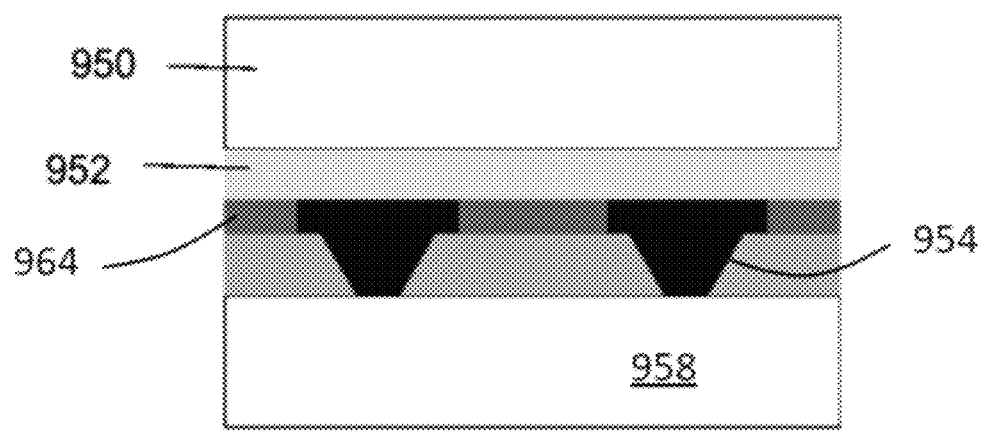
FIGS. 14A to 14C illustrate an integration process of a device substrate and a system substrate.
Figure 14B:
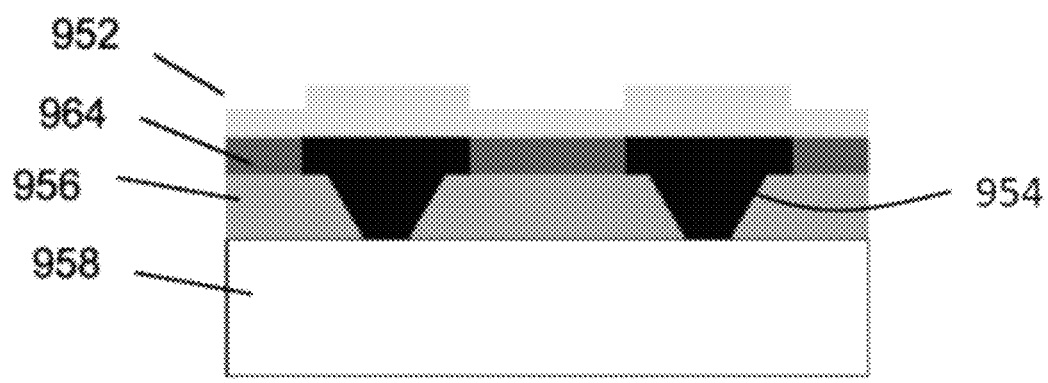
Figure 14C:
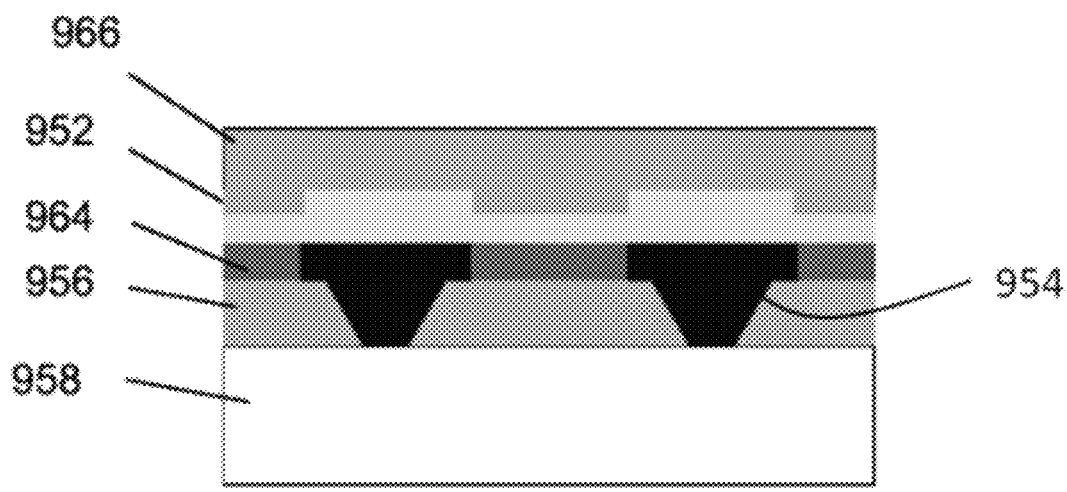

FIGS. 14A to 14C illustrate another embodiment of an integration process of the device substrate 950 and the system substrate 958 with a post bonding patterning of the device layer 952 and the common electrode 966. In this embodiment, the device layer 952 may be patterned to include raised contact sections (e.g., 1.5×-3.0× the thickness of the remainder of the conductive layer) over the contact pads 954, after being transferred to the system substrate 958. The patterning 970 may be designed and implemented to isolate micro devices electrically and/or optically. After patterning the device layer 952, the common top electrode 966 may be deposited on the device layer 952 formed around and on top of the raised contact sections. For optical devices, such as LEDs, the common electrode 966 may be a transparent conductive layer or a reflective conductive layer.

Figure 15A:
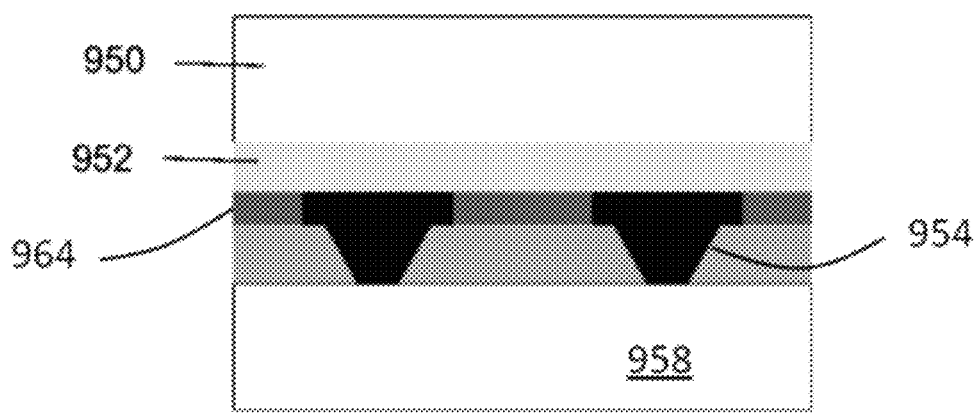
FIGS. 15A to 15C illustrate an integration process of a device substrate and a system substrate.
Figure 15B:
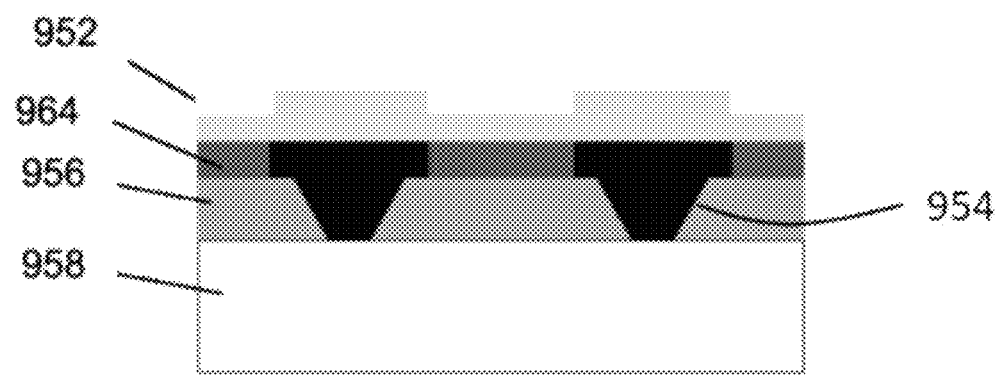
Figure 15C:
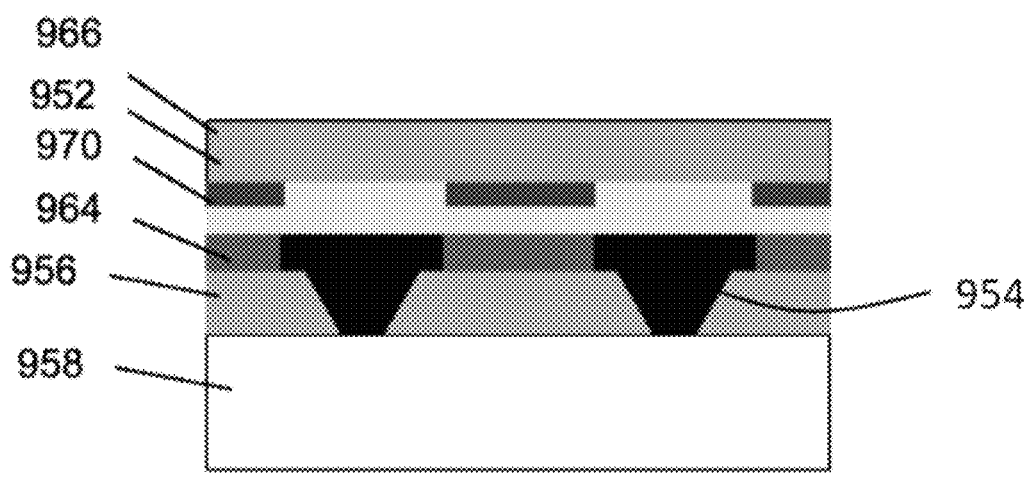

FIGS. 15A to 15C illustrate an alternative embodiment of an integration process for the device substrate 950 and system substrate 958 with a post bonding patterning step, optical element, and common electrode 966 formation. As illustrated, after transferring and patterning the device layer 952, similar to FIGS. 14A to 14C, additional layers 970 may be deposited and/or formed between isolated micro devices to enhance the performance of micro devices. In one example, the elements 970 may passivate the sidewalls of the isolated micro devices to help to vertical out coupling of light in the case of optical micro devices, such as but not limited to micro LEDs.

In the embodiments illustrated in FIGS. 8 to 10 and all other related embodiments, a black matrix or reflective layer may be deposited between the pads (703, 712, 954, 908) to increase the light output. A reflective layer or black matrix may be part of the electrode.

In the presently explained methods, a protective layer may be finally formed on top of the integrated structure to act as a barrier and scratch resistance layer. Also, an opaque layer may be deposited after the micro device and patterned to form the pixel. This layer may sit anywhere in the stack. The opening allows light to pass through only the pixel array and reduces the interference.

The micro devices as described herein may be developed, for example, by etching a wafer and forming mesa structures. Mesa formation may be done using a dry or wet etching technique. Reactive ion etching (ME), inductively coupled plasma (ICP)-RIE and chemical assisted ion beam etching (CAME) may be employed for dry etching the wafer substrate. Chlorine-based gases such as $Cl_2$, $BCl_3$, or $SiCl_4$ may be used to etch the wafer. Carrier gases including but not limited to Ar, $O_2$, Ne, and $N_2$ may be introduced into the reactor chamber to increase the degree of anisotropic etching and sidewall passivation.

Figure 16A:
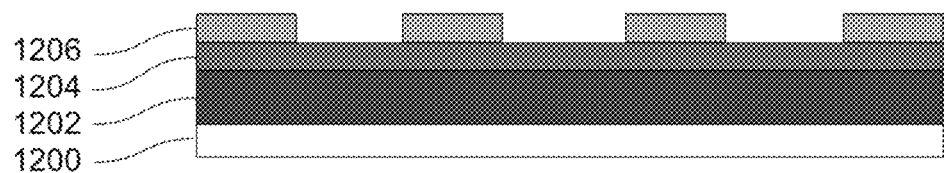
FIG. 16A illustrates a device with dielectric layer deposition on the wafer surface.
Figure 16B:
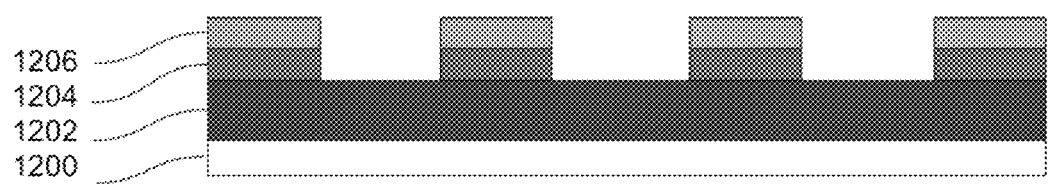
FIG. 16B illustrates a device with a dielectric layer etched to create an opening on the layer for subsequent wafer etching.
Figure 16C:
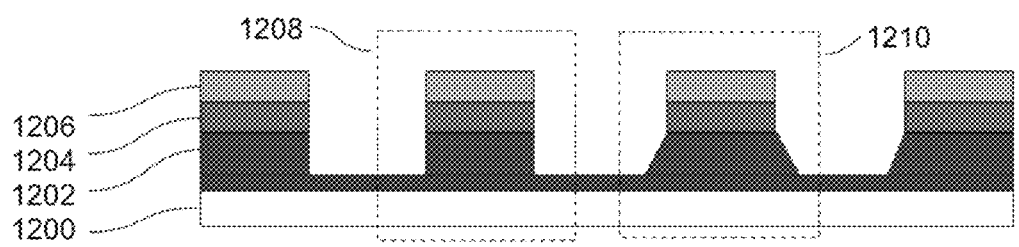
FIG. 16C illustrates mesa structures after a wafer substrate etching step.
Figure 17:
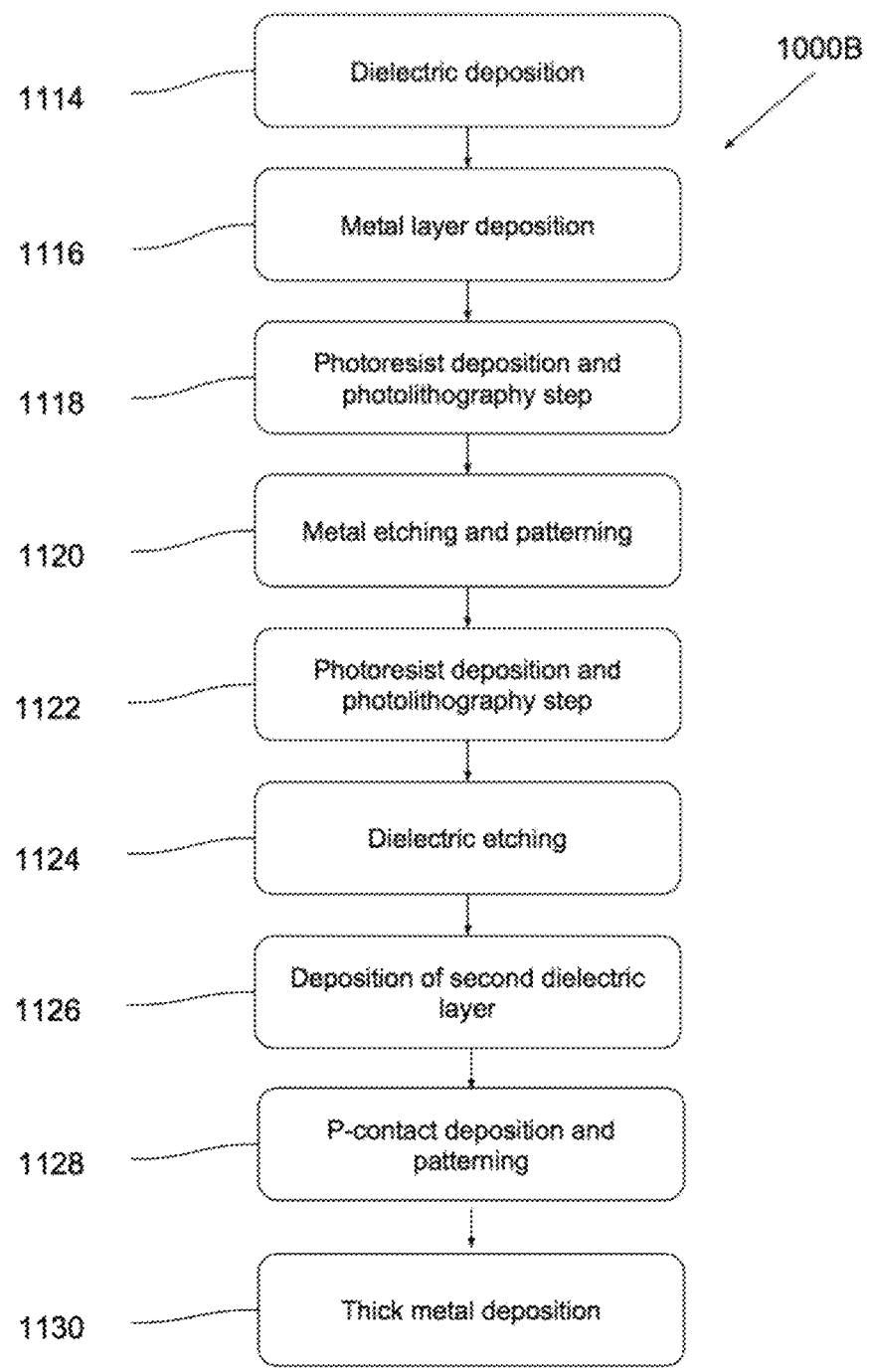
FIG. 17 illustrates a process flow chart for forming an MIS structure.

With reference to FIGS. 16A to 16C, a device structure 1100 includes a device layer 1202 deposited on a wafer surface 1200. Following the wafer cleaning step, a hard mask 1206 is formed on the device layer 1202. In an embodiment, a dielectric layer 1204, such as $SiO_2$ or $Si_3N_4$, is formed on the device layer 1202 using appropriate deposition techniques, such as plasma-enhanced chemical vapour deposition (PECVD). The hard mask photoresist 1206 is then applied on the dielectric layer 1204. In the photolithography step, a desired pattern is formed on the photoresist layer 1206. For example, PMMA (Poly(methyl methacrylate)) may be formed on the dielectric layer 1202 followed by a direct e-beam lithography technique to form the openings in the PMMA 1206.

FIG. 16B illustrates the device structure 1100 with the dielectric layer 1204 etched to create openings on the device layer 1202 for subsequent wafer etching. A dry etch method with fluorine chemistry may be employed to selectively etch the dielectric layer 1204. Carrier gases, including but not limited to $N_2$, Ar, or $O_2$, may be introduced to control the degree of anisotropic etching. Gas flow rate and mixture ratio, type of carrier gases, RF and DC powers, as well as substrate temperature may be adjusted to achieve the desired etching rate and high degree of anisotropy.

FIG. 16C illustrates mesa structures 1208 and 1210 after the wafer device layer 1202 etching step. In one embodiment, mesa structures 1208 with straight sidewalls (e.g., perpendicular to the upper surface of the substrate 1200) may be formed. In another embodiment, mesa structures 1210 with sloped side walls (e.g., forming an acute angle with the upper surface of the substrate 1200) may be formed. The gas mixture ratio, type of gases in the reactor, and relevant etching conditions may be adjusted in order to modify the slope of the sidewalls. Depending on the desired mesa structure 1208 and 1210, a straight, positive, or negative slope sidewall may be formed. In an embodiment, sidewall passivation during the etching step may be used to create a desired sidewall profile. In addition, a cleaning step may be used to remove the passivation layer or the native oxide from the sidewall. Cleaning may be done using acetone or isopropyl alcohol followed by surface treatment using $(NH_4)_2$ and/or $NH_4OH$.

Figure 18A:
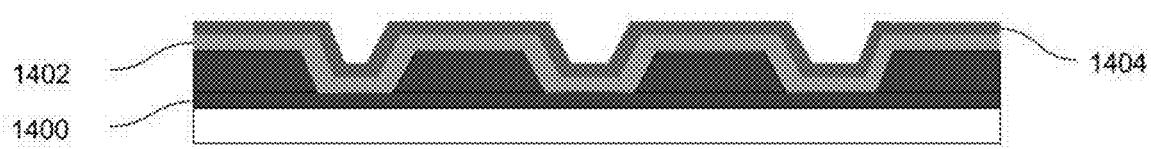
FIG. 18A illustrates a dielectric and metal layer deposited on a mesa structure to form an MIS structure.
Figure 18B:
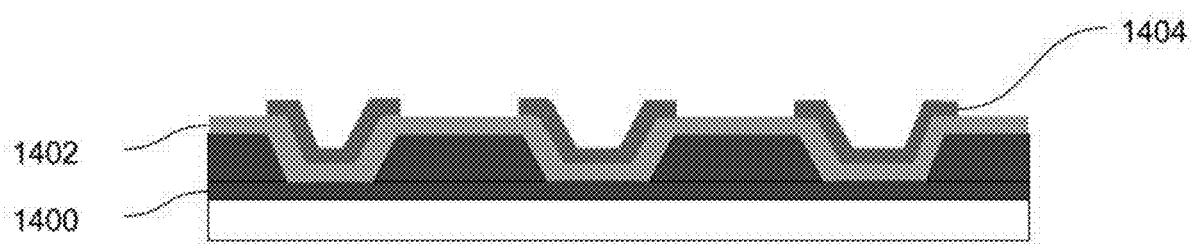
FIG. 18B illustrates a wafer with a pattern formed using a photolithography step.
Figure 18C:
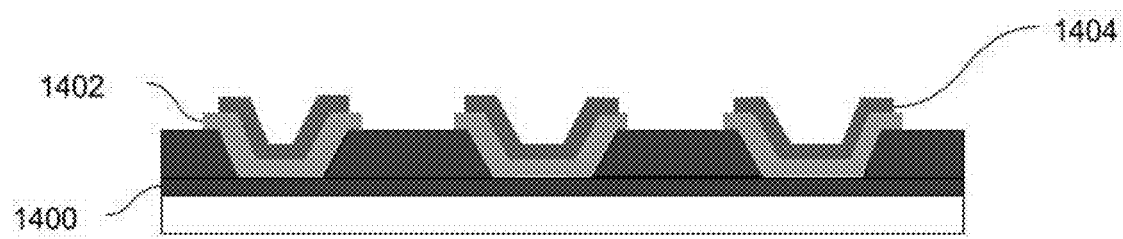
FIG. 18C illustrates a wafer with a dielectric layer dry-etched using fluorine chemistry.
Figure 18D:
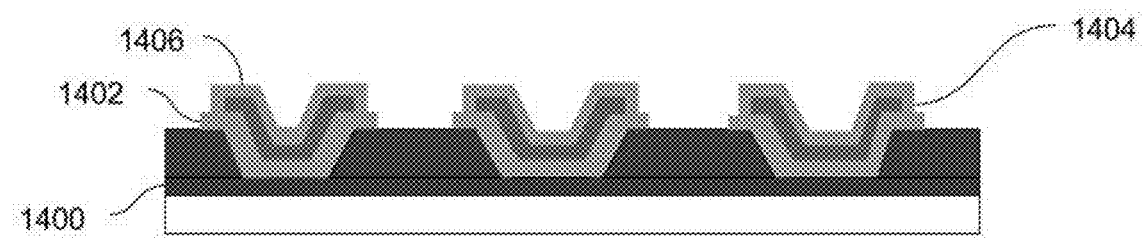
FIG. 18D illustrates a wafer with a second dielectric layer.
Figure 18E:
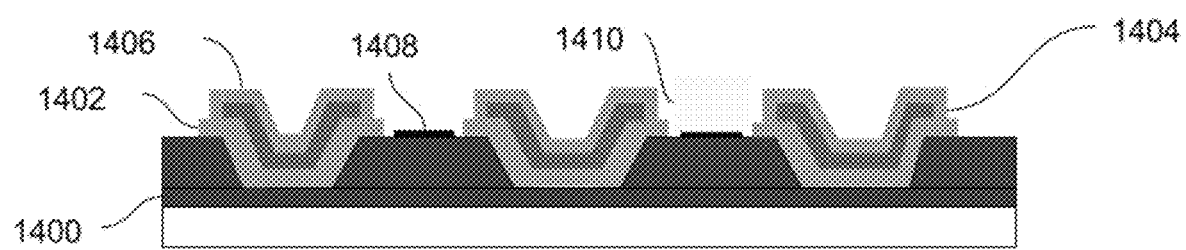
FIG. 18E illustrates a wafer with an ohmic contact.

In an embodiment, an MIS structure may be formed after the mesa structure formation of FIGS. 16A to 16C. With reference to FIGS. 17 and 18A to 18D, a process flow 1000B to form an MIS structure includes process steps 1114 and 1116, in which dielectric and metal layers 1402 and 1404 are deposited on mesa structures (e.g., 1208 and 1210) to form MIS structures. Following the deposition of the dielectric layer 1402, in process 1116, a metal film 1404 is deposited on the dielectric layer 1402 using a variety of methods, such as thermal evaporation, e-beam deposition, and sputtering (FIG. 18A). In process step 1118, a desired pattern is formed on the wafer using a photolithography step. In step 1120, the metal layer 1404 is etched using dry or wet etching to form an opening on the top side of the mesa structure above the dielectric layer 1402 (FIG. 18B). In step 1122, a photolithography step may be used to define the dielectric etch area. In another embodiment, the etched metal layer 1404 may be used as a mask to etch the dielectric layer 1402 (FIG. 18C). In step 1126, a second dielectric layer 1406 may be deposited on the metal interlayer 1404 (FIG. 18D). In step 1128, an ohmic (e.g., p-type) contact 1408 may be deposited on the micro device mesa structures 1208 and 1210, as shown in FIG. 18E. In process step 1130, a thick metal 1410 is deposited on the contact 1408 for subsequent bonding of the mesa structures 1208 and 1210 to a temporary substrate in wafer lift-off process steps from the native substrate.

FIG. 18A shows the dielectric layer 1402 and the metal layer 1404 deposited on the mesa structure to form an MIS structure. A variety of dielectric layers 1402 may be used, which include but are not limited to $Si_3N_4$ and oxides such as $SiO_2$, $HfO_2$, $Al_2O_3$, $SrTiO_3$, Al-doped $TiO_2$, $LaLuO_3$, $SrRuO_3$, HfAlO, and $HfriO_x$. The thickness of the dielectric layer 1402 may be a few nanometers or up to a micrometer. A variety of methods, such as CVD, PVD, or e-beam deposition, may be used to deposit the dielectric layer 1402. In an embodiment, a high-k oxide dielectric layer 1402 may be deposited using an atomic layer deposition (ALD) method. ALD enables very thin and high-K dielectric layers to be formed on the wafer. During ALD deposition of the dielectric oxide layer, precursors are introduced in the reaction chamber sequentially to form a thin insulator layer. Metal precursors for the metal layer 1404 include halides, alkyls and alkoxides, and beta-diketonates. Oxygen gas may be provided using water, ozone, or $O_2$. Depending on the process chemistry, dielectric film deposition may be done at room temperature or at an elevated temperature. Deposition of $Al_2O_3$ may also be done using trimethylaluminum (TMA) and water precursors. For $HfO_2$ ALD deposition, both $HfCl_4$ and $H_2O$ precursors may be used. Metal electrodes 1410 serve as biasing contacts for electric field modulation in the device. Metal contacts 1408 include but are not limited to Ti, Cr, Al, Ni, Au, or a metal stack layer.

FIG. 18B shows the wafer with a pattern formed using a photolithography step. FIG. 18C illustrates the wafer with a dry-etched dielectric layer 1402 dry-etched (e.g., using fluorine chemistry). An etch stop for etching the dielectric layer 1402 may be the top surface of the mesa structure 1208 and 1210. As illustrated in FIG. 18D, the second dielectric layer 1406 may be deposited on the metal interlayer 1404 for subsequent p-contact deposition in order to prevent shorting with the device functional electrodes 1408 and 1410. Subsequently, the second dielectric layer 1406 on top of the mesa structure may be etched to create an opening on the top surface of the mesa structures.

With reference to FIG. 18E, the ohmic (e.g., p-type) contact 1408 may then be deposited on the mesa structure to enable power from external electrical power sources to be input to the micro devices. The contact 1408 may be deposited using thermal evaporation, sputtering, or e-beam evaporation. Au alloys such as Au/Zn/Au, AuBe, Ti/Pt/Au, Pd/Pt/Au/Pd, Zn/Pd/Pt/Au, or Pd/Zn/Pd/Au may also be used for the contact 1408. The subsequent patterning step removes metal from unwanted areas allowing the contact 1408 to be formed only on the top surface of the mesa structures. A thick metal 1410 may be deposited on the contact 1408 to subsequently bond the mesa structures to the temporary substrate during the wafer lift-off process steps from the native substrate.

The scope of this invention is not limited to LEDs. One can use these methods to define the active area of any vertical device. Different methods, such as laser lift-off (LLO), lapping, or wet/dry etching may be used to transfer micro devices from one substrate to another. Micro devices may be first transferred to another substrate from a growth substrate and then transferred to the system substrate. The present devices are further not limited to any particular substrate. Mentioned methods may be applied on either the n-type or p-type layer. For the example LED structures above, n-type and p-type layer positions should not limit the scope of the invention.

Figure 19:
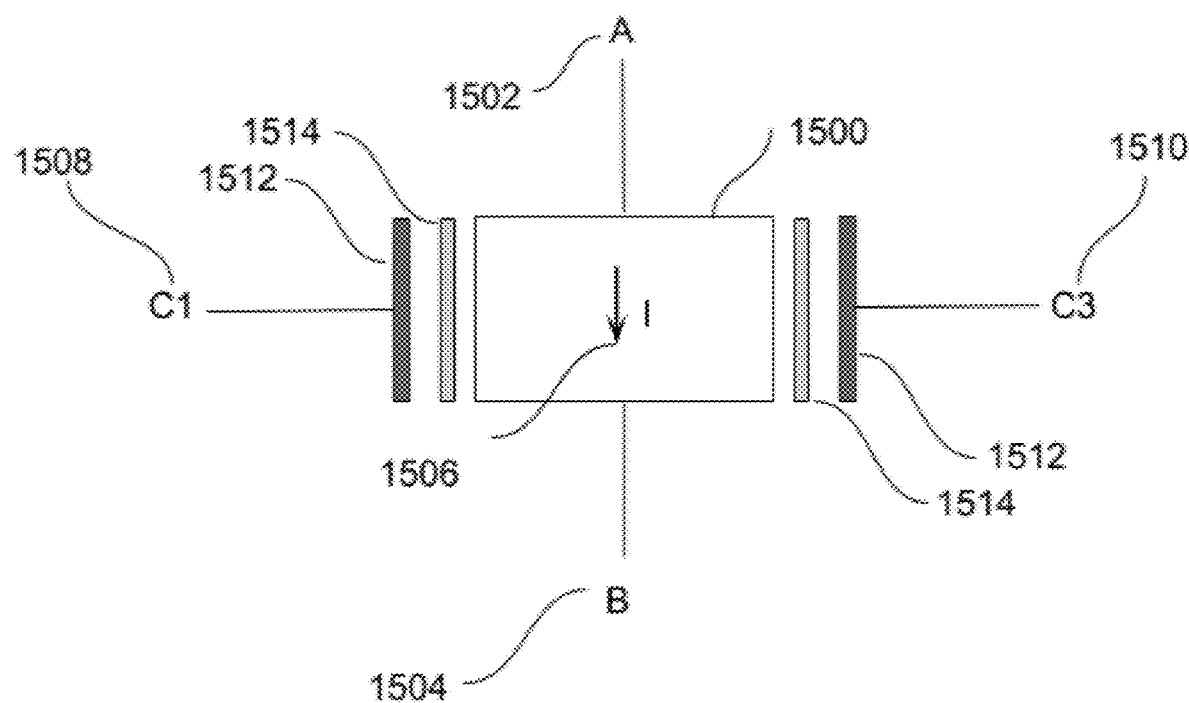
FIG. 19 illustrates a schematic diagram of a floating gate for biasing the walls of a semiconductor device.

Although an MIS structure was disclosed in this document as the method to manipulate the electric field in the micro device to manipulate the vertical current flow, one can implement other structures and methods for this purpose. In an embodiment, electric field modulation may be done using a floating gate as a charge storage layer or conductive layer. FIG. 19 shows an exemplary embodiment of a micro device 1500 with a floating gate structure. The structure comprises a floating gate 1514 that may be charged with different methods to bias the MIS structure. One method is using a light source. Another method is using a control gate 1512 that is isolated with a dielectric layer 1516 from the floating gate 1514. The biasing control gate 1512 enables charges to be stored in the floating gate 1514. Stored charges in the floating gate 1514 manipulate the electric field in the device. When the micro device 1500 is biased through the functional electrodes 1502 and 1504, the current flows vertically which results in the generation of light. The manipulated electric field in the micro device 1500 limits lateral current flow, resulting in enhanced light generation.

Figure 20:
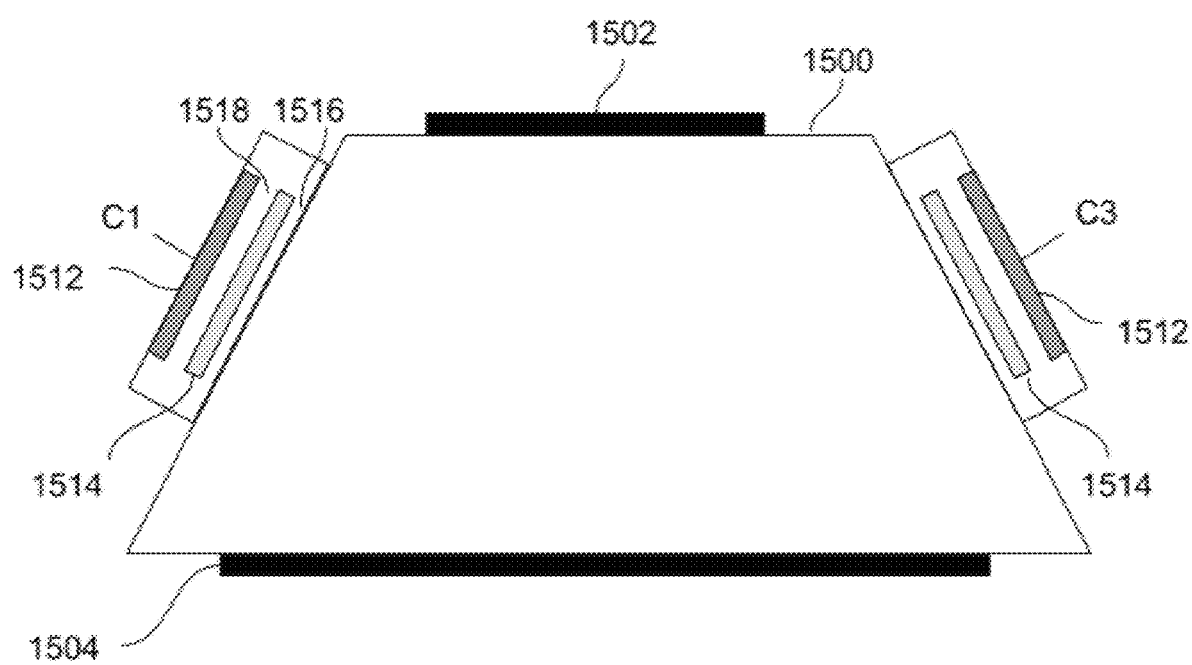
FIG. 20 illustrates a semiconductor device including a floating gate for biasing the walls of the semiconductor device.

FIG. 20 illustrates a schematic structure of the micro device 1500 with a floating gate charge storage layer 1514. The illustrated micro device 1500 includes angled sidewalls as an example, but the micro device 1500 may include different (e.g., vertically, negatively, and positively) angled sidewall. First, a thin dielectric layer 1516 is formed on the micro device 1500. The thickness of dielectric layer 1516 may be between 5 nm to 10 nm to enable quantum mechanical tunneling of charges through the dielectric layer 1516. Oxide or nitride based dielectric materials may be used to form the thin dielectric layer 1516, including but not limited to $HfO_2$, $Al_2O_3$, $SiO_2$, and $Si_3N_4$. The floating gate 1514 may be formed on the thin dielectric layer 1516. The floating gate 1514 may be formed from thin polysilicon or a metal layer as a charge storage layer. In another embodiment, the floating gate 1514 may be replaced with dielectric material to form a charge trapping layer. The dielectric in the floating gate 1514 may be the same as the thin dielectric 1516 or a different layer. The dielectric layer of the floating gate 1514 may be charged by different techniques such as implantation. The dielectric materials include but are not limited to $HfO_2$, $Al_2O_3$, HfAlO, $Ta_2O_5$, $Y_2O_3$, $SiO_2$, $Tb_2O_3$, $SrTiO_3$, and $Si_3N_4$ or a combination of different dielectric materials to form a stack of layers that may be used for the charge trapping layer. In another embodiment, semiconductor or metal nanocrystals, or graphene may be used as the charge trapping layer. Nanocrystals including but not limited to Au, Pt, W, Ag, Co, Ni, Al, Mo, Si, and Ge may be used for charging trap sites. The nanocrystals create isolated trap sites. This in turn reduces the chance of charge leakage due to the presence of defects on the thin dielectric layer 1516.

In addition, if charges leak from one nanocrystal, it will not affect the adjacent sites as they are isolated from each other. On top of the floating gate or charge trapping layer 1514, a second, thick dielectric layer 1518 isolates the floating gate 1514 in order to prevent charge leakage. The second dielectric layer 1518 may be made of various dielectric materials, including but not limited to $HfO_2$, $Al_2O_3$, HfAlO, $Ta_2O_5$, $Y_2O_3$, $SiO_2$, $Tb_2O_3$, or $SrTiO_3$ with a thickness of 10 nm to 90 nm. On top of the second dielectric layer 1518, a control gate 1512 is provided, which is responsible for floating gate 1514 charging. The control gate 1512 may be comprised of one or more conductive layers, such as metal, transparent conductive oxides, or polymers.

Figure 21:
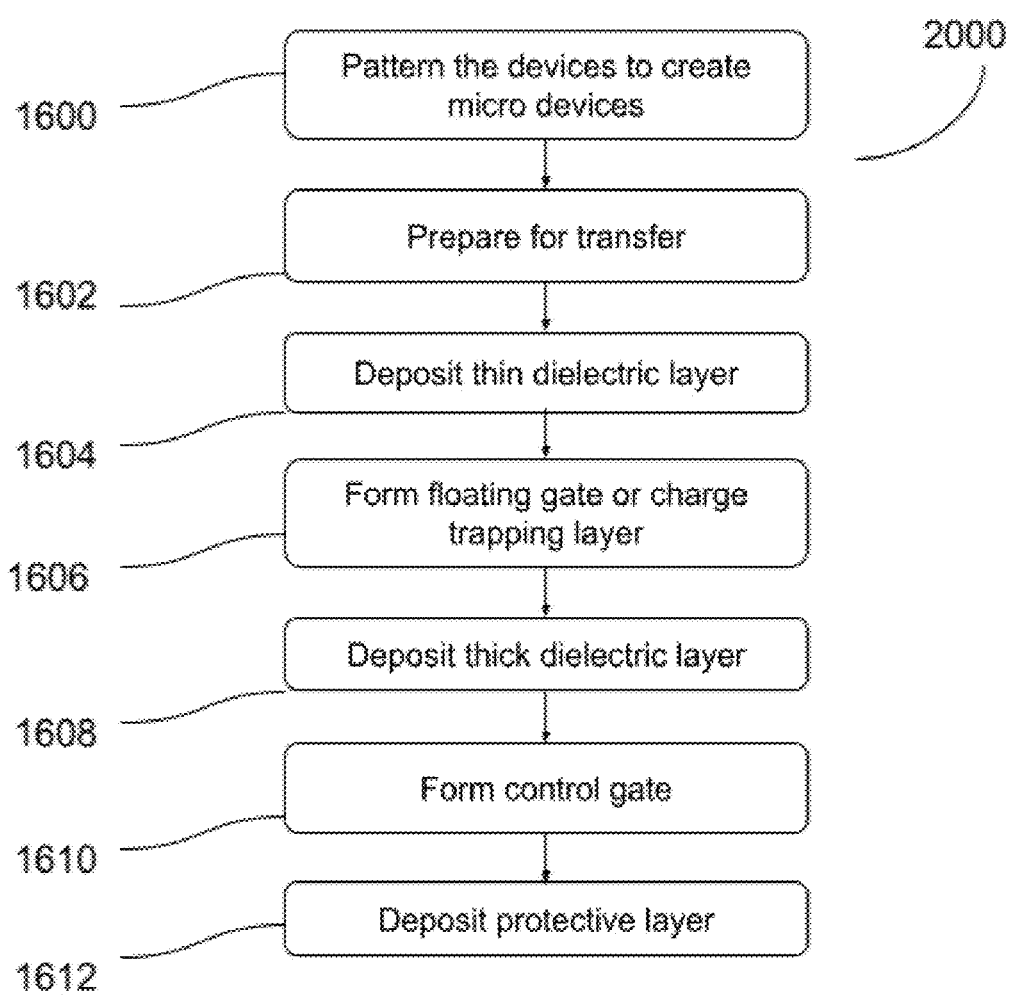
FIG. 21 illustrates an exemplary flowchart of developing a floating gate.

With reference to FIG. 21, a process flow 2000 to develop a floating gate structure on the sidewalls of a micro device 1500 includes a first step 1600 to form the micro devices 1500 (e.g., as in any of the methods hereinbefore described). During step 1600, either the micro devices 1500 are formed by patterning or by selective growth. During step 1602 the devices 1500 are transferred to a temporary or system substrate. During step 1604, the thin dielectric layer 1516 is formed on the micro device 1500. In step 1606, the floating gate or charge trapping layer 1514 is formed on the thin dielectric layer 1516. During step 1608, the second, thick isolation dielectric layer 1518 is formed on the floating gate 1514. In step 1610, the control gate 1512 is formed on the thick dielectric layer 1518. In step 1612, a protective layer is formed on the structure. The order of these steps in these processes may be changed without affecting the final results. Also, each step may be a combination of a few smaller steps. For example, the structure may be formed before transferring the micro device 1500 from the donor substrate to the acceptor substrate. In another embodiment, parts of the floating gate structure may be formed before the micro device transfer process and the floating gate structure may be completed after the transfer step. In another embodiment, the entire floating gate structure may be formed after the micro device transfer step.

Accordingly, a process of forming a micro device with a floating gate or charge trapping structure, comprises: forming the micro devices including a functional electrode; and forming a first dielectric layer or a change trapping layer on a first sidewall of the micro device.

In addition, the process may include forming a floating gate layer or a charge trapping layer on the first dielectric layer.

In addition, the process may include forming a second dielectric layer on the floating gate or charge trapping layer.

In addition, the process may include forming a control gate on the second dielectric layer.

An alternative embodiment of this process, wherein the first dielectric layer may be between 5 nm to 10 nm thick to enable quantum mechanical tunneling of charges therethrough.

An alternative embodiment of the process, wherein the second dielectric layer may be between 10 and 90 nm thick to isolate the floating gate in order to prevent charge leakage.

An alternative embodiment of the process, wherein the floating gate may be comprised of polysilicon or a metal layer as a charge storage layer.

An alternative embodiment of the process, wherein the charge trapping layer comprises semiconductor nanocrystals, metal nanocrystals, or graphene.

An alternative embodiment of the process, wherein the nanocrystals may be selected from the group consisting of Au, Pt, W, Ag, Co, Ni, Al, Si, and Ge.

An alternative embodiment of the process, further comprising biasing the control gate and the functional electrodes to generate an electric field to enable charges to be injected from a charge transport layer in the micro device into the floating gate through the thin dielectric layer.

An alternative embodiment of the process, wherein the charge injection comprises Fowler-Nordheim tunneling or a hot electron injection mechanism.

An alternative embodiment of the process, wherein the charge injection may be conducted by photoexcitation of the charge transport layer.

An alternative embodiment of the process, wherein the charge injection comprises exposing the micro device to ultraviolet light resulting in high energetic charges that overcome a potential barrier between the charge transport layer and the first dielectric layer.

An alternative embodiment of the process, wherein the floating gate or charge trap layer comprises a combination of two different dielectric layers.

In an alternate embodiment, a first electrode contact extends from a bottom contact layer of the micro device on one side of the micro device; a second electrode contact extends upwardly from a top contact layer of the micro device; and a third electrode contact extends upwardly from the floating gate on another side of the micro device.

In an alternate embodiment, the first and third electrode contacts extend upwardly from a same side of the micro device.

In an alternate embodiment, the first and third electrode contacts extend upwardly from an opposite side of the micro device.

In an alternate embodiment, the first and second electrode contacts extend outwardly from opposite top and bottom surfaces of the micro device.

Accordingly, another process of forming a micro device with a floating gate or charge trapping structure comprises:
forming the micro devices including a functional electrode; and
forming a first dielectric layer or a charge trapping layer on a first sidewall of the micro device.

In addition, the process may include charging the first dielectric layer.

The process may include forming a second dielectric layer on the charged first dielectric layer.

An alternative embodiment of the process, wherein the step of charging the first dielectric layer comprises ion bombardment to create fixed unneutralized charges on a surface of the first dielectric layer.

An alternative embodiment of the process, wherein the ions are selected from the group consisting of Ba, Sr, I, Br, and Cl.

An alternative embodiment of the process, further comprising implanting semiconductor ions in the first semiconductor layer to form a charge trap layer.

An alternative embodiment of the process, wherein the semiconductor ions may be selected from the group consisting of Si+ and Ge+.

An alternative embodiment of the process, further comprising annealing the first dielectric layer to cure stress on the dielectric layer after ion bombardment, and also enable diffusion of ions into the first dielectric layer.

Accordingly, another process of forming a micro device with enhanced sidewalls comprises forming the micro devices including a functional electrode; and creating an intrinsic charges interface at the sidewalls by depositing semiconductor layers on a first sidewall with a different band diagram compared to the sidewalls.

Figure 22:
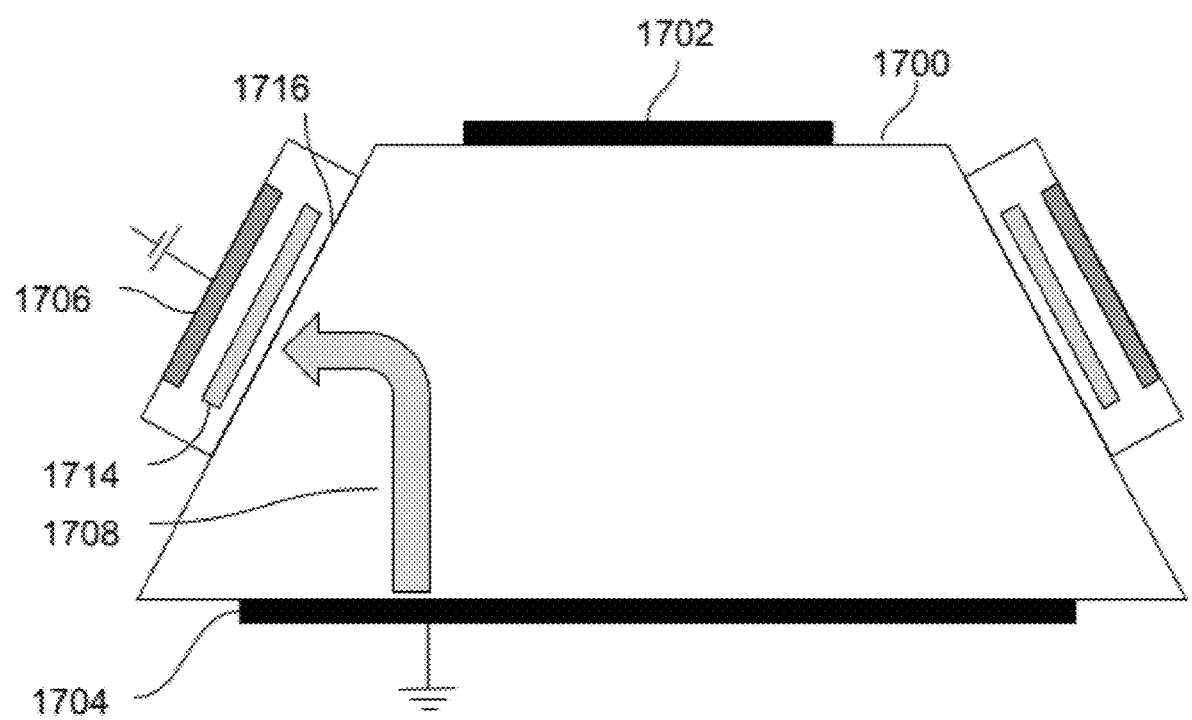
FIG. 22 illustrates a semiconductor device and a method of charging the floating gate.

Referring to FIG. 22, a floating gate or charge trapping layer 1714 may be charged by employing a variety of methods. In one embodiment, a control gate 1706 and one of the functional electrodes 1702 or 1704 are biased so that a generated electric field allows charges 1708 to be injected from the highly doped charge transport layer in micro device 1700 into the floating gate 1714 through the thin dielectric layer 1716. Charge injection may be Fowler-nordheim tunneling or a hot electron injection mechanism. For hot electron injection, charge injection may be done by applying high voltage bias so that energetic charges can overcome the potential barrier between the charge transport layer and the thin dielectric layer 1716. In another embodiment, charge injection may be done by photoexcitation of the charge transport layer. In this case, the device 1700 may be exposed to ultraviolet light, resulting in high energetic charges that can overcome the potential barrier between the charge transport layer and the thin dielectric layer 1714.

Figure 23:
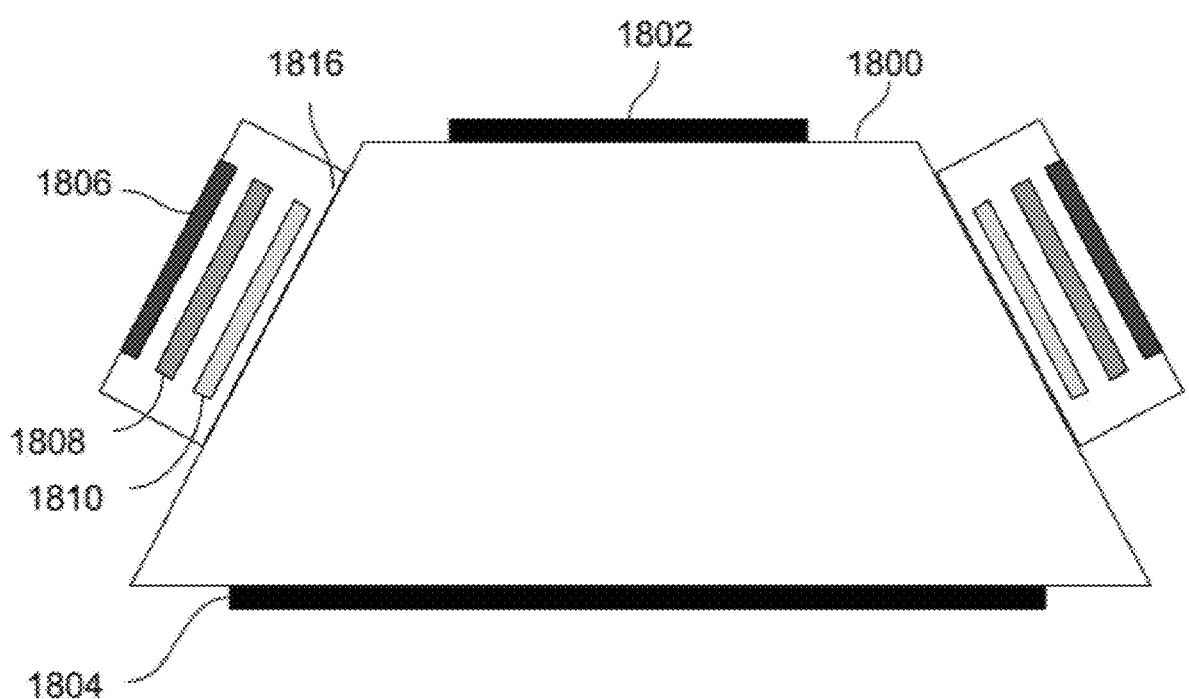
FIG. 23 illustrates another exemplary structure of a floating gate to bias the walls of a semiconductor device.

In another embodiment illustrated in FIG. 23, a floating gate or charge trap layer 1810 formed on the first, thin dielectric layer 1816 may be a combination of two different dielectric layers. A biasing control gate 1806, enables charging an intermediate dielectric layer 1808. The charged intermediate dielectric layer 1808 creates image charges opposite to the floating gate or charge trap layer 1810. With this technique, the floating gate 1810 may be controlled to be positive or negative to allow electric field propagation direction to inward or outward from the micro device sidewall.

Figure 24:
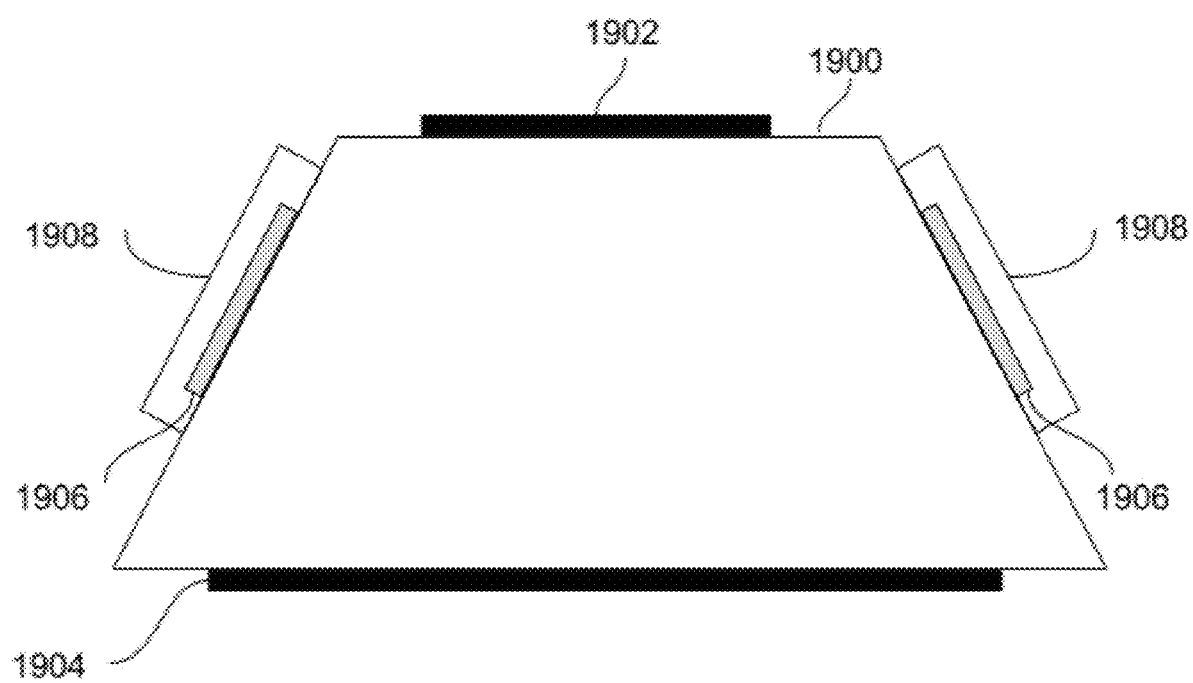
FIG. 24 illustrates another exemplary embodiment to bias the walls of a semiconductor device.

In another embodiment, illustrated in FIG. 24, an electric field modulation structure may be formed without using a control gate. A dielectric layer 1908 is formed on the sidewall of a micro device 1900. The formed dielectric layer 1908 may be permanently charged by ion bombardment or implantation to form a charge layer 1906. The charge layer 1906 may be at either side or in the middle of the dielectric layer 1908. Dielectric materials including but not limited to $HfO_2$, $Al_2O_3$, $HfAlO$, $Ta_2O_5$, $Y_2O_3$, $SiO_2$, $Tb_2O_3$, $SrTiO_3$, and $Si_3N_4$ or a combination of different dielectric materials to form a stack of layers may be used for charge trapping layer 1906. Ion bombardment creates fixed unneutralized charges in the charged layer 1906, hence creating an electric field in the body of the semiconductor. The ions may be positive or negative, such as barium and strontium, iodine, bromine, or chlorine. In addition, semiconductor ions such as Si+ and Ge+ may be implanted to form a charge trap layer. Following the ion implantation, the dielectric layer 1906 may be annealed to cure stress on the dielectric layer 1906 after ion bombardment, and also enable diffusion of ions into the dielectric layer 1908. Following the ion implantation and subsequent annealing, a thick dielectric layer 1908 is formed as an isolation and protective layer. The fixed charges in the dielectric layer 1908 manipulate the electric field at the semiconductor/dielectric layer interface to pull away charges in the semiconductor from the interface toward the middle of device 1900 to limit lateral current flow. Here, the ion/charge implantation may be done directly in the dielectric layer 1908. A barrier layer may be used between the dielectric layer 1908 and the micro device 1900 to protect the micro device 1900 from the high energy ion particles during the creation of charging layer 1906.

With reference to FIGS. 25 and 26, in another embodiment related to biasing an MIS structure 2016 on a micro device 2010, either contact/electrode 2012 or 2014 of a micro device 2010 may be extended over the MIS gate (the gate may be an actual layer, such as a conductive layer, or only a position in a dielectric or other material to hold the charge) while a dielectric layer 2018*a* separates the MIS biasing gate and the micro device electrode 2012.

Figure 25A:
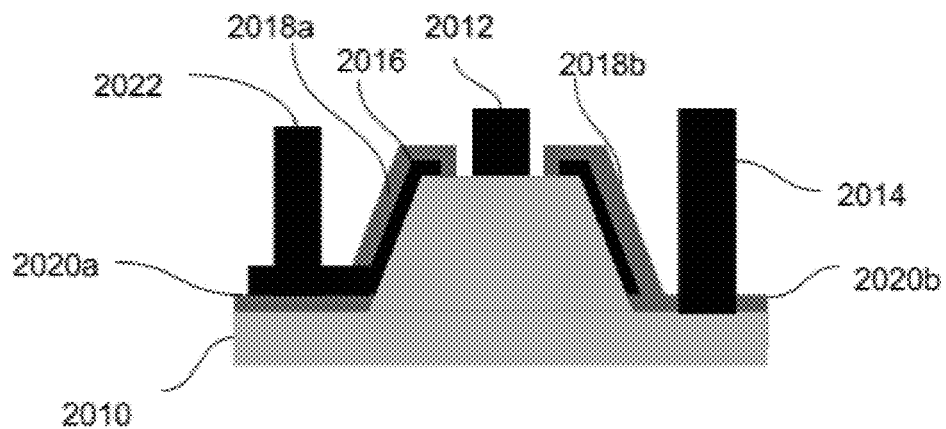
FIG. 25A illustrates a side view of another embodiment of an MIS structure.

With reference to FIG. 25A, the contacts 2012 and 2014 of the micro device 2010 may extend upwardly. To create an MIS structure 2016 (i.e. including a gate, such as a conductive layer) and a dielectric layer, for such devices, an MIS contact/gate pad 2022 to the MIS gate also extends upwardly. This structure may simplify the process of integrating the micro devices 2010 into a receiver substrate as similar bonding or coupling processes may be used for both MIS contact 2022 and the micro device contacts 2012 and 2014. To avoid a short circuit between the micro device 2010 layers and the MIS 2016 gate, a dielectric layer 2020*a* is deposited. The dielectric layer 2020*a* may be part of the MIS structure or a separate dielectric layer deposited independently. In addition, to avoid shorts during the bonding and/or integration of the micro device 2010 into a system (i.e., receiver) substrate, one or more dielectric layers 2018*a* and 2018*b* may cover the MIS structure 2016. To create the contact to the micro device 2010 for one of the electrodes 2012 and 2014, the dielectric layer 2020*b* may be removed or opened (e.g., etched). The dielectric layer 2020*b* may be the same as any one or more of dielectric layers 2018*b*, 2020*a*, and 2018*a*, or a separate layer altogether. The space between the contacts 2014, 2022, the MIS structure 2016 and the micro device 2010 may be filled with a different type of materials, such as polymer or dielectrics. The filler may be the same as the dielectric layers 2018*a* and 2018*b*, or different. The position of the MIS contact/gate pad 2022 and the micro device contact 2014 may be different relative to the micro device 2010 or positioned symmetrically on either side thereof. In another embodiment, the MIS structure may be formed using a charged layer and therefore no MIS contact 2022 will be needed.

Figure 25B:
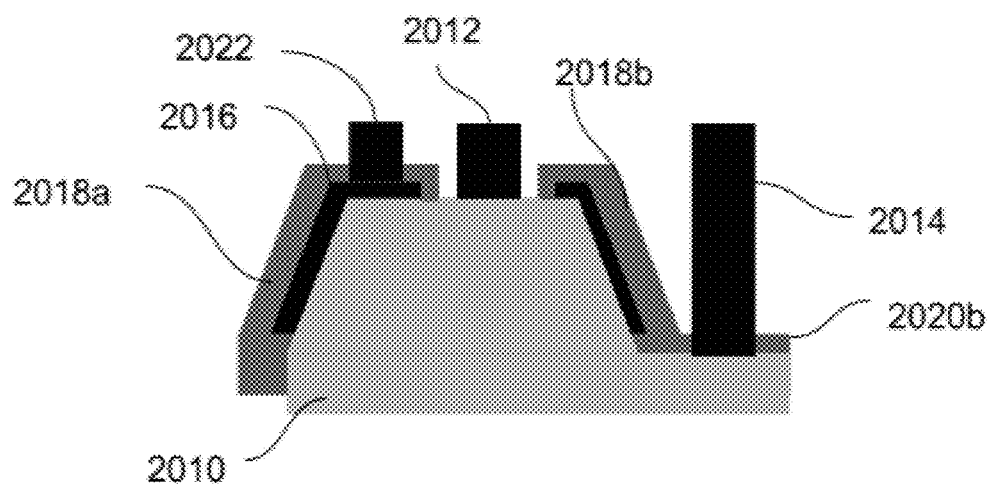
FIG. 25B shows another embodiment for a vertical device with a different pad configuration.

In another embodiment presented in FIG. 25B, the contacts 2012 and 2014 on the micro device 2010 electrodes are on the same surface. To create an MIS structure 2016 for such devices, one can put the contact 2022 to the MIS gate on the same surface as the micro device contacts. This structure can simplify the process of integrating said micro devices into a receiver substrate as similar bonding or coupling processes can be used for both the MIS contact and the micro device contacts. In this structure, the gate pad 2022 is deposited on top of the vertical device structure. Therefore, at least one of the MIS layers is extended above the top of the device to provide space for the pads. In addition, to avoid shorts during the bonding and/or integration of the micro device into the system (i.e., receiver) substrate, a dielectric layer 2018*a* and 2018*b* covers the MIS structure. To create a contact 2014 to the micro device for one of the electrodes, the dielectric layer 2020*b* can be removed or opened. The dielectric layer 2020*b* can be the same as either dielectric layers 2018*a* or 2018*b*. The space between the contacts 2014, 2022, and the MIS 2016 (or micro device 2010) can be filled with different types of materials such as polymer or dielectrics. This filler can be the same as the 2018*a* and 2018*b* dielectric layer.

Figure 25C:
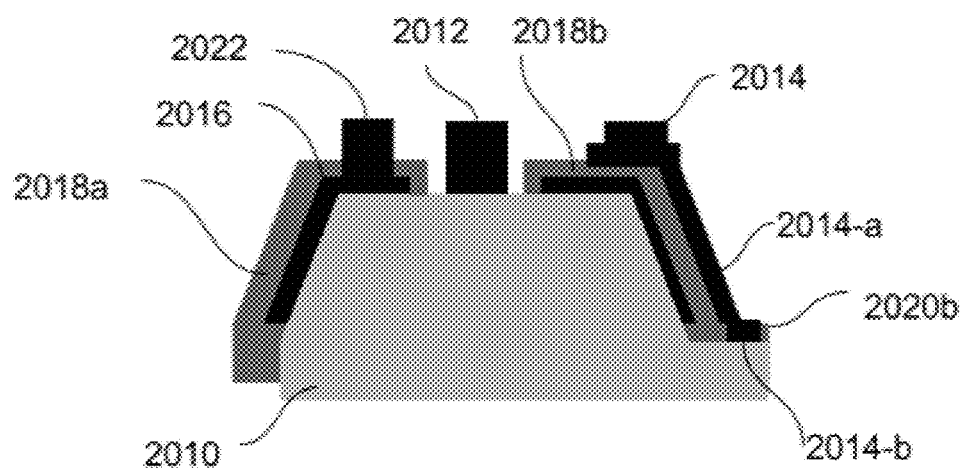
FIG. 25C illustrates another exemplary embodiment for a vertical device with an MIS structure.

In an embodiment presented in FIG. 25C, a micro device consists of a mesa structure 2010, contacts 2012, 2014, and 2022, and the MIS structure 2016. The contacts 2012 and 2014 of the micro device 2010 electrodes are on the same surface. This structure can simplify the process of integrating said micro devices into a receiver substrate as similar bonding or coupling processes can be used for both the MIS contact and the micro device contacts. To avoid the short between the micro device 2010 layers and the MIS 2012 gate, a dielectric layer 2020*a* is deposited. The connection 2014-*b* to a mesa layer is extended by a trace 2014-*a* for the contact 2014 and the MIS structure 2016.

Figure 25D:
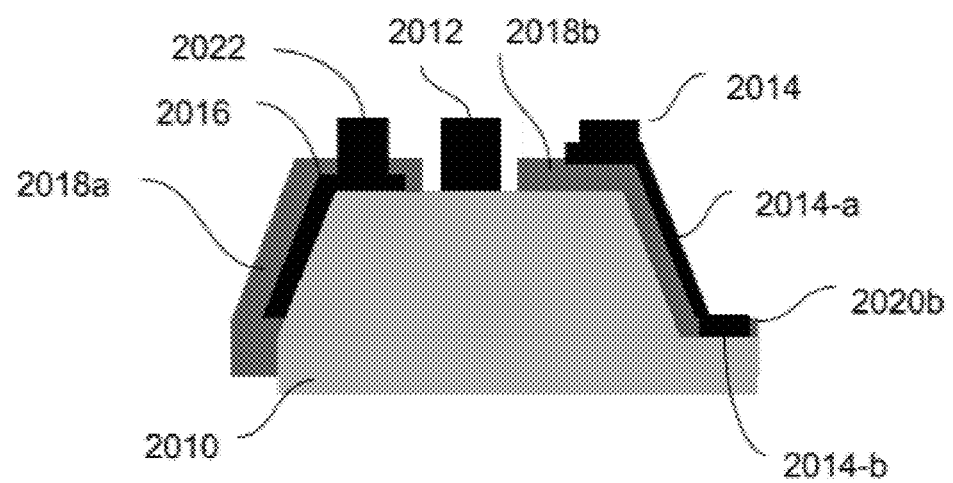
FIG. 25D illustrates another exemplary embodiment for a vertical device with a different pad configuration.

In another embodiment, shown in FIG. 25D, there is no MIS underneath the trace transferring the contact 2012. Here, the trace 2014-*a* can be developed by patterning the same layer as the metal (conductive) layer of the MIS 2016.

Figure 25E:
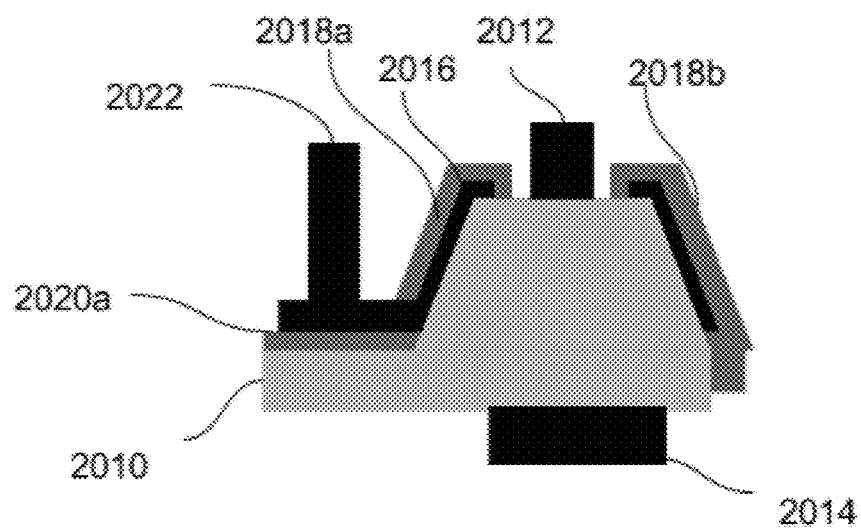
FIG. 25E illustrates a side view of another embodiment of an MIS structure.

FIG. 25E shows another embodiment where the contact for MIS electrode 2022 and one of the device contacts (or pads) 2012 is on the first side of the device 2010 and at least one contact 2014 for the device is on a side different from the first side where device 2010 is located.

Figure 25F:
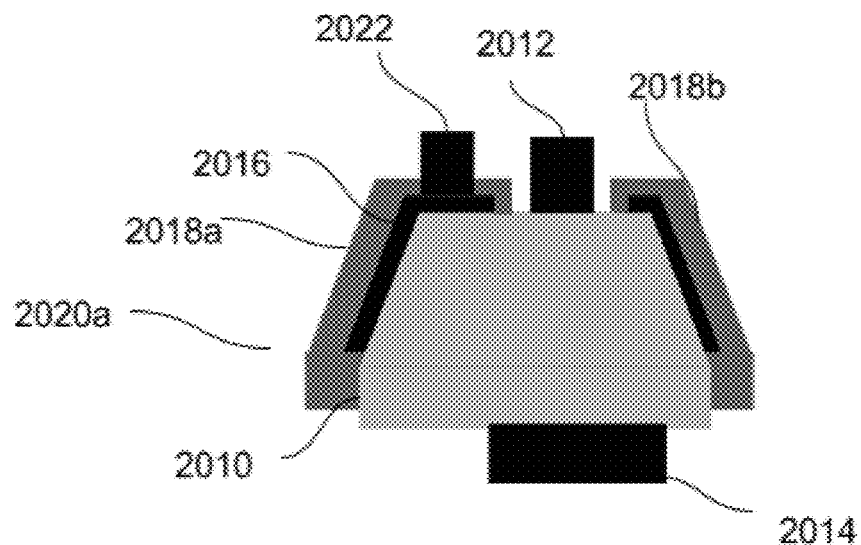
FIG. 25F shows another embodiment for vertical devices with an MIS structure with pads on both sides.

FIG. 25F shows another embodiment where the contact for MIS electrode 2022 and one of the device contacts (or pads) 2012 is on the first side of the device 2010 and at least one contact 2014 for the device is on a side different from the first side where device 2010 is located. Here, the MIS contact 2022 is on top of the vertical device.

It is possible for all embodiments that the MIS contact 2022 is partially sitting on top of the device, on the side of the device, or on the etched layers.

The dielectric layers in different embodiments can be stacks of different layers. In one case, a thin ALD layer can be used first and then a PECVD deposited dielectric (e.g., SiN) layer can be used to get better coverage and avoid shorts at the edges and corners. Also, the biasing can be created or developed through band engineering. Using different layers with different band structure can create an intrinsic potential that can bias the edge (i.e., side walls or top and bottom surface) of the micro devices. Also, other biasing and integration methods presented here for MIS structures can be used with said micro device structure with contact to the electrode on the same surface.

The position of the MIS contact 2022 and the micro device contact 2014 can be different relative to the micro device 2010.

Figure 26A:
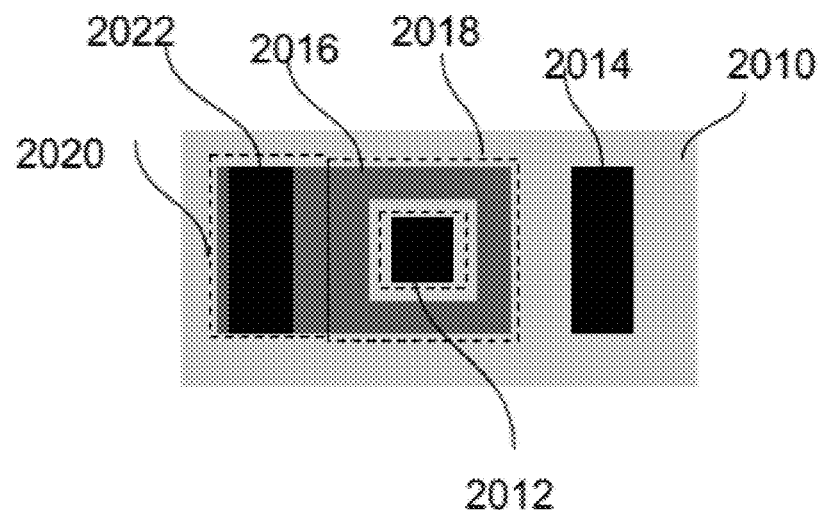
FIG. 26A illustrates a top view of the MIS structure of FIG. 25A.

FIG. 26A illustrates a top view of the micro device 2010 with the MIS contact 2022 and the micro device bottom contact 2014 located on opposite sides thereof.

Figure 26B:
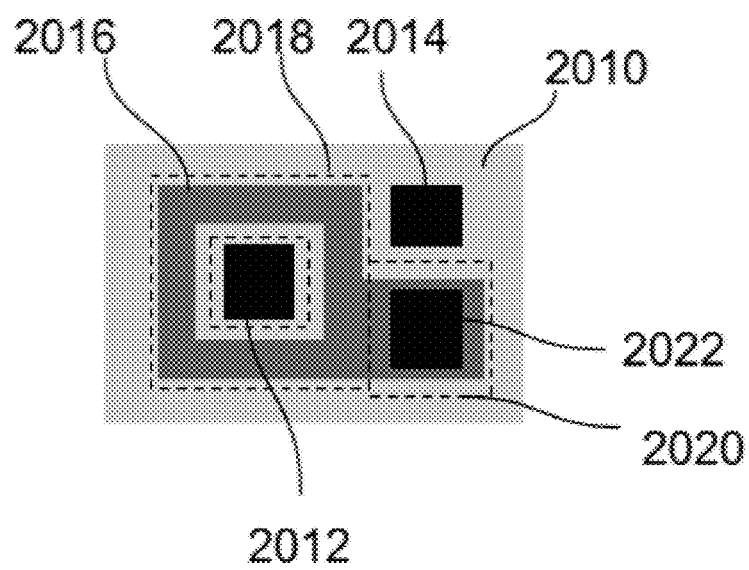
FIG. 26B illustrates a top view of another embodiment of an MIS structure.

FIG. 26B, the MIS contact 2022 and the micro device bottom contact 2014 are located on the same side of the micro device 2010. In this case, the dielectric layers 2020*a* and 2020*b* may be the same layer 2020.

Figure 26C:
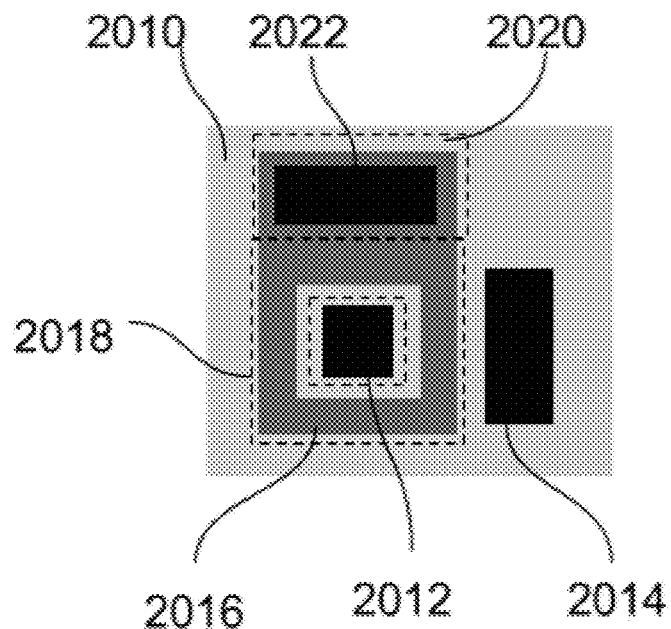
FIG. 26C illustrates a top view of another embodiment of an MIS structure.

FIG. 26C, the MIS contact 2022 and the micro device bottom contact 2014 are located on two neighbouring sides of the micro device 2010. The micro device 2010 may have other cross-sectional shapes, such as a circle, and the aforementioned positions may be modified to accommodate the micro device shape. The dielectrics 2018 and 2020 may be a stack of different layers, and the conductive (gate) layers may be metal, any other conductive material, or a stack of different materials.

Figure 26D:
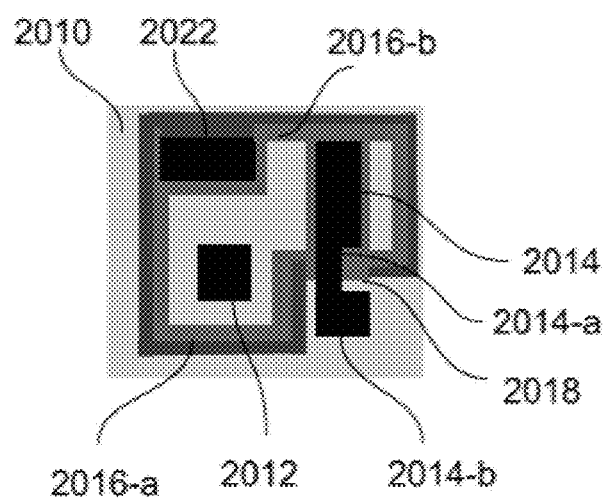
FIG. 26D illustrates a top view for a vertical device with an MIS structure.

FIG. 26D shows an exemplary top view of a micro device 2010 with the MIS contact 2022, while the micro device contact 2014 is located on a different part of the device. Here, the conductive layer 2016-*a* and the dielectric layer 2016-*b* form the MIS structure. Here, the dielectric layer 2018 covers at least where the trace 2014-*a* passes. The MIS structure can be underneath trace 2014-*a* or outside of that area. If there is no MIS underneath the trace 2014, the dielectric layer 2018 can be the same as the MIS dielectric layer 2016-*b*. In this case, the trace 2014 can also be the same as the conductive layer 2016-*a* of the MIS structure.

Figure 26E:
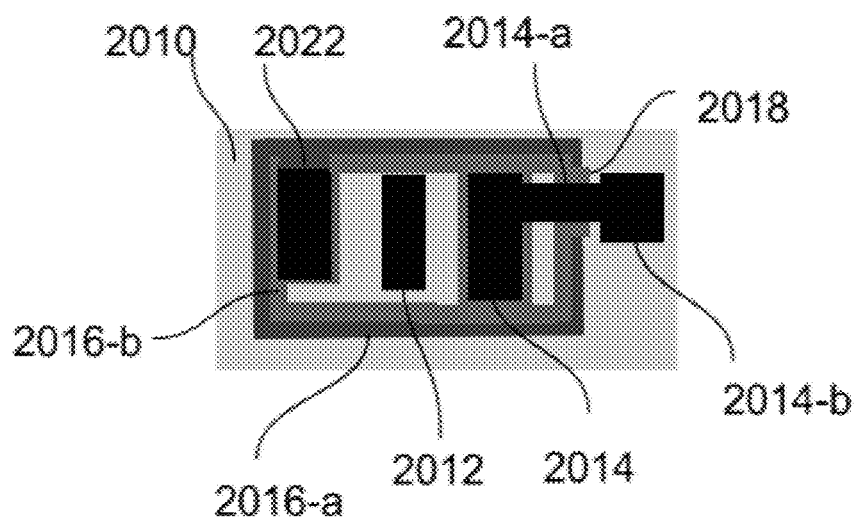
FIG. 26E illustrates a top view for the vertical device with an MIS structure.

FIG. 26E shows another embodiment where the contact for the MIS electrode 2022 and the devices 2014 and 2012 are in one direction.

The following embodiments, illustrated in FIGS. 27 to 30, include arrays of optoelectronic devices, in which the pixelation may be developed by creating islands of the ohmic contact layer(s) and bonding an array of separated pads to the ohmic contact layer. The islands may be smaller than the pads. Some of the semiconductor layers after the ohmic layer may be patterned. In some embodiments, the patterning of the semiconductor layers follows the same pattern as the islands of the ohmic layer.

Figure 27A:
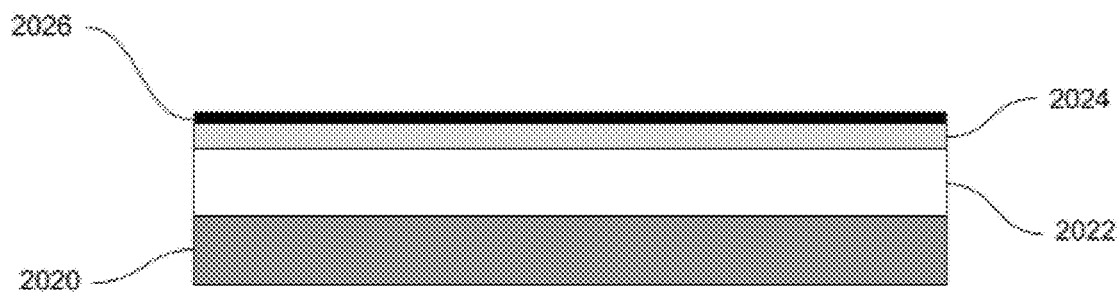
FIGS. 27A to 27C illustrate a fabrication process of an LED display and integration process of a device substrate with micro devices defined by top contacts and bonding the substrate to a system substrate.

With reference to FIG. 27A, different conductive and active layers 2022 are deposited on top of a device substrate 2020, followed by other conductive or blocking layers 2024. The first conductive layer 2024 may be p-type, n-type, or intrinsic. To create pixelated devices, the conductivity of the first conductive layer(s) 2024 may modulate into islands of higher performance electrical connectivity. The islands may be smaller (e.g., ½ to ¹⁄₁₀ the pixel size, such as pad 2032 or smaller) whereby at least 1 to 10, preferably 2 to 8, and more preferably more than 4, islands contact each contact pad 2032. In one embodiment, the islands are between 1 nm to 100 nm cubes. In one approach, the first conductive layer(s) 2024 or part of the first conductive layer(s) may be patterned (e.g., through lithography, stamping, and other methods). In another embodiment, a very thin island layer 2026 is deposited on the first conductive layer 2024, and then ideally annealed. The annealing process may be thermal or optical or a combination thereof. The annealing may be done in ambient condition, vacuum, or with a different gas. In one embodiment, the island layer 2026 may comprise ITO, gold, silver, ZnO, Ni, or other materials. The island layer 2026 may be deposited by various means, such as e-beam, thermal, or sputtering. After creating the island 2026-*i*, a pad substrate 2030, which includes pads 2032, and may include driving circuitry, is bonded to the surface with the islands 2026-*i*. The bonding may be thermal compression, thermal/optical curing adhesive, or eutectic. In one embodiment, the first conductive layer 2024 may comprise varied materials. In an embodiment, part of the first conductive layer 2024 may be deposited to include the island layer 2026, and another part is part of the bonding pads 2032. For example, in the case of GaN LEDs the p-ohmic contact is comprised of Ni and Au. In one case, layer 2026 may include both Ni and Au. In another case, the layer 2026 comprises only Ni and the pads 2032 (e.g., include an Au layer at the interface). After the bonding, the pressure and heat applied to the samples will assist in diffusing them into separate layers and create an improved ohmic contact.

The space between the pads 2032 may be filled with diverse types of filler to enhance the reliability of the bonding process. The filler may include materials such as polyamide or thermally/optically annealed adhesives.

Subsequently, the device substrate 2020 may be removed, and a second contact layer of the device layer 2022 may be exposed. The second contact layer may then undergo any of the aforementioned process steps (e.g., FIGS. 8 to 10) to provide top contacts (e.g., an array of top contact pads and/or a common electrode). Alternatively, the device substrate 2020 is utilized as the common electrode.

FIG. 28 illustrates a micro device structure in which different conductive and active layers 2022 are deposited on top of the substrate 2020 followed by other conductive or blocking layers 2024. The first conductive layer 2024 may be p-type, n-type, or intrinsic. To create pixelated devices, the conductivity of the first conductive layer(s) 2024 are modulated (e.g., formed) into separate islands of higher performance electrical connectivity. The islands may be smaller than (e.g., ¹⁄₁₀ or smaller, the pixel size such as pad 2032) whereby at least 2 to 10, preferably 4 to 8, islands contact each contact pad 2032. In a preferred embodiment, the islands are between 1 nm to 100 nm wide. In one embodiment, the first conductive layer 2024 or part of the first conductive layer 2024 may be patterned (e.g., through lithography, stamping, and other methods). In another embodiment, a very thin island layer 2026 may be deposited on top of the first conductive layer 2024 and annealed. The annealing process may be thermal, optical, or a combination thereof. The annealing may be done in ambient condition, vacuum, or a different gas. In one embodiment, the island layer 2026 may be comprised of any one or more of ITO, gold, silver, ZnO, Ni, or other metallic or conductive materials. The island layer 2026 may be deposited by a few different means, such as e-beam, thermal, or sputtering. In addition to the formation of islands 2026-i, the top conductive layer 2024 may also be separated (e.g., etched) into a distinct set of conductive layer islands 2024-i. The islands 2026-i may act as a hard mask or a new mask may be used to etch the top conductive layer 2024 and form the conductive layer islands 2024-i. For example, in the case of GaN, the islands 2026-i may be comprised of Ni, which is a natural hard mask used to etch the first conductive (e.g., p-GaN) layer 2024, to form conductive layer islands 2024-i (e.g., using an inductively coupled plasma (ICP) etcher). The first conductive layer(s) 2024 may be etched partially or fully. For example, the top conductive layer(s) 2024 may include both a p-layer and a blocking layer. In which case, the p-layer may be etched, and the blocking layer may be left alone.

After creating the islands 2026-i, the substrate 2030 which includes pads 2032, and may include driving circuitry, is bonded to the surface with the islands 2026-I (FIG. 28D). The bonding can be thermal compression, thermal/optical curing adhesive, or eutectic. In one embodiment, the first conductive layer 2024 may contain varied materials. In this case, part of the first conductive layer 2024 may be deposited as the island layer 2026 and another part may be part of the bonding pads 2032. For example, for GaN LEDs, the island layer 2026 (e.g., p-ohmic contact) may be comprised of one or more of Ni and Au. In one embodiment, the island layer 2026 may comprise both Ni and Au. In another embodiment, the island layer 2026 may comprise only Ni, and the pads 2032 include an Au layer at the interface. After the bonding, the pressure and heat applied to the samples will assist in diffusing the separate layers and creating an improved ohmic contact.

Subsequently, the device substrate 2020 may be removed, and a second contact layer of the device layer 2022 may be exposed. The second contact layer may then undergo any of the aforementioned process steps (e.g., FIGS. 8 to 10) to provide top contacts (e.g., an array of top contact pads and/or a common electrode). Alternatively, the device substrate 2020 is utilized as the common electrode.

Figure 27B:
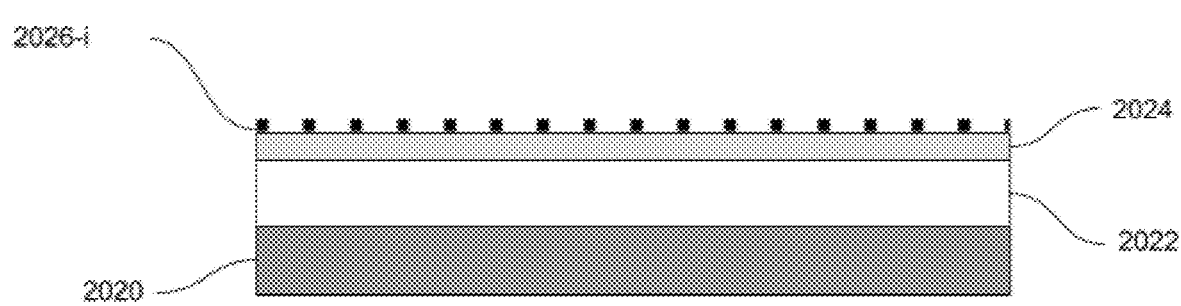
Figure 27C:
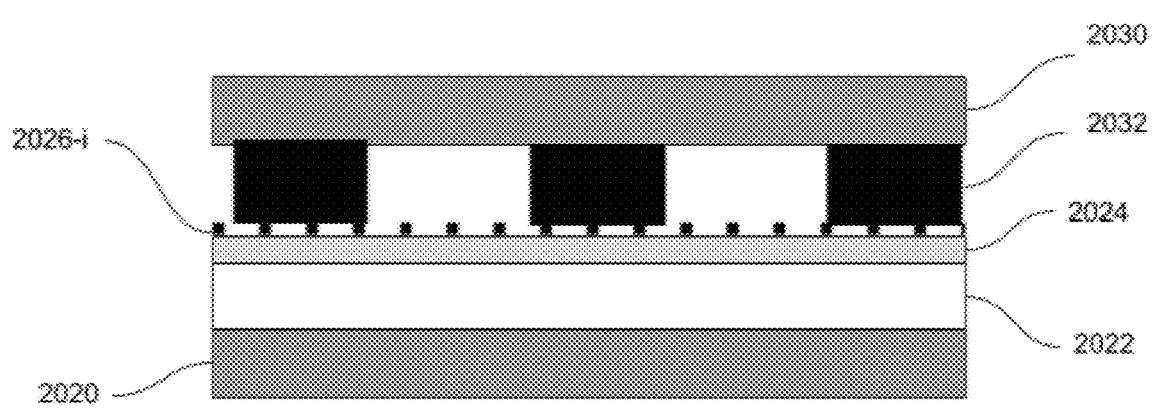

With reference to FIG. 29, an alternative method includes all of the aforementioned steps from FIGS. 27 and 28, and further includes an extra passivation layer 2028 deposited between the islands 2024-i, on the sidewall of the islands 2024-i, or on top of the islands 2024-i. The passivation layer 2028 may comprise an ALD (e.g., dielectric) layer, a PECVD (e.g., dielectric), layer, or a polymer. The area between the pads 2032 may be filled with different fillers to enhance the reliability of the bonding process. The fillers may be comprised of a variety of different materials, such as polyamide, or thermally/optically annealed adhesives.

Subsequently, the device substrate 2020 may be removed, and a second contact layer of the device layers 2022 may be exposed. The second contact layer may then undergo any of the aforementioned process steps (e.g., FIGS. 8 to 10) to provide top contacts (e.g., an array of top contact pads and/or a common electrode). Alternatively, the device substrate 2020 is utilized as the common electrode.

FIG. 30 illustrates an embodiment in which an extra structure (layers) 2029 may be developed between the first conductive layer(s) 2024 and the active layers of the device layers 2022. The passivation layer 2028 may also be deposited after the device layers 2022. The passivation layer 2028 may passivate some of the defects 2029A, such as trailing dislocation. Then, the passivation layer 2028 may be either patterned (FIG. 30A) or removed from the surface (FIG. 30B). The first conductive layer(s) 2024 may be deposited after. The passivation layer 2028 may be comprised of an ALD, PECVD, organic, or polymer layer. In another embodiment, a different plasma treatment, such as nitrogen, oxygen, or hydrogen plasma, may be used to create surface passivation.

According to one embodiment, a micro device structure may be provided. The micro device structure may comprising at least part of an edge of a micro device is covered with a metal-insulator-semiconductor (MIS) structure, wherein the MIS structure comprises a MIS dielectric layer and a MIS gate, at least one gate pad provided to the MIS gate; and at least one micro device contact extended upwardly on a top surface of the micro device.

According to another embodiment, the at least one gate pad provided to the MIS gate conductive layer may extended upwardly to simplify the process of integration of the micro device to a receiver substrate. The gate pad may deposited on a top surface of the micro device, and wherein the at least one of the MIS layers is extended above the top of the micro device to provide space for the gate pad. The gate pad and the at least one micro device contact are at same surface.

According to yet another embodiment, the micro device structure may further comprising: a dielectric layer deposited between MIS gate conductive layer and the micro device layers to separate the gate pad from the micro device layers, a second dielectric layer covering the MIS structure to avoid shorts during the bonding and integration of the micro device into a system substrate and a filler layer deposited in spaces between the gate pad, the micro device contact, the MIS structure and the micro device According to some embodiments, the at least one of the micro device contacts may moved to a different level by a trace to couple to a connection pad; and the trace may be isolated from the MIS structure or the device layers by another dielectric layer. The other dielectric layer separating the trace from the device layers is the same as the MIS dielectric layer of the MIS structure and the trace may be developed by patterning the same layer as the MIS gate conductive layer of the MIS structure.

According to yet another embodiment, the at least one micro device contact may be at first side of the micro device and the at least second micro device contact may be at one of: same side as the first side of the micro device or opposite side different from the first side of the micro device.

According to further embodiments, the gate pad may be located on one of: a top of the micro device, side of the micro device or etched layers. The gate pad is a conductive layer comprises metal or other conductive material. The gate pad and the at least one micro device contact may be at same surface and the at least second micro device contact is at one of: same side as the first side of the micro device or opposite side different from the first side of the micro device.

According to another embodiment, a method of fabricating a micro device structure may be provided. The method may comprising providing a metal-insulator-semiconductor (MIS) structure at least part of an edge of a micro device, wherein the MIS structure comprises a MIS dielectric layer and a MIS gate conductive layer, providing at least one gate pad to the MIS gate conductive layer; and providing at least one micro device contact extended upwardly on a top surface of the micro device.

According to one embodiment, wherein the at least one gate pad provided to the MIS gate conductive layer is extended upwardly to simplify the process of integration of the micro device to a receiver substrate.

According to some embodiments, the method may further comprising providing the gate pad and the at least one micro device contact are at same surface and the at least second micro device contact is at one of: same side as the first side of the micro device or opposite side different from the first side of the micro device and moving the at least one of the micro device contacts to a different level by a trace couple to a connection pad, wherein the trace is isolated from the MIS structure or micro device layers by a dielectric layer. The trace may be developed by patterning the same layer as the MIS gate conductive layer of the MIS structure.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

We claim:

1. A method to bias an edge of a micro device:
    covering at least part of the edge of the micro device with a metal-insulator-semiconductor (MIS) structure, wherein the MIS structure comprises a stack of dielectric layers and a MIS gate conductive layer; and
    creating intrinsic potential biasing the edge of the micro device using different dielectric layers with a different band structure.

2. The method of claim 1, wherein positions of a MIS contact and a micro device contact can be different relative to the micro device.

* * * * *